United States Patent
Faur et al.

(10) Patent No.: US 10,529,872 B2
(45) Date of Patent: Jan. 7, 2020

(54) SILICON-CONTAINING SEMICONDUCTOR STRUCTURES, METHODS OF MAKING THE SAME AND DEVICES INCLUDING THE SAME

(71) Applicant: SPECMAT, INC., North Olmstead, OH (US)

(72) Inventors: Horia M. Faur, Medina, OH (US); Maria Faur, North Olmsted, OH (US)

(73) Assignee: SPECMAT, Inc., North Olmsted, OH (US)

( * ) Notice: Subject to any disclaimer, the term of this patent is extended or adjusted under 35 U.S.C. 154(b) by 182 days.

(21) Appl. No.: 15/559,081

(22) PCT Filed: Mar. 21, 2016

(86) PCT No.: PCT/US2016/023370
§ 371 (c)(1),
(2) Date: Sep. 18, 2017

(87) PCT Pub. No.: WO2016/149696
PCT Pub. Date: Sep. 22, 2016

(65) Prior Publication Data
US 2018/0076341 A1    Mar. 15, 2018

Related U.S. Application Data

(60) Provisional application No. 62/135,406, filed on Mar. 19, 2015.

(51) Int. Cl.
*H01L 31/0216* (2014.01)
*H01L 31/028* (2006.01)
(Continued)

(52) U.S. Cl.
CPC ...... *H01L 31/02168* (2013.01); *H01L 31/028* (2013.01); *H01L 31/02167* (2013.01);
(Continued)

(58) Field of Classification Search
CPC ......... H01L 31/02168; H01L 31/02167; H01L 31/028; H01L 31/1804; H01L 31/1868; H01L 31/206
See application file for complete search history.

(56) References Cited

U.S. PATENT DOCUMENTS 6,017,773 A * 1/2000 Fauchet ............... H01L 33/346
257/103
8,816,465 B1 * 8/2014 Gardner ............... H01L 31/053
257/461

(Continued)

OTHER PUBLICATIONS

Patent Cooperation Treaty (PCT), International Search Report for Application PPCT/US2016/023370 filed on Mar. 21, 2016, dated Jul. 28, 2016, International Searching Authority, US.

*Primary Examiner* — Earl N Taylor
(74) *Attorney, Agent, or Firm* — Joseph J. Crimaldi

(57) ABSTRACT

A semiconductor system includes a silicon substrate and a porous silicon region disposed on the silicon substrate. The porous silicon region is configured to passivate the surface of the silicon substrate via a field effect and to reduce reflection loss on the silicon substrate via an appropriate refractive index. The porous silicon region is manufactured by a stain etching process, which retrofits existing tools for junction isolation and Phosphorus Silicon Glass (PSG) etch in solar cell manufacturing. The retrofitted tools for junction isolation and PSG etch achieves multiple purposes in a single step, including etch-back, PSG etch, antireflection coating, and passivation of the front surface of the solar cell.

7 Claims, 35 Drawing Sheets

(51) Int. Cl.
*H01L 31/18* (2006.01)
*H01L 31/20* (2006.01)
H01L 21/306 (2006.01)
H01L 21/02 (2006.01)

(52) U.S. Cl.
CPC ...... H01L 31/1804 (2013.01); H01L 31/1868 (2013.01); H01L 31/206 (2013.01); *H01L 21/0203* (2013.01); *H01L 21/30604* (2013.01); *Y02E 10/50* (2013.01)

(56) References Cited

U.S. PATENT DOCUMENTS

| | | | | |
|---|---|---|---|---|
| 2005/0085001 | A1* | 4/2005 | Lockwood | C25D 11/32 438/57 |
| 2007/0173073 | A1* | 7/2007 | Weber | H01L 21/02203 438/787 |
| 2010/0164073 | A1* | 7/2010 | Lewis | H01L 21/28512 257/632 |
| 2010/0196435 | A1* | 8/2010 | Freeman | A61K 9/0051 424/423 |
| 2011/0003466 | A1* | 1/2011 | Scardera | H01L 21/2255 438/565 |
| 2014/0061531 | A1* | 3/2014 | Faur | H01L 31/068 252/79.3 |
| 2018/0076341 | A1* | 3/2018 | Faur | H01L 31/02168 |

\* cited by examiner

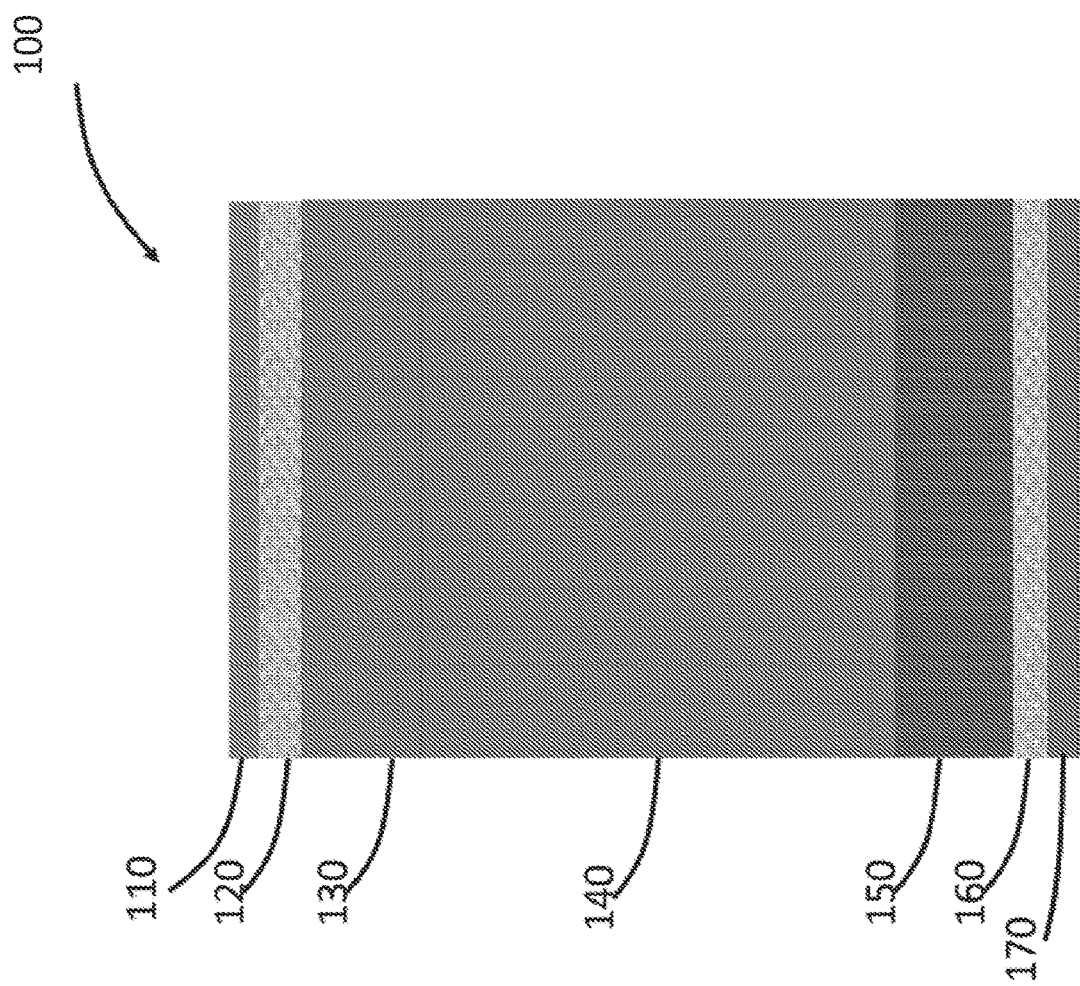

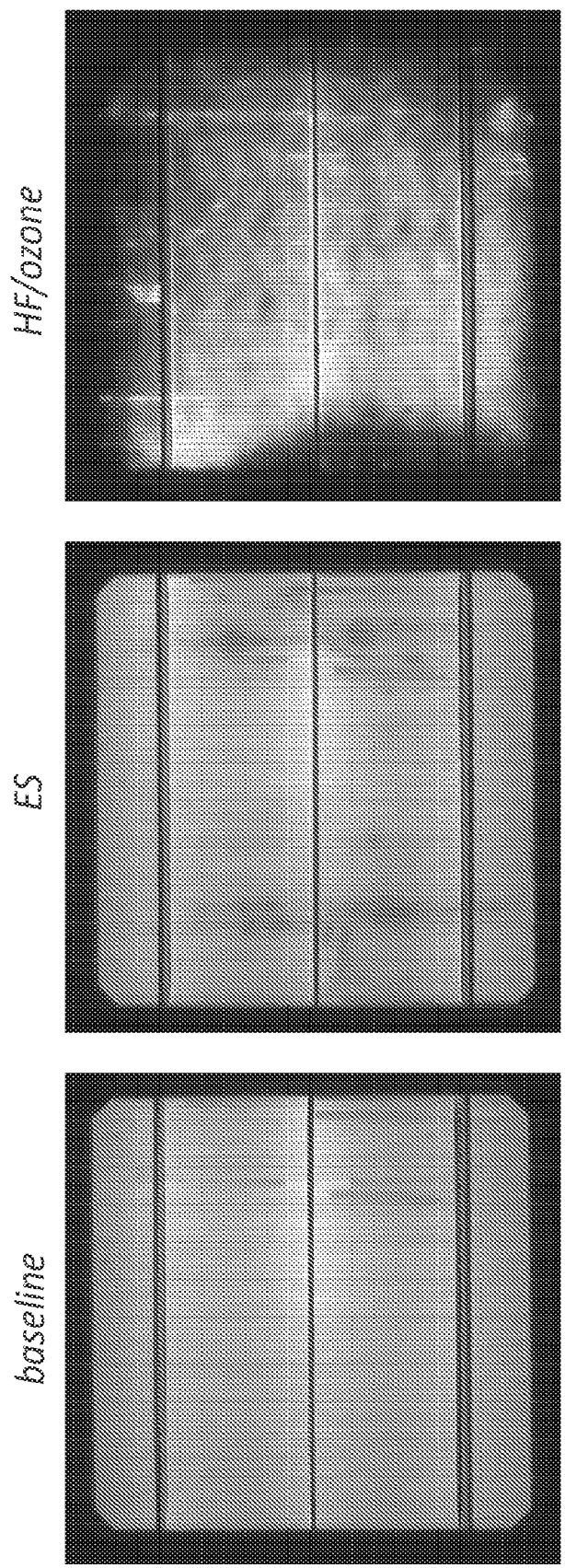

1 – equity solar
3 – HF/ozone
4 – baseline

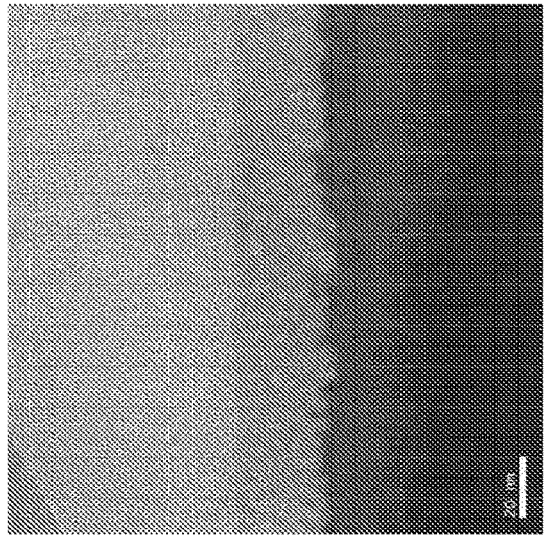
FIG. 18A  Sample 2  "30-35 nm"
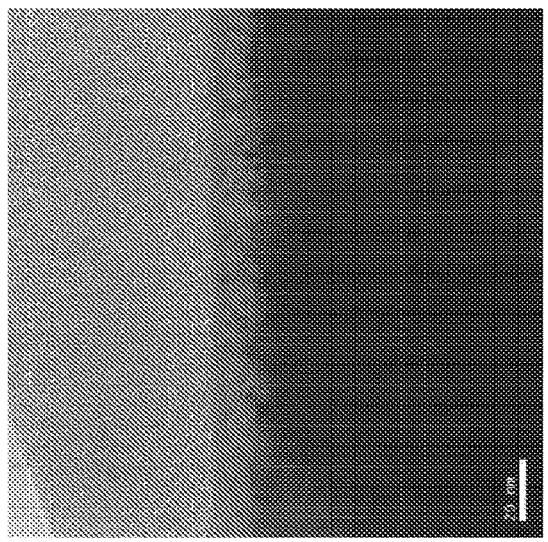
FIG. 18B  Sample 3  "~10 nm"
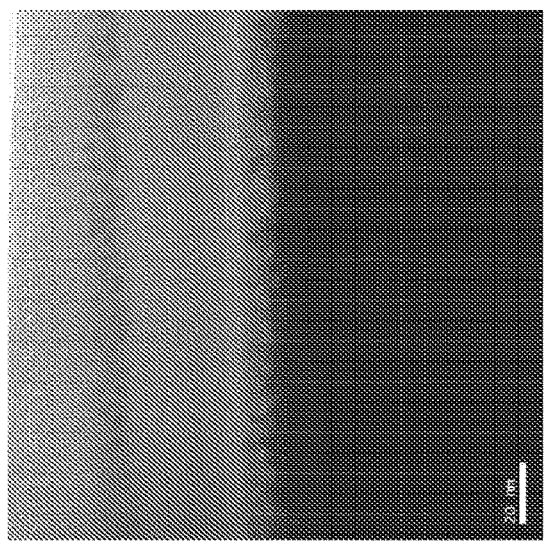
FIG. 18C  Sample 4  "15-20 nm"

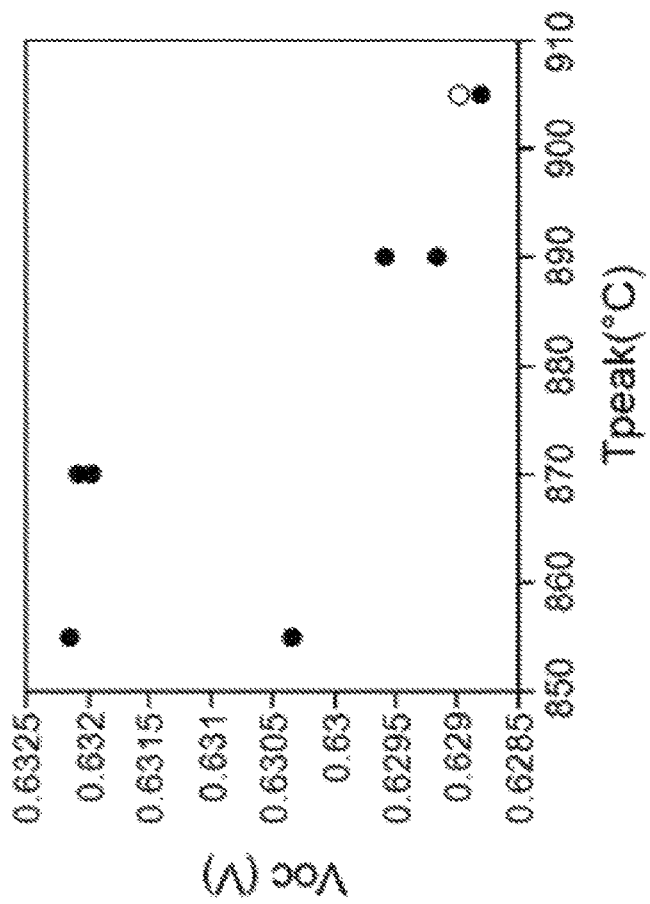
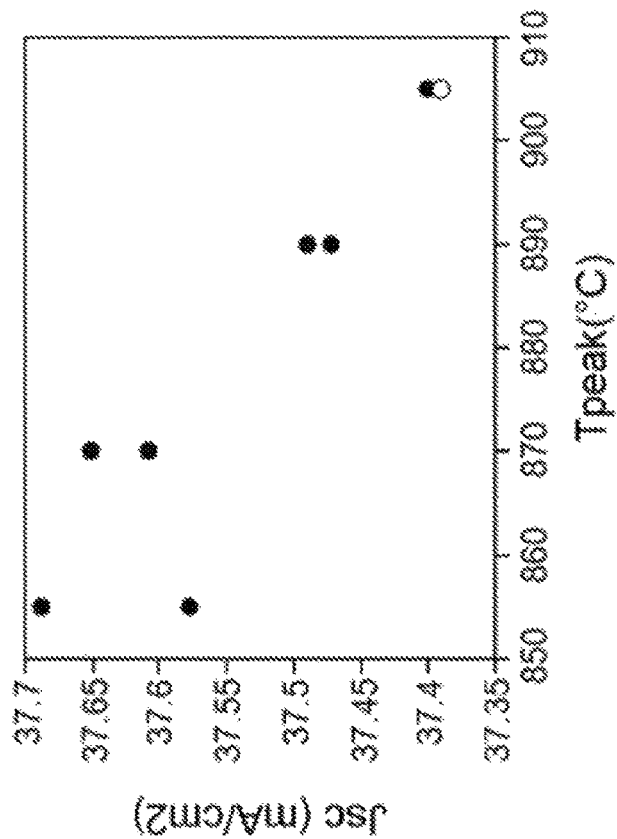
FIG. 20B
FIG. 20A

Best group of each paste

| SiO₂+SiNₓ | SOL9411 BOP1 870 SiO₂ | SOL9600A CF01 900 SiO₂ | SOL9600B CF01 920 SiO₂ | SOL9600A CF01 920 SiNₓ |
|---|---|---|---|---|
| Efficiency [%] | 18,33 | 18,43 | 18,50 | 18,07 |
| Fillfactor [%] | 76.06 | 77,98 | 78,23 | 78,19 |
| Isc [A] | 9,07 | 8,96 | 8,92 | 8,83 |
| Voc [mV] | 627,4 | 622,9 | 626,1 | 617,8 |
| Pmpp [W] | 4,33 | 4,35 | 4,37 | 4,27 |
| Rser LIDTEC [mΩ] | 5,2 | 3,8 | 3,4 | 3,8 |
| Rshunt Lf [Ω] | 591 | 2425 | 693 | 1047 |

*T. Wohlschloge, A. Henning, M.Deckelman – Heraeus front side pastes on Equity Solar water – confidential – June 2012*

FIG. 21

SILICON-CONTAINING SEMICONDUCTOR STRUCTURES, METHODS OF MAKING THE SAME AND DEVICES INCLUDING THE SAME

RELATED APPLICATION DATA

This application claims priority to and is a national phase filing under 35 U.S.C. § 371 of PCT/US2016/023370 filed Mar. 21, 2016 and entitled "Silicon-Containing Semiconductor Structures, Methods of Making Same and Devices Including the Same," which itself claims a priority benefit, under 35 U.S.C. § 119(e) to U.S. Provisional Patent Application No. 62/135,406, filed Mar. 19, 2015, and entitled "Silicon-Containing Semiconductor Structures, Methods of Making Same and Devices Including the Same," all of which are hereby incorporated herein by reference in their entireties.

BACKGROUND

Porous silicon is a form of silicon material that has holes (pores) in small scales. According to existing nomenclature, adopted by the International Union of Pure and Applied Chemistry (IUPAC), there can be three categories of pores with regard to the pore dimensions: microspores, mesopores, and macrospores with average pore diameters of less than 2 nm, 20-50 nm, and greater than 50 nm, respectively. The pores in porous silicon can also display various morphologies, i.e. shape, orientation, alignment, and interconnection of pores, among others.

Porous silicon is a dielectric material with applications in a wide range of areas. Previous and ongoing research on the application of porous silicon can be found in, among others, optoelectronics, micro-optics, energy conversion, environmental monitoring, microelectronics, wafer technology, micromachining, and biotechnology.

SUMMARY

Embodiments of the present invention include semiconductor systems containing porous silicon layers, methods of manufacturing the semiconductor systems, and devices including the semiconductor systems. In one exemplary embodiment, a semiconductor system includes a silicon substrate and a porous silicon region disposed on the silicon substrate. The silicon substrate is doped with a dopant at a concentration from about $10^{16}$ cm$^{-3}$ to about $10^{21}$ cm$^{-3}$. The silicon substrate has a first band gap energy, and the porous silicon region has a second band gap energy greater than the first band gap energy. The semiconductor system is configured to exhibit an electric field on the interface between the silicon substrate and the porous silicon region. The electric field is generated at least partially by a difference between the first band gap energy and the second band gap energy. The porous silicon region is configured to passivate a surface of the silicon substrate via, at least partially, an electric force induced by the electric field on a minority charge carrier in the silicon substrate. The electric force is configured to be at a direction from the porous silicon region to the silicon substrate so as to suppress transport of minority charge carriers from the silicon substrate to the porous silicon region, thereby increasing a passivated lifetime of the minority charge carriers and passivating the surface of the silicon substrate.

In another exemplary embodiment, a solar cell includes a silicon substrate comprising an emitter region on a front side of the silicon substrate and a base region on a back side of the silicon substrate. A front side passivation layer is disposed on the emitter region. The front side passivation layer comprises a first porous silicon region in contact with the emitter region and an antireflection and passivation coating disposed on the front side passivation layer. The front side passivation layer and the antireflection and passivation layer, respectively or in combination, are configured to reduce reflection loss on the front side of the silicon substrate and increase a minority carrier lifetime of minority charge carriers in the emitter region. The solar cells also include a back side passivation layer disposed on the base region. The back side passivation layer comprises a second porous silicon region, and optionally a back surface field (BSF) layer disposed between the base region and the second porous silicon region.

In yet another exemplary embodiment, a method of facilitating fabrication of a solar cell via a stain etching process using a junction isolation/phosphosilicate glass (PSG) etch processing tool starts from placing a first stain etching solution in a first reservoir coupled to a PSG etch tank in the junction isolation/PSG etch processing tool through a first chemical dosing unit of the PSG etch processing tool. The method then places at least a portion of a silicon substrate for the solar cell in the PSG etch tank and allows contact, in the PSG etch tank, between the silicon substrate and the first stain etching solution in the first reservoir. Chemical reactions between the silicon substrate and the first etching solution removes possible PSG on a front side of the silicon substrate during a first time period, etches back at least a portion of the front side of the silicon substrate during a second time period, and passivates the front side of the silicon substrate and reduces a reflection loss on the front side of the silicon substrate. The passivation and antireflection is achieved, at least partially, by creating a front side porous silicon region on the front side of the silicon substrate during a third time period. In one example, at least a portion of the second time period and the third time period is concurrent. In another example, at least a portion of the first time period, the second time period, and the third time period is concurrent.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like characters (e.g., functionally similar and/or structurally similar elements).

FIG. 1 is a schematic view of a solar cell including porous silicon layers on both the front side and the back side.

FIG. 13A is a photo of a solar cell without any etch-back on the front side.

FIG. 13B is a photo of a solar cell with a porous silicon region created by a strain etching solution on the front surface.

FIG. 13C is a photo of a solar cell with an etch-back performed by a HF/Ozone solution.

FIGS. 18A-18C are SEM images of porous silicon created by a HF-Nitric solution.

FIGS. 20A-20D show performances of solar cells that include porous silicon layers and are processed under different firing temperatures.

FIG. 21 is a table summarizing performances of solar cells with different metal pastes, processed under different firing conditions, and with different antireflection and passivation coatings.

DETAILED DESCRIPTION

Introduction

Figure 2A:
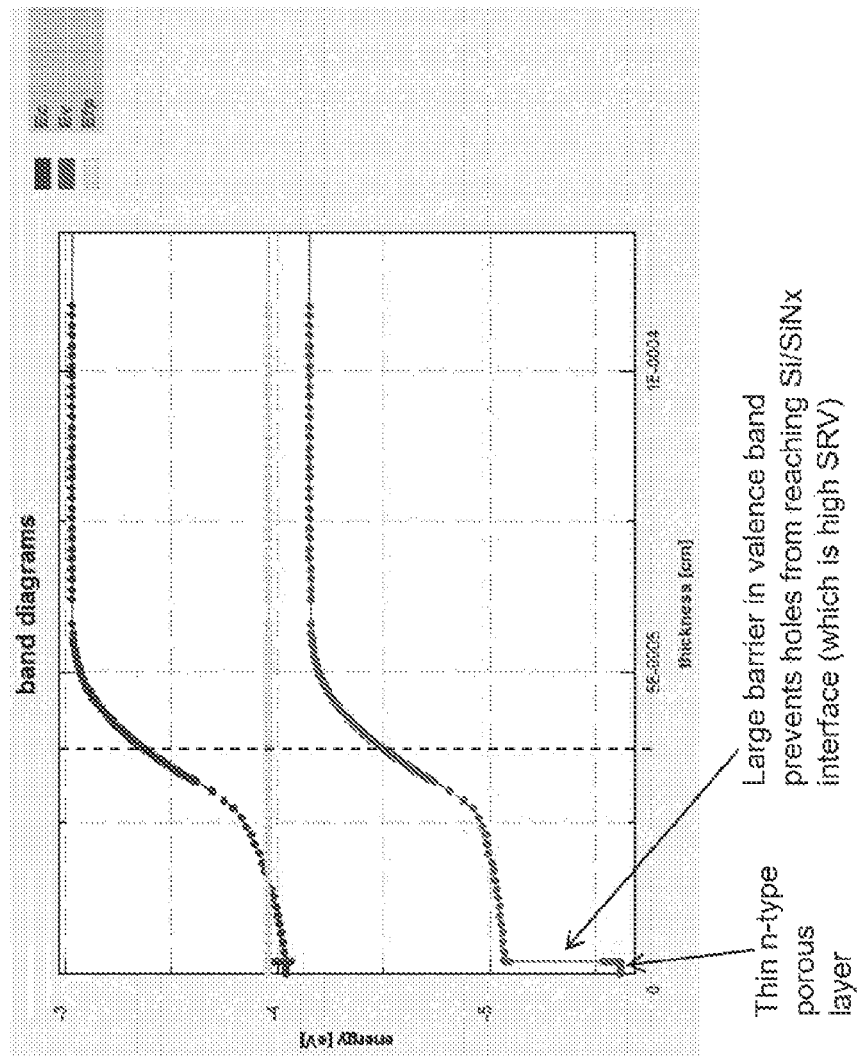
FIGS. 2A-2B show simulated energy band diagrams of semiconductor systems including an n-type silicon substrate and a porous silicon region disposed on the n-type silicon substrate.

Porous silicon can be a promising material due to its mechanical and thermal properties, compatibility with silicon-based microelectronics, and low cost. For example, porous silicon can have efficient electroluminescence that can find applications in LED light sources. Porous silicon can also have turnable refractive index, which is desirable in fabricating waveguides and Fabry-Perot filter. The nearly periodic array of pores in porous silicon can facilitate fabrication of photonic bandgap structures, or photonic crystals. Porous silicon can also be utilized in optical memory and all optical switching due to its non-linear properties. Gas sensing and biosensors can also benefit from porous silicon since the micro-scale structures within porous silicon allows ambient sensitivity properties and enzyme immobilization. Other applications of porous silicon include anti-reflection coating, micro-capacitors, insulator layer, low index material, SOI wafers, and thick sacrificial layers, among others.

At least two methods can be employed to create pores in silicon substrates or wafers and fabricate porous silicon. One method of introducing pores in silicon can use an anodization cell, in which a platinum cathode and a silicon wafer anode can be immersed in hydrogen fluoride (HF) electrolyte. Alternatively, insert diamond can also be used as the cathode material to avoid metallic impurities in the electrolyte and to form an improved electrical back plate contact to the silicon wafers. Porous silicon in this method can be produced through electrochemical reactions. On the platinum cathode, the chemical reaction can be $2H^+ + 2e^- \rightarrow H_2$, while on the silicon anode (also referred to as silicon working electrode), the chemical reaction can be $S_i + 6F^- + 2H^+ 2h^+ \rightarrow S_iF_6^{2-} + H_2$.

A second method to produce porous silicon can be through stain-etching with hydrofluoric acid (HF), nitric acid ($HNO_3$) and water ($H_2O$). A possible process that leads to the formation of porous silicon can be that oxidation of silicon atoms occurs by hole injection from nitric acid and simultaneously the reduction of silicon atoms produces NO and water. Silicon oxide can react with HF, forming a water-soluble complex. Metal ions can be added into the solution to produce porous silicon of different properties.

For example, when mixed with $HF_{(aq)}$, $Fe^{3+}$, $Ce^{4+}$, and $VO^{2+}$ can produce uniform layers of porous silicon with thicknesses up to 20 μm.

Application of Porous Silicon in Solar Cells

Silicon-based solar cells can be subject to a variety of losses, which can in turn reduce the conversion efficiency from solar energy to electrical energy. Possible losses include, among others, recombination losses, series resistance losses, thermal losses, metal-semiconductor contact losses, and reflection losses.

Recombination losses can occur in multiple regions of a solar cell, including the cell surface, the bulk of the cell, the depletion region, and the metal/semiconductor contact. The incomplete chemical bonds on the surface of the semiconductor (or anywhere else) can trap the photo-excited carriers via recombination and therefore cause reduction on photocurrent. Without being bound by any particular theory or mode of operation, recombination losses can be characterized by the surface recombination velocity S, which can be expressed as:

$$S = \sigma v N_t \quad (1)$$

where σ and v are capture cross section and thermal velocity of carriers, respectively, and $N_t$ is the number of surface traps (incomplete chemical bonds).

Reducing recombination losses on the cell surface can be achieved by reducing the surface recombination velocity. One method to reduce surface recombination velocity is depositing a thin passivation films on top the cell surface. For example, $SiO_2$ or SiN films can be deposited, via chemical vapor deposition (CVD), plasma enhance chemical vapor deposition (PECVD) or thermal oxidation technique, to reduce the surface recombination velocity.

Impurities and crystalline defects in bulk region of semiconductor can also induce recombination losses. Reduction of concentration or rest impurities in bulk of semiconductor, according to Schockey and Read model, may decrease the recombination velocity. Using semiconductor material with lower concentration of impurities and defects can accordingly increase the diffusion length of minority carriers, thereby reducing the recombination losses in bulk of solar cells.

Series resistance of a solar cell can originate from several different regions in the solar cell, such as the top grid, the busbar, the emitter, the bulk of the semiconductor, and/or the contact between the metal electrode and the semiconductor. Each region can contribute its own resistance to the total series resistance of the entire solar cell. Reducing the series resistance can be achieved by, for example, choosing materials of low resistivity, or adjusting the doping concentration in the emitter region, and the depth of the p-n junction.

Thermal losses in a solar cell can be a significant loss channel in photovoltaic solar cells. Sunlight incident on a solar includes components with different wavelengths, or photon energies. Some components have a photon energy greater than the band gap energy of the semiconductor material. When the solar cell absorbs these photons, the excess energy (i.e. energy different between the photon energy and the band gap energy) is normally converted into heat, instead of electrical energy, thereby inducing losses. Moreover, the generated heat can also lead to an increase of intrinsic carrier concentration and diffusion length of minority carriers, both of which can increase the reverse saturation current $I_o$. The level of reverse saturation current can be related the leakage of carriers across the p-n junction under reverse bias. Therefore, increased reverse saturation current typically induces lower open circuit voltage.

Metal-semiconductor contact losses normally occur on the frontal and back surfaces of solar cells. Screen-printed technique is often used for depositing metallic contacts to silicon solar cells. The front contact typically includes a fine grid and the back contact can be a metal plate covering the entire back surface of the cell. Ag and Ag—Al pastes are used in conventional silicon solar cells. Reduction of metal-semiconductor resistance can address the losses at the metal-semiconductor interface. For example, introducing acceptor type impurity in back contact can result in decrease of the resistance of near-back contact region of p-type silicon substrate due to diffusion penetration of aluminum during thermal treatment. In another example, heavy doping can form a near-surface electric field that can reduce the recombination losses at the metal-semiconductor contact.

Reflection losses can be another significant source of losses in solar cells. Texturing and antireflection coating (ARC) can be applied to decrease the reflectance on the cell surface. The texturing technique, in general, introduces micrometer-scale tilted pyramid structure of the silicon surface, which can facilitate trapping the incident sunlight by reducing the amount of sunlight that is directly reflected by an otherwise smooth surface. The pyramid structure can be formed by etching the surface with acid ($H_2SO_4$, $HNO_3$: $H_2O$, etc.) or with alkalines etch (NaOH, KOH etc.).

In antireflection coating (ARC) techniques, one or more thin and transparent films made of materials with refractive index (n) between those of air ($n_o$=1) and silicon ($n_{Si}$~3.4) are deposited on the solar cell surface that receives the sunlight. ARC can reduce the Fresnel reflection, which normally occurs when light propagates upon an interface between materials of two different refractive indices (e.g. the air-semiconductor surface).

The stratified medium theory and Bruggeman effective medium approximation can be employed when fabricating the ARC. Without being bound by any particularly theory or mode of operation, the zero-reflection for normal incidence of light on ARC/Si system can be given by:

$$n_{arc} = (n_o n_{Si})^{1/2} \quad (2)$$

where $n_{arc}$, $n_o$ and $n_{Si}$ are the refractive indices of the antireflection coating, the ambient medium (air) and silicon, respectively.

For a given wavelength λ, the thickness ($d_{arc}$) of the single-layer ARC can be $$d_{arc} = \lambda/(4n_{arc}) \quad (3)$$

According to equations (2) and (3), for typical solar cells ($n_o$=1, $n_{Si}$=3.4), one choice of the refractive index and thickness of the ARC can be (for λ=650 nm) $n_{arc}$=1.96 and $d_{arc}$=80 nm.

Two or more layers of ARC can be deposited on the solar cell surface to further reduce the reflection loss. Take a two-layer ARC system for example, the zero-reflectance at normal incident angle can be achieved by:

$$n_1 = (n_o n_2)^{1/2} \text{ and } n_2 = (n_1 n_{Si})^{1/2} \quad (4)$$

where $n_1$ and $n_2$ are refractive index of top and bottom layers, respectively, of the two-layer ARC. According to equation (4), one design of a two-layer ARC can be $n_1$=1.57 and $n_2$=2.46.

In practice, ARC can be deposited by chemical vapor deposition (CVD), plasma-enhanced chemical deposition (PECVD), or thermal oxidation processes, which are normally carried out at high temperatures. High temperatures may induce high cost and potential damage to the solar cells.

The above-mentioned losses (recombination losses, series resistance losses, thermal losses, metal-semiconductor losses, and reflection losses) can be addressed, at least partially, by using porous silicon in solar cells. First, the process of creating porous silicon through HF acid can have a gettering (moving contaminants and/or defects in semiconductor away from the surface into its bulk and trapping them there) and/or passivating (reducing the number of dangling silicon bonds at the top surface) effect on the silicon material, thereby reducing surface recombination velocity of the resulting solar cell.

Second, porous silicon can have a tunable band gap energy, which can improve the compatibility with metal electrode on the front and back surface of solar cells. On the interface of metal and semiconductor, there typically has a potential energy barrier, referred to as a Schottky barrier, which an be induced by the mismatch between the work function of the metal material and the electron infinity of the semiconductor material. In operation, Schottky barriers can block charge flow across the metal-semiconductor interface, thereby imposing limitations on performance of the semiconductor devices and device systems based on them. The tunable band gap energy of porous silicon may allow the reduction of the Schottky barrier height and accordingly the metal-semiconductor contact losses.

The tunable band gap energy of porous silicon can also reduce thermal losses. To be more specific, the porous silicon can be fabricated to have a larger energy gap than conventional silicon. The enlarged band gap can raise the threshold of heat generation because photons in the sunlight now need a higher energy in order to overcome the enlarged band gap and generate heat based on the excess energy (difference between the photon energy and the band gap energy). In other words, porous silicon can facilitate more effective absorption of photons, particularly the shorter wavelength components (higher frequency components and higher photon energy part) of the sunlight with reduced heat generation.

Third, porous silicon can be used as the antireflection coating to reduce reflection losses. Compared to conventional silicon (i.e., substrate silicon), porous silicon can have a lower refractive index. Without being bound by any theory or mode of operation, porous silicon can be viewed as mixture of silicon and air (or any other material filled in the pores). Therefore, refractive index of porous silicon is typically between unity (refractive index of air) and 3.4 (refractive index of silicon substrate)—potentially useful as ARC material.

Moreover, the refractive index of porous silicon can be dependent on the porosity. In general, higher porosity can lead to lower refractive index. And porosity of a porous silicon layer can be dependent on, for example, the etching time. Therefore, a porous silicon film created by etching a silicon surface can have a gradient of refractive index along the depth. Deeper regions can have a larger refractive index because the etching process normally starts from the top surface and reaches the deeper regions after etching the shallower regions. In other words, deeper regions can be exposed to the etching process for a shorter time, resulting in lower porosity and accordingly higher refractive index. The gradient of refractive index can be approximately regarded as a multi-layer antireflection coating, allowing reduction of reflection losses in solar cells.

In addition, porous silicon films can further reduce reflection losses due to the porous structure. Compared to a smooth silicon substrate that can directly reflect back incident lights, porous silicon films can more effectively trap the incident lights by introducing longer optical path for incident lights. More specifically, the porous or uneven surface can deflect the incident light on various directions, and some of the deflected light can reach another portion of the porous surface and have a second chance to be absorbed.

Fourth, porous silicon can be created from conventional silicon substrates. Therefore, the preparation of porous silicon films can take advantage of existing fabrication technologies in semiconductor industry, thereby reducing costs associated with, for example, deposition of antireflection coating and passivation coating, among others.

Exemplary Structures of Solar Cells Including Porous Silicon

FIG. 1 shows a schematic view of a solar cell including a porous silicon layer according to one exemplary embodiment. The solar cell 100 includes an n-type phosphorous emitter region 130 on the front side (or top side), a p-type base region 140 on the back side (bottom side). In operation, the front side of the solar cell 100 is toward incident radiation, which can be direct solar radiation, reemitted radiation from a selective emitter as in a solar thermophotovoltaic (STPV) system, thermal radiation from a heating source, or any other radiation can be absorbed and converted into electricity by the solar cell 100. In one example, both the front side and the back side can be doped so as to construct bifacial or heterostructure solar cells. Doping materials may include phosphorous, aluminum, boron or gallium, and the doping concentration can about $10^{16}$ cm$^{-3}$ to about $10^{21}$ cm$^{-3}$.

On the surface of the emitter region 130 disposed a front side porous silicon layer 120. Since porous silicon can be created directly from silicon substrates via stain etching or electrochemical reactions, the boundary or interface between the emitter region 130 and the front side porous silicon layer 120 can be blurred. In other words, the transition from the emitter region 130 to the front side porous silicon layer 120 region can be gradual. An antireflection and passivation layer 110 is disposed on the surface of the front side porous silicon layer 120 to improve the anti-reflection property of the emitter surface and further reduce reflection losses. The antireflection and passivation layer can also increase the lifetime of minority charge carriers in the emitter region 130 by reducing the number of defects states near the surface of the emitter region 130.

The antireflection and passivation layer 110 normally comprises dielectric materials. In one example, the antireflection and passivation layer 110 comprises silicon oxide (e.g., $SiO_2$, which can be grown by a thermal oxidation process or a room temperature wet chemical growth (RTWCG) method, among others. In another example, the antireflection and passivation layer comprises aluminum oxide (e.g., $Al_2O_3$), which can be deposited via, for example, atomic layer deposition (ALD) techniques. In yet another example, the antireflection and passivation layer comprises silicon nitride (SiNx), which can be deposited via, for example, plasma enhanced chemical vapor deposition (PECVD) technique or other techniques known in the art. A plurality of front side metal contacts or fingers (not shown) can be printed over the antireflection and passivation layer 110 but penetrate through both the antireflection and passivation layer 110 and the front side porous silicon layer 120 to reach the emitter region 130 so as to conduct the electricity out of the solar cell for utilities.

The front surface of the solar cell 100 can be either smooth or textured (not shown here). In operation, textured surface with, for example, random pyramids can increase absorption due to the increased surface area and decreased chance of light being directly reflected away from the surface. The textures can be created either on the surface of the semiconductor substrate (e.g., the emitter region) via KOH etching, or on the surface of the antireflection and passivation layer 110. In operation, the latter can result in a smaller sheet resistance and therefore increase the efficiency of the solar cell.

The front surface of the solar cell 100 can also be treated by an etch-back process. Emitter etch-back is typically a process that partially removes the emitter layer on the silicon wafer so as to optimize dopant surface concentration (e.g., removing heavily doped surface layers, known as "surface dead layers", or dopant depleted or rich regions that occur in boron diffusion). Etch-back also allows the formation of high sheet resistance emitters from a low sheet resistance precursor emitter in, for example, the formation of either homogeneous or selective emitters. In the case of selective emitters, the etch-back is typically masked to produce selective etching to result in patterning of the sheet resistance of the emitter. Emitter etch-back can be achieved using solutions such as hydrofluoric:nitric acid ($HF-HNO_3$).

On the back side of the solar cell disposes an optional back surface field (BSF) layer 150, on which a back side porous silicon layer 160 is disposed. A back contact 170 is electrically coupled to the optional BSF layer 150. In situations where the BSF layer 150 is not included in the solar cell 100, the back contact 170 can be configured to be in direct electrical contact with the base region 140. In operation, the BSF layer 150 can reduce the impact of rear surface (back surface) recombination velocity on voltage and current if the rear surface is closer than a diffusion length to the junction. The BSF layer 150 can include a higher doped region at the rear surface of the base region 140. The interface between the BSF layer 150 and the base region 140 can behave like a p-n junction, creating an electric field at the interface. The electric field can introduce a barrier to minority carrier flow to the rear surface, thereby maintaining the minority carrier concentration at higher levels in the bulk of the device. Therefore, the BSF layer 150 can realize a net effect of passivating the rear surface.

The back side of the solar cell 100 can further a back side passivation layer (not shown) disposed, for example, between the back side porous silicon layer 160 and the back contact 170. The back side passivation layer can be made of silicon oxide and can be patterned to have at least one aperture so as to allow the back contact 170 to reach the BSF layer 150 or the base region 140. The pattern can be created either during the growth of the back side passivation layer or after. For example, a patterned mask that is resistive (not reactive) to the means of growing the passivation layer can be placed over BSF layer 150, such that the back-side passivation layer is created only in selected locations. Alternatively, a uniform passivation layer can be created first. Then one or more apertures can be opened by, for example, lasers, etching chemicals, mechanical drills, or other means known in the art.

The passivation effect of the back side passivation layer can be replaced or reinforced by the back side porous silicon layer 160. If there is not back side passivation layer, the back side porous silicon layer 160 can be disposed between the BSF layer 150 and the back contact 170. If there is a back side passivation layer, the back side porous silicon layer can be disposed between the BSF layer 150 and the optional back side passivation layer.

In operation, the front side porous silicon layer 120 can fulfill several purposes. In one example, the front side porous silicon layer 120 can passivate the surface of the emitter region 130 via a field effect induced by enlarged band gap energy (see, e.g. FIGS. 2A-2B). Without being bound by particular theory or mode of operation, the band gap energy of porous silicon can be dependent on the porosity of the porous silicon. Porosity of the front side porous silicon layer can be about 25% to about 95%, or about 25% to about 65%, or about 35% to about 55%.

The passivation effect may also be influenced by the thickness of the front side porous silicon layer 120. Practical ranges of thickness of the front side porous silicon layer 120 can be, for example, from about 3 nm to about 30 nm, or about 5 nm to about 20 nm, or about 7 nm to about 15 nm. After passivation, the lifetime of minority charge carriers in the emitter region 130 can be about 10 microseconds to about 1000 microseconds, about 50 microseconds to about 500 microseconds, or about 100 microseconds to about 300 microseconds.

The size of pores in the front side and/or back side porous silicon layer can be, for example, about 2 nm to about 5 nm. In one example, the front side and/or back side porous layer can have a substantially uniform size for nearly all the pores in the layer. In another example, the size of pores in the porous silicon layers can be different at different locations within the porous silicon layers (e.g., larger pores closer to the surface and smaller pores deeper inside the layer).

Due to the porosity, the surface of the porous silicon layers is not ideally smooth, at least from a micro-scale perspective. Therefore, the porosity may replace or supplement the surface textures for light trapping.

Alternatively or in addition, the front side porous silicon layer 120 can be configured for antireflection, in which the refractive index of the front side porous silicon layer 120 can be less then the refractive index of the emitter region 130. Exemplary ranges of the refractive index of the front side porous silicon region 120 can be about 1.2 to about 3.4. The front side porous silicon layer 120 can also be combined with the antireflection and passivation layer 110 to form a double-layer antireflection coating, in which case the refractive index of the front side porous silicon region can be between that of the antireflection and passivation layer 110 and that of the emitter region 130. Exemplary ranges of refractive index of the front side porous silicon region 120 can be about 1.2 to about 2.1. Thickness of the front side porous silicon layer 120 can be, for example, greater than the wavelength of incident light. In addition, along the thickness of the front side porous silicon layer 120, the refractive index can have a gradient, or a gradual change. More specifically, the front side porous silicon layer 120 can have a smaller refractive index at the surface and a greater refractive index at the interface with the emitter region 130 so as to resemble a multi-layer antireflection coating and improve the antireflection property.

Moreover, the front side porous silicon layer 120 can be configured to have an ultra-low refractive index (e.g., ~1.0). In this case, the refractive index of the front side porous silicon layer 120 is close to the refractive index of air, where incident light for solar energy conversion typically comes from. Therefore, when light propagates from air into the front side porous silicon layer 120 and further into the emitter region 130 for energy conversion, reflection loss induced by change of refractive index across different media (Fresnel reflection) can be very little or negligible.

Simulated Performance of Solar Cells Including Porous Silicon

Table 1 shows a comparison of simulated solar cell performances in terms of the open circuit voltage ($V_{oc}$) and short circuit current ($I_{sc}$). The simulation is carried out using a combination of commercial software programs, including TFProbe for data fitting and optical modeling, PCID for electrical simulation (e.g., quantum efficiency, I-V curves, etc.), and AFORS-Het for electrical simulation and some optical modeling. The comparison is made with respect to a baseline solar cell by adjusting one parameter at a time so as to identify, investigate, and/or quantify the influence of the adjusted parameter.

The baseline solar cell has basically the same structure as shown in FIG. 1, but without the front side and the back side porous silicon layers 120 and 160. The antireflection and passivation layer 110 comprises SiNx and has a thickness of 75 nm, with inverse pyramid textures for internal light trapping and reflection loss reduction. The n-type emitter region 130 has a thickness of 300 nm with a peak doping concentration of $1\times10^{20}$ cm$^{-3}$. The surface recombination velocity of minority charge carriers in the emitter region (also the majority charge carriers in the base region) on the surface of the emitter region 130 is set at 50,000 cm/s, and the Shockley-Read-Hall (SRH) recombination time ($\tau\_SRH$) in the bulk of the emitter region 130 is set at $2.2\times10^{-9}$ s. The p-type base region 140 has a thickness of 180 μm and a peak doping concentration of $1.5\times10^{16}$ cm$^{-3}$. A 300 nm thick heavily doped p-type semiconductor material, with a peak doping concentration at $1\times10^{19}$ cm$^{-3}$ is used as the BSF layer 150. The SRV recombination time in the bulk of the BSF layer is set at $7\times10^{-8}$ s, and the surface recombination velocity at the interface between the BSF layer 150 and the back contact 160 is set at $1\times10^{7}$ cm/s. The baseline solar cell has a $V_{oc}$ of 0.618 V and $I_{sc}$ of 8.87 A.

TABLE 1

Simulated Performance of Solar Cells

| Sample | $V_{oc}$ (V) | $I_{sc}$ (A) |
|---|---|---|
| Baseline | 0.618 | 8.87 |
| Reduce front SRV to 5,000 cm/s | 0.618 | 8.9 |
| Improve $\tau\_SRH$ in emitter 2x to 4.4e−9 s | 0.626 | 8.91 |
| Bilayer ARC (70 nm SiNx/60% porous 11 nm) | 0.626 | 8.87 |
| Bilayer ARC (51 nm SiNx/30% porous 30 nm) | 0.626 | 9.03 |

In the first experimental group, the surface recombination velocity on the surface of the emitter region 130 is reduced by 90% to 5,000 cm/s. Lowering the surface recombination velocity can means that charge carriers generated by the incident light has a higher change to travel through the semiconductor region, thereby reaching the metal contact that can transfer the charge carriers out of the solar cell for utilities. In other words, reduced surface recombination velocity is beneficial to achieve a higher short circuit current $I_{sc}$, as shown in the second row of Table 1, in which the $I_{sc}$ increases from 8.87 A to 8.9 A in response to the reduction of surface recombination velocity. A practical way to reduce the surface recombination velocity can be passivating the front surface of the emitter region via, for example, a dielectric passivation layer, or a porous silicon layer, or their combination.

In the second experimental group, the SRH recombination time in the bulk of the emitter region 130 in increased from $2.2\times10^{-9}$ s to $4.4\times10^{-9}$ s. Increase of recombination time means a longer lifetime for charge carriers, i.e. a longer time span between the generation of charge carriers and loss of charge carriers via recombination or other channels. Therefore, increasing the time of SRH recombination, a major source of charge carrier losses in the bulk of the semiconductor, results in the boost of both open circuit voltage $V_{oc}$ and short circuit current $I_{sc}$, as shown in the third row of Table 1, in which the $V_{oc}$ increases from 0.618 V to 0.626 V and the $I_{sc}$ increase from 8.87 A to 8.91 A in response to the increase of SHR recombination time.

In a third experimental group, a front side porous silicon layer 120 is added to the baseline solar cell and disposed between the antireflection and passivation layer 110 (SiNx in this particular example) and the n-type emitter region 130. The front side porous silicon layer has a thickness of 11 nm and a porosity of 60% (i.e. the percentage of void spaces within the total space encompassed by the material). Moreover, the antireflection and passivation layer 110 is slightly thinned to 70 nm. As described above, porous silicon can have an anti-reflection effect due to the proper refractive index. The front side porous silicon layer 120 and the antireflection and passivation layer 110 in this example can form a bi-layer (also referred to as double-layer) antireflection coating, thereby further reducing the reflection losses compared to the baseline solar cell in which only a single layer of SiNx is used for antireflection. Including front side porous silicon layer 120 in this example increases the open circuit voltage from 0.616 V to 0.626 V.

In a fourth experimental group, a different front side porous silicon layer 120 is introduced. The front side porous silicon layer 120 in this group has a thickness of about 30 nm and a porosity of about 30%. Moreover, the antireflection and passivation layer 110 (i.e., SiNx layer in this group) in thinned to 51 nm such that the same total thickness of the antireflection and passivation layer 110 and the front side porous silicon layer 120 is maintained with respect to third experimental group. In general, lower porosity can result in a higher refractive index. For example, when the porosity of porous silicon approaches zero (i.e., almost no pores in the silicon material), the refractive index of the porous silicon approaches the refractive index of a silicon substrate (~3.4). In another example, when the porosity of porous silicon approaches 100% (i.e., almost no solid silicon material), the refractive index of the porous silicon approaches the refractive index of air (~1) that fills up the pores of the porous silicon.

In this fourth group, both the open circuit voltage (from 0.616 V to 0.626 V) and the short circuit current (from 8.87 A to 9.03 A) are improved. The reason may be attributed to better matching of refractive indices between the antireflection and passivation layer 110 and the porous silicon layer 120. More specifically, 30% porosity may create a refractive index between that of the antireflection and passivation layer 110 and that of the emitter region 130, thereby allowing the antireflection and passivation layer 110 and the front side porous silicon layer 110 to form a bi-layer antireflection coating, which typically has a lower reflection loss compared to a single layer antireflection coating.

It is also possible that the passivation effect from this porous silicon layer 120 with lower porosity is stronger, thereby reducing the surface recombination velocity of the solar cell. As shown in the first experimental group, reducing surface recombination velocity can have a more noticeable effect in boosting the short circuit current that in boosting the open circuit voltage.

A fifth experimental group (not shown in Table 1) is constructed by including a back side porous silicon layer 160 on the back side of the baseline solar cell. The back side porous silicon layer is disposed between the BSF layer 150 and the back contact 170 shown in FIG. 1. This back side porous silicon layer 160 has 60% porosity and 20 nm thickness. Including a back side porous silicon layer 160 tends to induced a greater effect on the performance of the resulting solar cells. In this example, the open circuit voltage increase from 0.618 V to 0.633 V and the short circuit current increases from 8.87 A to 9.15 A. The increase of both the open circuit voltage and short circuit current is larger than any of the previous group.

Figure 2B:
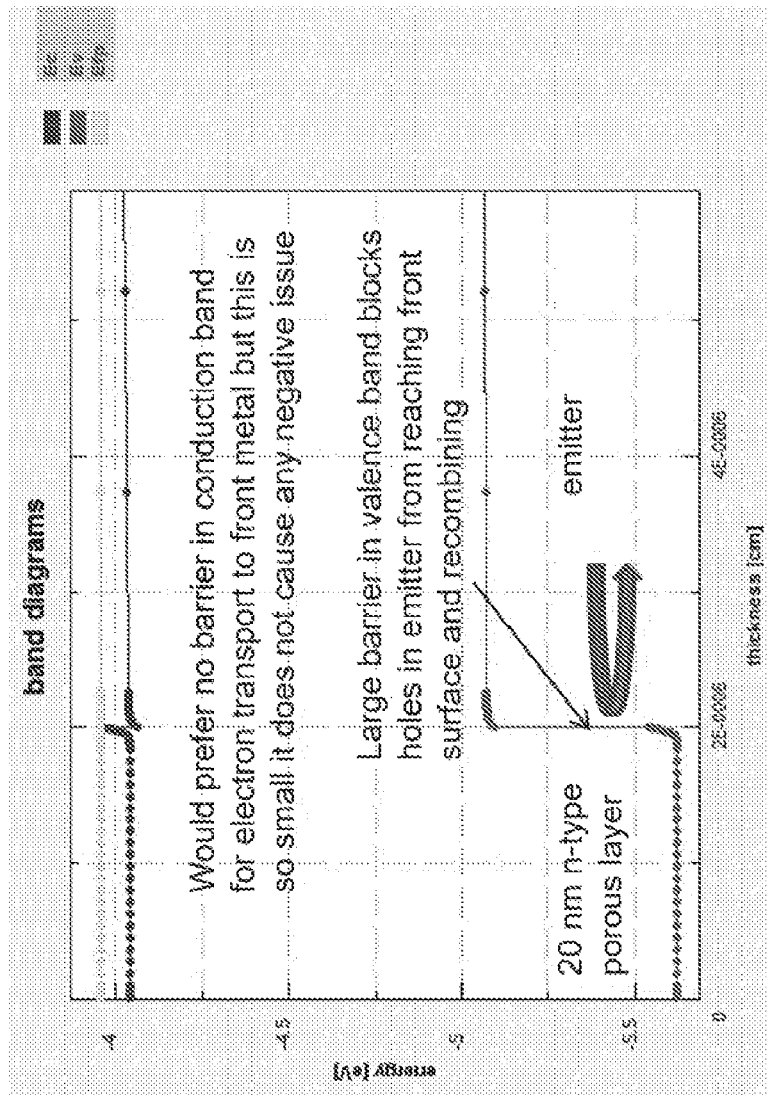

FIGS. 2A-2B show simulated energy band diagrams of a semiconductor system including a silicon substrate with an n-type emitter region, on which a porous silicon region (or layer) is disposed. This semiconductor system can be, for example, on the front side of solar cells. FIG. 2A shows the energy band diagram on and near the interface between the substrate silicon region and the porous silicon region, more specifically, the first 1.25 μm region from the top surface of the semiconductor system. In FIG. 2A, the porous silicon layer has a thickness of 20 nm and a porosity of 60%. These parameters are for illustrative purposes only. In practice, these two parameters can have different values for different applications. For example, the thickness of the porous silicon layer can be about 3 nm to about 30 nm, and the porosity of the porous silicon layer can be anywhere between about 25% to about 95%.

In FIG. 2A, both the valence band (green line) and the conduction line (blue line) are smooth in general, except on the interface between the porous silicon layer and the n-type emitter region, where the energy potential have an abrupt jump. FIG. 2B shows a zoom-in image of the energy band diagram of the first 60 nm from the top surface. In can be readily seen that the conduction band has a sharp decrease of energy potential from the emitter region to the porous silicon region, and the valence band has a sharp decrease of energy potential from the emitter region to the porous silicon region. Note that y-axis in FIGS. 2A-2B has negative values in the region where the energy band are plotted. Therefore, a "visual increase" in the plotted lines corresponds to a decrease of energy potentials, and vice versa.

In operation, on the conduction band, the sharp decrease of energy potential from the emitter region to the porous silicon region creates an electric field pointing toward the porous silicon region. Charge carriers on the conduction band are mostly electrons carrying negative charges. Therefore, these negative charge carriers are expected to experience a resistance when transporting from the emitter region to the porous silicon region and reaching the front metal contact. This can be undesirable to the performance of the solar cell. However, the magnitude of this change is very small (<100 mV), so the influence on electron transport through this interface can be negligible.

On the other hands, the magnitude of energy potential increase from emitter region to the porous silicon region on the valence band is much larger (>550 mV), thereby inducing a stronger field (compared to the electric field on the conductive band) pointing toward the emitter region. Since charge carriers on the valence band are mostly holes carrying positive charges, these positive charge carriers are expected to encounter stronger resistance when traveling toward the porous silicon region. This resistance can reduce the transport of the holes from the emitter region to the front surface for recombination, thereby increasing the lifetime of the charge carriers, i.e. passivating the emitter region.

FIGS. 2A-2B show that porous silicon layers can have a larger band gap than that of the silicon in the emitter region ("substrate silicon"). Moreover, the energy band diagram of porous silicon layer disposed on substrate silicon, in general, tends to block the transport of charge carriers (on both conduction band and valence band) from the substrate silicon to the porous silicon via electric fields. But since the electric field on the conduction band is much weaker then the electric field on the valence band, the net effect is reduced or suppressed transport of holes from the emitter region to the porous silicon region, thereby inducing a passivation effect that is beneficial to the performance of the resulting solar cells.

In practice, the difference of band gap energies (and/or the energies potential on the conduction/valence bands) between that in the emitter region and that in the porous silicon region can be tuned via, for example, the porosity of the porous silicon region. Exemplary ranges of band gap energy difference can be greater 550 meV, between 150 meV and 550 meV, between 250 meV and 450 meV, or between 300 meV and 350 meV.

Figure 3A:
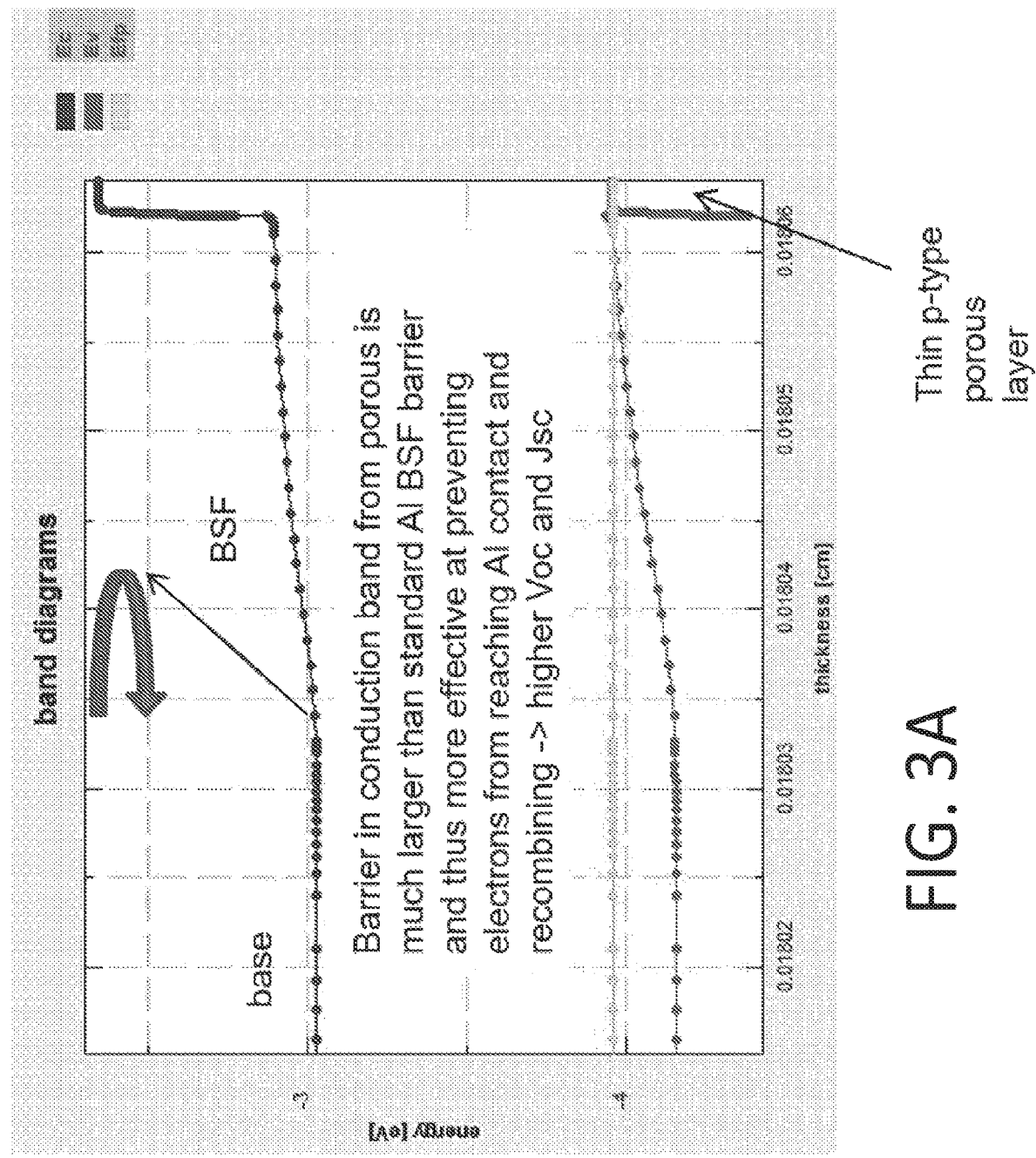
FIGS. 3A-3B show simulated energy band diagrams of semiconductor systems including a p-type silicon substrate and a porous silicon region disposed on the p-type silicon substrate.
Figure 3B:
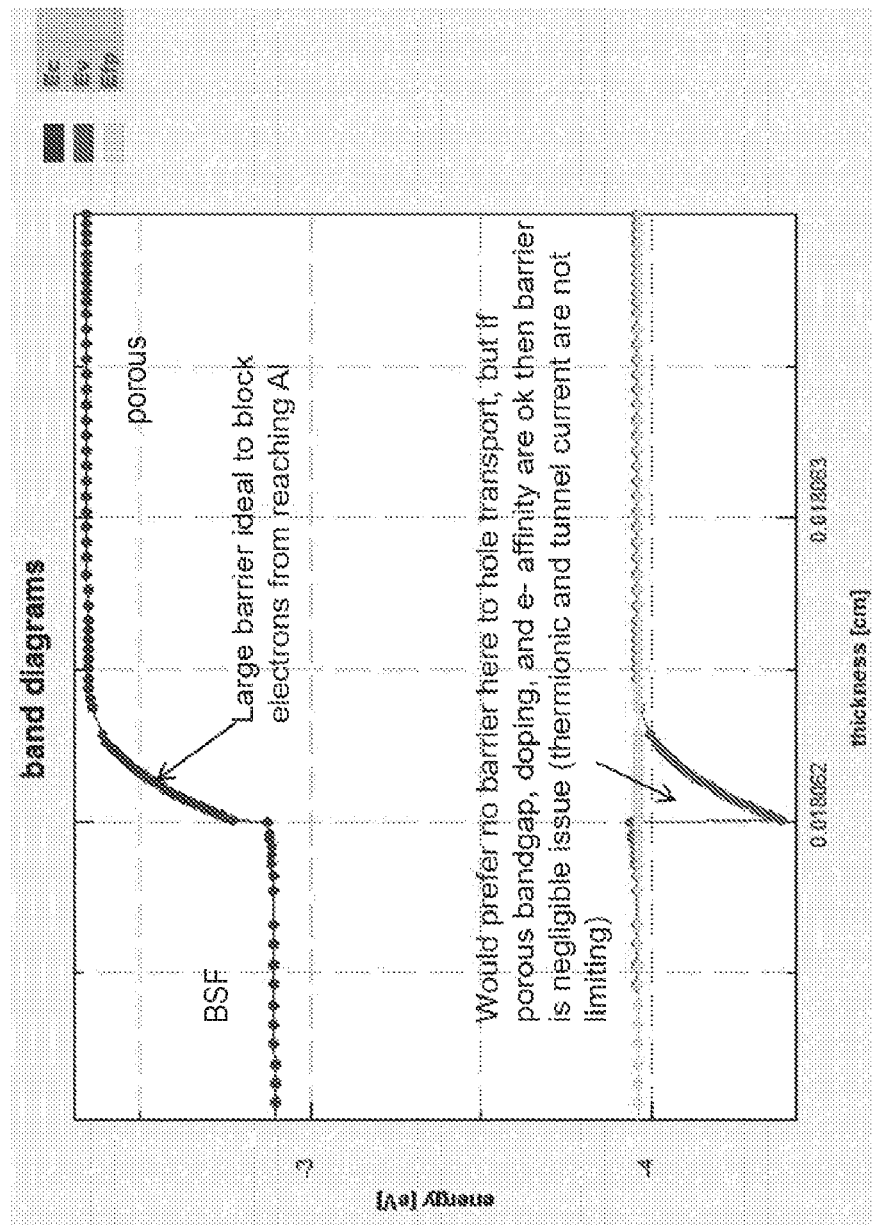

FIGS. 3A-3B show simulated energy band diagrams of a semiconductor system including a silicon substrate with a p-type base region, on which a porous silicon region (or layer) is disposed. This system can be, for example, on the back side of solar cells including a porous silicon layer. FIG. 3A shows the energy band diagram of the first 500 nm region from the back surface, and FIG. 3B shows a zoom-in image of the band diagram of the first 30 nm so as to illustrate more clearly the change of energy potentials across the interface between the porous silicon region and the p-type semiconductor substrate region. In this example, the porous silicon is disposed on a BSF layer. In another example, the porous silicon can be disposed directly on the p-type base region.

Across the interface between the p-type BSF layer and porous silicon region, the energy potential on the conduction band decreases from the BSF layer to the porous silicon region, thereby generating an electric field pointing toward the porous silicon region. Since charge carriers on the conduction band are mostly electrons carrying negative charges, this electric field tends to block the transport of electrons from the BSF layer to the porous silicon region.

On the valence band, however, the energy potential increases from the BSF layer to the porous silicon region, thereby creating an electric field pointing toward the BSF layer. This electric field then can suppress the transport of holes (major charge carriers on valence band) from the BSF layer to the porous silicon. Notice that the increased energy potential outside the BSF layer returns substantially to the original level (the level in the BSF layer) after a short distance. So the transport resistance of holes across the interface between the BSF layer and the porous silicon layer may be small. Taking into account the resistance to charge carrier transport on both the conduction band and the valence band, it can be seen that the net effect is still positive, i.e. more electrons are expected to be blocked than holes, thereby passivating the back surface of the solar cell.

Other than the passivation effect, the enlarged band gap of the porous silicon layer compared to the substrate silicon region (particularly the emitter region) may also improve the performance of solar cells by improving the blue response, i.e. effective absorption of light at shorter wavelengths. This can be attributed to the matching conditions (also referred to as resonant condition) between the incident photon energy and the band gap energy. In other words, larger band gap energy can result in better absorption at shorter wavelengths which carry higher photon energies.

Potential benefit of enlarged band gaps in porous silicon can also relate to reduction of thermal losses. As introduced before, the enlarged band gap can raise the threshold of heat generation because photons in the sunlight now need a higher energy in order to overcome the enlarged band gap and generate heat based on the excess energy (different between photon energy and band gap energy). In other words, porous silicon can facilitate more effective absorption of photons, particularly the shorter wavelengths components (higher frequency components and higher photon energy part) of the sunlight, without generating thermal heat.

Figure 4A:
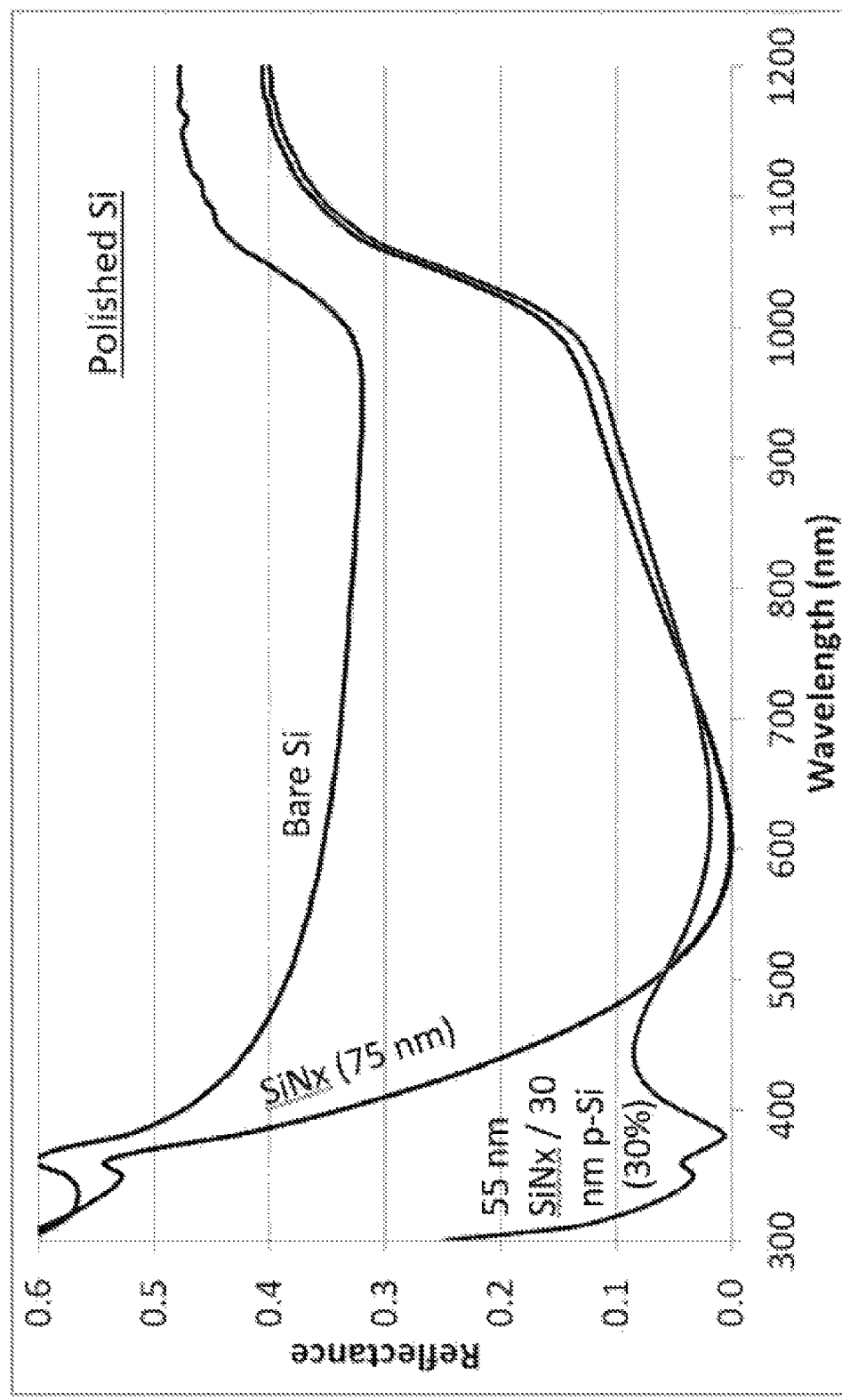
FIG. 4A show simulated reflectance of a semiconductor system including a smooth silicon substrate and a porous silicon region on the surface.
Figure 4B:
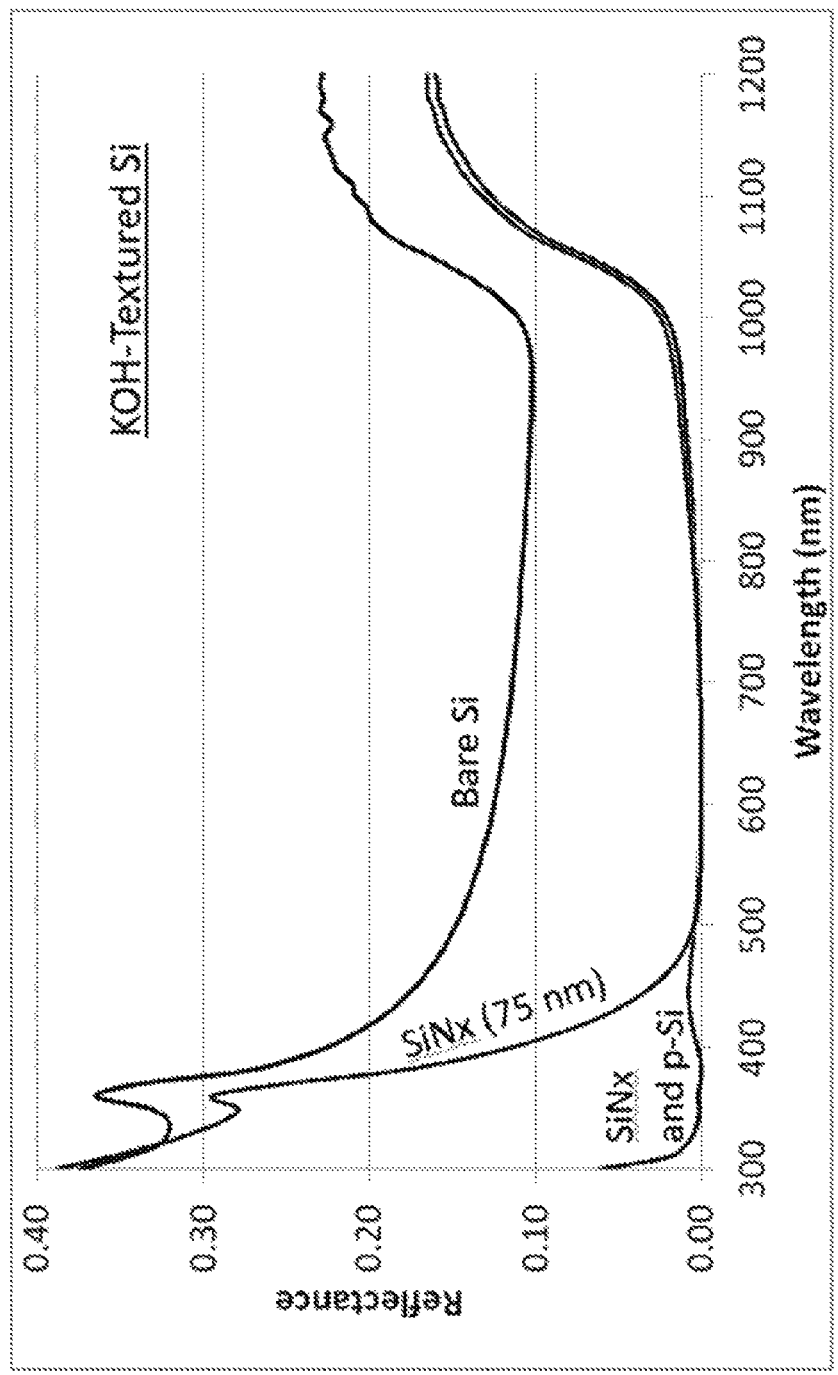
FIG. 4B shows simulated reflectance of a semiconductor system including a textured silicon substrate and a porous silicon region on the textured surface.

FIGS. 4A-4B show simulated reflectance of surfaces including a porous silicon layer. In each figure of FIGS. 4A and 4B, for comparison, the reflectance of bare silicon and bare silicon with a single layer of SiNx are also included.

Reflectance curves shown in FIG. 4A are taken on samples based on polished (smooth) silicon substrates. The bare polished silicon has a high reflectance across the entire spectral region between 300 nm and 1.2 µm. In particularly, on the two spectra ends (below 500 nm and about 1 µm), the reflectance on bare silicon can be as high as more than 50%, thereby inducing high reflection losses. Depositing a SiNx layer on bare silicon can noticeably reduce the reflectance in the visible and near infrared region (e.g., 400-1000 nm), but the reflectance in high shorter wavelength region can remain at high levels. Further decrease of reflectance is then achieved by introducing a combination of 55 nm SiNx with a 30 nm porous silicon layer (30% porosity). The resulting surface has significantly lower reflectance at the wavelengths shorter than 500 nm.

FIG. 4B shows reflectance of sample surfaces based on textured silicon surface prepared by, for example, KOH etching. The texture alone already shows reduction of reflectance compared to smooth surfaces shown in FIG. 4A. Qualitatively similar to the trends in FIG. 4A, depositing a SiNx layer on the bare silicon substrate reduces the reflectance in visible and near infrared region, and including a combination of a SiNx layer and a porous silicon layer further recues reflectance in the short wavelength region. In the last case, when both SiNx layer and porous silicon are deposited on a textured silicon substrate, the reflectance can be as low as nearly zero (e.g., <5%) within a wide spectral window between 350 nm and 800 nm. Outside this window, the reflectance is still below 10% for wavelengths shorter than 1050 nm and below 20% for wavelengths between 1050 nm and 1200 nm. Therefore, negligible reflection loss can be expected from solar cells with an antireflection coating (ARC) comprising a combination of a SiNx layer and a porous silicon layer.

Figure 5:
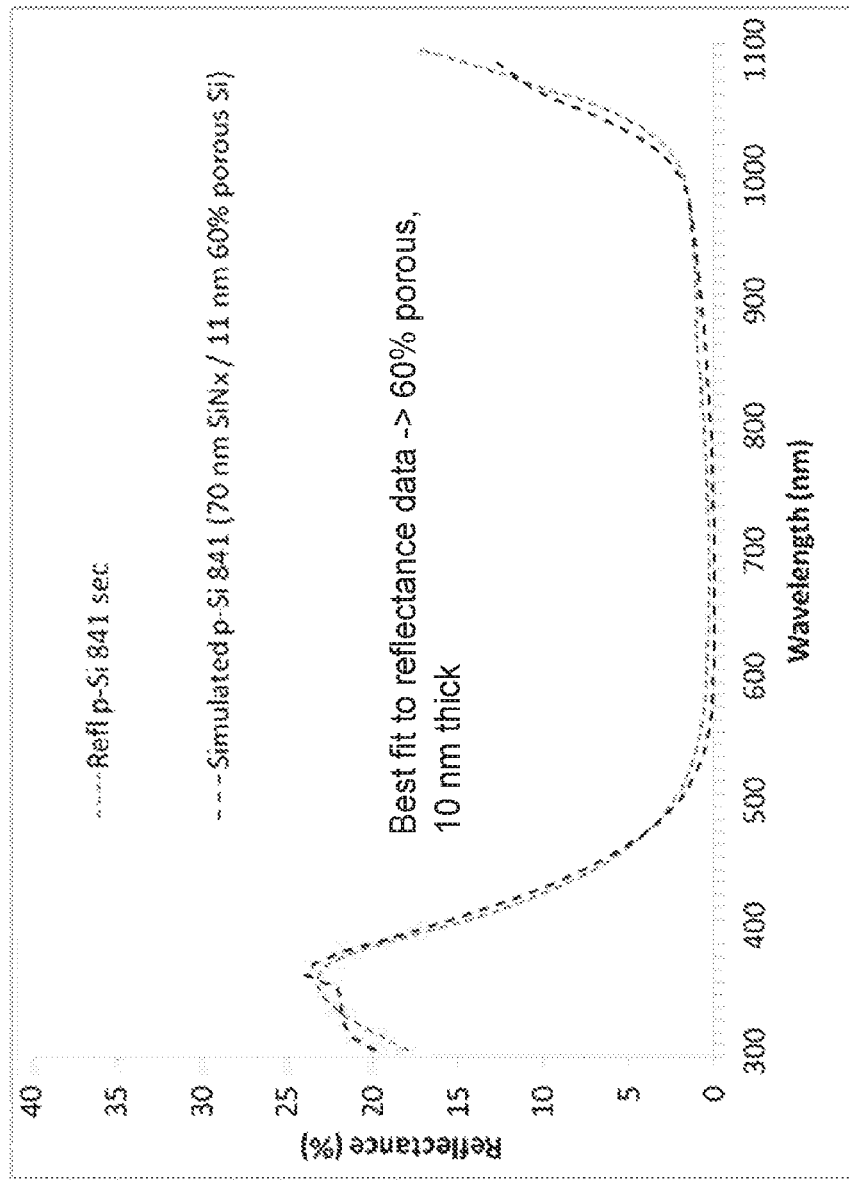
FIG. 5 illustrates a matching between simulated and measured reflectance of a semiconductor system including a silicon substrates and a porous silicon region on the surface.

Simulation of reflectance can also be employed to derive porous silicon parameters that are not readily measurable in experiment (e.g., porosity), as demonstrated in FIG. 5. This method includes the simulation of reflectance of a series of samples (simulation samples) including a porous silicon layer. Each sample may include a porous silicon layer having a different parameter. Then the reflectance of a particular experimental sample can be measured and the acquired experimental reflectance can be compared against the series of simulation samples to identify a best-matched simulation sample. Since parameters of the simulation samples are all known, the parameters of the matched experimental sample can be derived to be similar to the simulation parameters with reasonable confidence.

FIG. 5 shows that the experimental reflectance curve best matches a simulation sample including a porous silicon layer having a thickness of 10 nm and a porosity of 60%. Therefore, the experimental sample is believed by have a silicon layer having approximately a 10 nm thickness and 60% porosity as well. This method can provide a rough estimation of porous silicon parameters. More accurate estimation requires more thorough knowledge about the effects of other parameters of porous silicon on the reflectance property, such as morphology, doping concentration, refractive index, and refractive index distribution, among others.

Advanced Antireflection and Passivation Platform Converted from PSG/BSG Etch and Junction Isolation Tools for Solar Cell Fabrication Conventional solar cell manufacturing typically involves wet chemical etching processes. In particular, wet chemical etching processes represent a standard procedure in batch or inline based production lines for crystalline silicon solar cells. For example, before doping silicon substrates, SC1 or $O_3$ can be used for removing organics, while HCl, HF, $O_3$, or $H_2O_2$ can be used to remove metal impurities.

After doping, doped n-type silicon substrates normally have a layer of phosphosilicate glass (PSG) on the surface of the substrates created during the diffusion (doping). In practice, the PSG layer may act as a constant source of dopants for subsequent diffusion steps, thereby fixing the surface concentration of the phosphorous doped areas to the solid solubility limit. Accordingly, it is in general desirable to remove the PSG layers (PSG etch) in fabricating high efficiency solar cells. PSG etch can be achieved by, for example, HF or $NH_4F$ etching.

Similarly, p-type doped silicon substrates can also have a layer of borosilicate glass (BSG) created during the diffusion process. The BSG layer may lock the surface concentration of the boron doped areas to be solid solubility limit, preventing further doping. BSG layers can be similarly removed via etching processes using HF or $NH_4F$.

Furthermore, during the diffusion process, phosphorus not only diffuses into the desired front surface but also on the edges and the rear surface, creating a shunting path between the solar cell front and rear. For this reason, various edge isolation techniques have been devised, including, among others, plasma etching and laser cutting. As a conventional practice, edge junction isolation, or the removal of the path around the wafer edge, is commonly achieved by "coin stacking" the cells. The stacked cells are then placed inside a plasma etching chamber to remove the exposed edges. However, stacking and un-stacking in these isolation techniques may lead to a strong disruption in the process flow, thereby increasing manufacturing cost. Alternatively, inline process of junction isolation, without the steps of stacking and un-stacking, can be achieved via a wet chemical etching step, in which mixtures of HF, $HNO_3$ and $H_2O$ are utilized to etch away a diffused layer.

In conventional solar cell manufacturing, the junction isolation process may create porous silicon. However, this porous silicon is generally an undesirable byproduct because, at least partially, the creation of the porous silicon is uncontrolled. Therefore, conventional solar cell manufacturing normally includes a step of porous silicon etch to remove undesirable porous silicon.

Existing tools to implement wet chemical etching for solar cell fabrication, more specifically for junction isolation, PSG etch and/or porous silicon etch normally comprise: a junction isolation process tank, a first rinse station, a porous silicon etch process tank, a second rinse station, a PSG etch process tank, a third rinse station and a dry station. Each process tank can be coupled to one or more chemical reservoirs. For instance, the junction isolation process tank can be coupled to a HF reservoir, a $HNO_3$ reservoir and a $H_2SO_4$ reservoir. Additional reservoirs to contain water may also be included. The porous silicon etch process tank can be coupled to three chemical reservoirs for HF, $HNO_3$ and $H_2O$, or KOH, isopropyl alcohol (IPA) and $H_2O$. The PSG etch tank can be coupled to a HF reservoir.

One or more chemical dosing units can be coupled between the process tanks and the chemical reservoirs to control and monitor the amount, pressure and/or flow speed of the chemicals so as to optimize the etching process. Rinse stations in the above tools can use de-ionized (DI) water or ultrapure water to clean silicon substrates after each etching step.

The dry station can use hot air or nitrogen to dry silicon substrates after rinsing. Alternatively, more advanced surface tension gradient drying technique can also be used. The surface tension gradient drying, or Marangoni drying, can utilize a volatile organic compound (e.g. alcohol or IPA) with a lower surface tension than water that is introduced in the vicinity of the substrate as it is slowly withdrawn from the water. As the small quantity of the volatile compound vapor comes into contact with the refreshed water meniscus, it dissolves into the water and creates a surface tension gradient, which causes the meniscus to partially contract and assume an apparent finite angle. This causes the thin water film to flow off the substrate, thereby drying the substrate. Moreover, the Marangoni drying can also remove contaminants and particles during the drying process.

Figure 6:
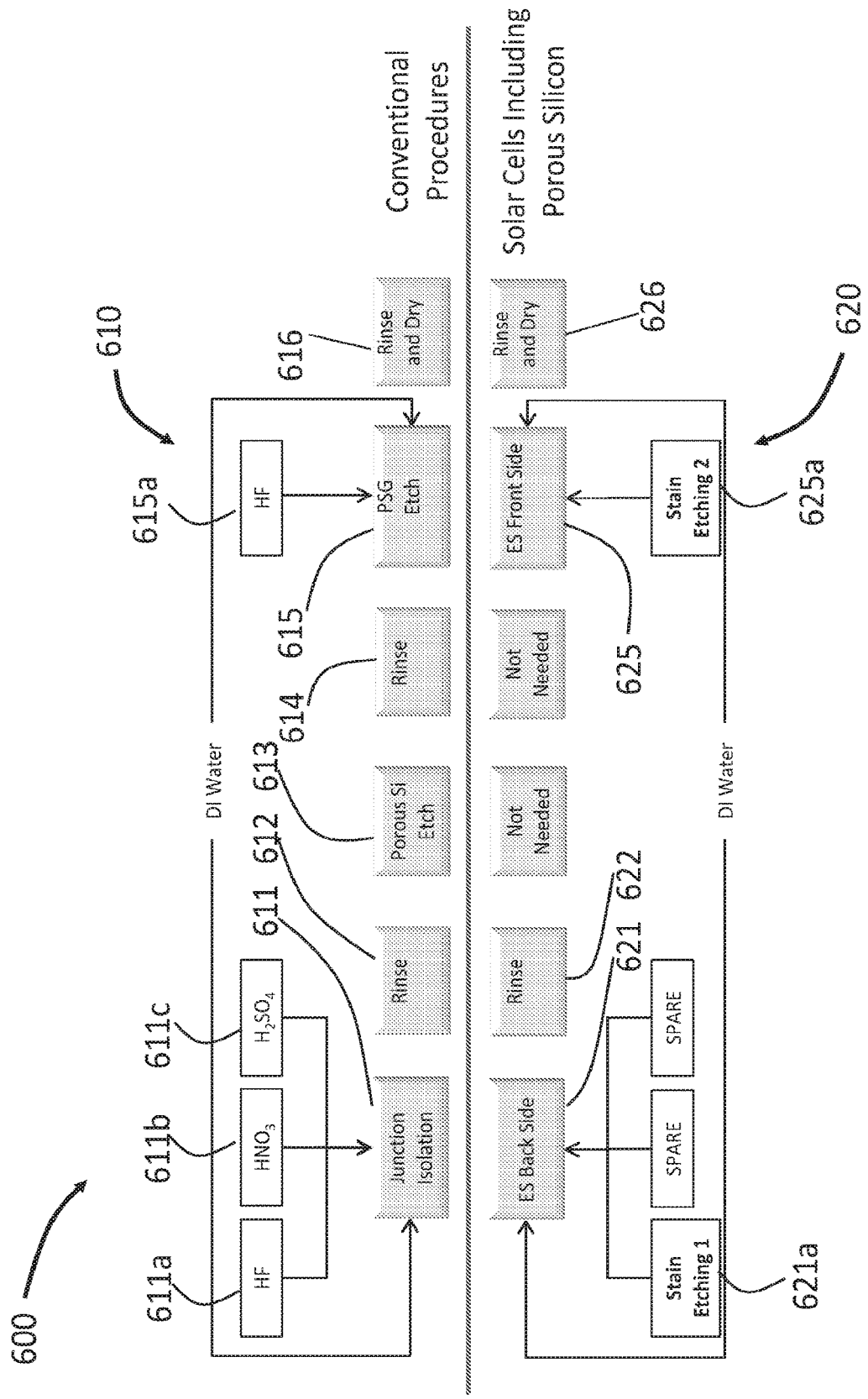
FIG. 6 illustrates a method of porous silicon layer formation using existing tools of junction isolation and PSG/BSG etch.

In operation, a conventional junction isolation and PSG etch process 610 for solar cells, as shown in FIG. 6, comprises the following steps. In step 611, a silicon substrate (after doping) for solar cell fabrication can be exposed to a chemical solution for junction isolation. The chemical solution can be delivered from chemical reservoirs 611a-611c that contain HF, $HNO_3$ and $H_2SO_4$, respectively. Step 612 rinses the junction isolated substrate by removing excessive chemicals on the substrate, preparing the substrate for step 613, in which a porous silicon etch step is carried out. A second rinse then cleans the etched substrate in step 614, followed by a PSG etch step 615 to remove any PSG on the surfaces of the substrate via use of HF from the chemical reservoir 615a. Another rinse and dry step 616 then cleans the substrate and dries the substrate for further processing, such as metallization.

The above tools for solar cell processing can be retrofitted and utilized, as shown in the bottom half of FIG. 6, to implement stain etching processes to produce the conventionally undesirable porous silicon layers in a controllable manner, while at the same time realizing junction isolation, PSG etch, etch-back, passivation, and anti-reflection coating, among others. This modified method 620 can simplify fabrication steps for solar cells and accordingly reduce manufacturing costs.

More specifically, the junction isolation unit, which generally comprise a junction isolation process tank and a plurality of chemical reservoirs to contain HF, $HNO_3$ and $H_2SO_4$, can be configured to passivate the back side of silicon substrates, in addition to junction isolation. A stain etching solution can be placed in one of the plurality of chemical reservoirs to grow a porous silicon layer on the back side of silicon substrates for passivation. Since the stain etching solution can also react with the edge of the silicon substrate, a layer of diffused silicon can be etched away, thereby achieving efficient edge isolation.

The PSG etch unit, which generally comprise a PSG etch process tank and a reservoir for HF, can be configured to passivate the front side of silicon substrates, in addition to PSG etch, anti-reflection layer coating and porous silicon etch. The HF in the chemical reservoir can be replaced by a stain etching solution to grow the porous silicon layer on the front side of silicon substrates for passivation. Since the growth of porous silicon layer normally starts when the stain etching solution comes into contact with a clean silicon surface, the solution can also be utilized for PSG etch.

Moreover, the stain etching solution can also create a textured front surface for solar cells during the same step of passivating the front side, thereby replacing or supplementing the front side texturing via, for example, KOH etching. In one example, the surface texturing is solely achieved by the stain etching solution via porous silicon creation. In another example, a KOH etch is employed to create surface texturing with a large feature size (e.g., on micrometer scale, on hundreds of nanometers scale, etc.). Then the stain etching solution is used to create additional texturing with finer structures, such as in the nanometer scale, to further improve the light trapping properties.

In yet another example, the stain etching solution can fabricate solar cells with smooth surfaces in the emitter region, while the antireflection coating disposed on the emitter region is textured due to the porosity of the porous silicon layer. Solar cells with smooth surfaces in the emitter and/or base regions but textured antireflection coatings can have several advantages, such as reduced front surface recombination velocity and a higher level of front surface passivation due to a less damaged silicon surface and reduced silicon surface area. Furthermore, these solar cells can also have a higher efficiency because of a decrease in the emitter sheet resistivity loss, lower contact resistance, higher shunt resistance, and a lower diode ideality factor.

The resulting porous silicon layer can also function, at least in part, as an anti-reflection coating (ARC) to help solar cells retains the incident solar energy. In one example, the porous silicon layer alone may form a single-layer antireflection coating. In another example, the porous silicon layer may be part of a multi-layer ARC, which can also include a silicon nitride (SiNx) layer, a silicon oxide (SiOx) layer, or an aluminum oxide ($Al_2O_3$) layer, with a larger refractive index than that of the porous silicon layer.

In operation, a method 620 of facilitating fabrication of a passivated emitter and rear solar cell via a stain etching process using existing solar cell processing tools can start from a diffused silicon substrate. In step 621, at least a portion of the silicon substrate for the solar cell can be placed in the junction isolation process tank to allow contact between the portion of the silicon substrate and a stain etching solution delivered from a chemical reservoir 621a. The chemical reservoir 621a can be selected from any one of the chemical reservoirs 611a-611c. Chemical reaction between silicon substrate and the stain etching solution can create a back side passivation layer comprising porous silicon. At the same time, chemical reactions between the substrate edge and the stain etching solution can also remove a diffused layer, thereby achieving junction isolation.

Following the stain etching processing on the back side in step 621, the silicon substrate can be rinsed in the first rinse station during step 622 before being sent to the PSG etch tank, in which the front surface of the silicon substrate can be processed via a second stain etching step 625. The second stain etching step 625 can produce a front side porous silicon layer and fulfill one or more of the following purposes: cleaning the silicon substrate by removing any PSG layer, etching back the silicon substrate, passivating the front side, and forming at least a portion of an anti-reflection coating.

The second stain etching solution, which can be delivered from a chemical reservoir 625*a* converted from the chemical reservoir 615*a* in the solar cell processing tool, can be further configured to create a textured surface on the front side of the solar cell by, for example, creating a porous silicon layer with pores of large sizes. In step 626, a third rinse station can then clean the silicon substrate by removing excess stain etching solutions, followed by a dry station to remove excessive water introduced by the previous rinse step.

In each of the two stain etching steps, on the front side and back side of the silicon substrate, respectively, more than one etching solution can be used so as to further increase the controllability of the porous silicon creation process. For example, when stain etching the front side of the silicon substrate, one etching solution can be configured to target the PSG layer on the front surface and quickly remove the PSG layers. A second etching solution can then replace the first etching solution and mostly perform the porous silicon creation. In another example, a first etching solution can be configured to etch back the front side of the silicon substrate more uniformly (i.e., etch away a smooth layer from the front side). A second etching solution can be configured to create pores in the remaining silicon substrate, thereby creating the porous silicon region. In yet another example, the etching solution can be configured to have different directional preference when doing the etching. On etching solution can preferably etch the silicon substrate in a vertical direction, and another etching solution can preferably etch the silicon substrate in a lateral direction. Tuning the relative etching time of these two etching solution can therefore create porous silicon layers with desirable morphology (e.g., pore size, shape, alignment, etc.). The above examples are for illustrative purposes only. In practice, the number of etching solution can be varied and adjusted depending on applications.

In each of the two stain etching steps, the etching solution, according to one example, can include a first percentage of a hydrofluoric acid (HF), a second percentage of an oxidant, a third percentage of a mineral acid, and a fourth percentage of balance water. The mineral acid can be, for example, $H_2SO_4$, HCl, HBr, $H_3PO_4$, and HI, among others. The oxidant can be, for example, $HIO_3$, which can have an amount of about 0.02 gram per liter (g/L) to about 0.8 grams per liter (g/L).

In another example, the etching solution can include a first percentage of a hydrofluoric acid (HF), a second percentage of $HIO_3$, a third percentage of a $H_2SO_4$, a fourth percentage of a surfactant, and a fourth percentage of water. The surfactant can be, for example, ammonium lauryl sulfate (ALS).

The overall etching speed of the porous silicon creation process may be tuned either by the composition of the etching solution, or by the temperature at which the chemical reaction occur. On the solution composition side, for example, increasing the HF concentration can in general increase the etching rate. Similarly, higher percentage of oxidant can also result in faster etching. The purpose of HCl and $H_2SO_4$ and/or any other acid is to, at least partially, shift the pH value of the solution to lower values such that the oxidant is in protonated form, which is the active form. For example, the acidity ($pK_a$) of $HIO_3$ is about 0.75. Therefore, at one pH step below this value (i.e., −0.25), the $HIO_3$ is almost completely protonated. Accordingly, additional acid can have a very small or negligible effect below certain threshold. On the temperature side, increasing the reaction temperature can increase reaction speed in general. Therefore, a variable growth speed during solar cell fabrication can be achieved if desired.

Converting existing tools in solar cell processing to an advanced passivation platform for solar cells as described in the above exemplary embodiment can have several advantages. First of all, the conversion involves almost no modification of existing systems and therefore requires nearly zero capital expenditure (CAPEX).

Moreover, the converted system can fulfill several purposes in a single step. For example, the back side passivation can simultaneously remove phosphorous diffusion on the substrate edge and achieve junction isolation, and the front side passivation can concurrently create at least a portion of anti-reflection coating (ARC), remove any PSG on the substrate surface, etch back the front side of the silicon substrate, and texturize the front surface of the resulting solar cell to increase efficiency. This simplifies the fabrication process for solar cells by eliminating at least the use of extra chemical reservoirs in the junction isolation unit, and the silicon porous etch process tank and the associated rinse station. The method also renders unnecessary several thermal steps that are normally part of a fabrication process when silicon oxide layers are thermally diffused.

The converted advanced passivation platform can also be more efficient than previous passivation systems such as dry/wet deposition systems and thermal/chemical growth systems. More specifically, the advanced passivation platform can produce porous silicon layers within a wide range of thickness, for example, from about 2 nm to hundreds to nanometers depending on the application of the porous silicon layers. The etching speed of the advanced passivation platform can also vary in a wide range—from a few nanometers per minute up to as high as 500 nanometers per minute—depending at least in part on the composition of the stain etching solution or operation temperature. The resulting porous silicon layers can have excellent passivation effect and extend the lifetime of charge carriers so as to improve the solar cell efficiency.

Comparing to other methods of passivation layer fabrication, the passivation system according to exemplary embodiments of the invention can have a wider thickness range than both thermal and chemical growth systems, a better passivation effect than wet deposition technique, at lower CAPEX than dry deposition technique, and a shorter process time than thermal growth method. In summary, the advanced passivation system can reduce overall manufacturing cost by streamlining the process and eliminating several steps and modules. The system can also improve environmental friendliness by eliminating at least one rinse station (save water) and several thermal steps (save electricity or gas).

Figure 7:
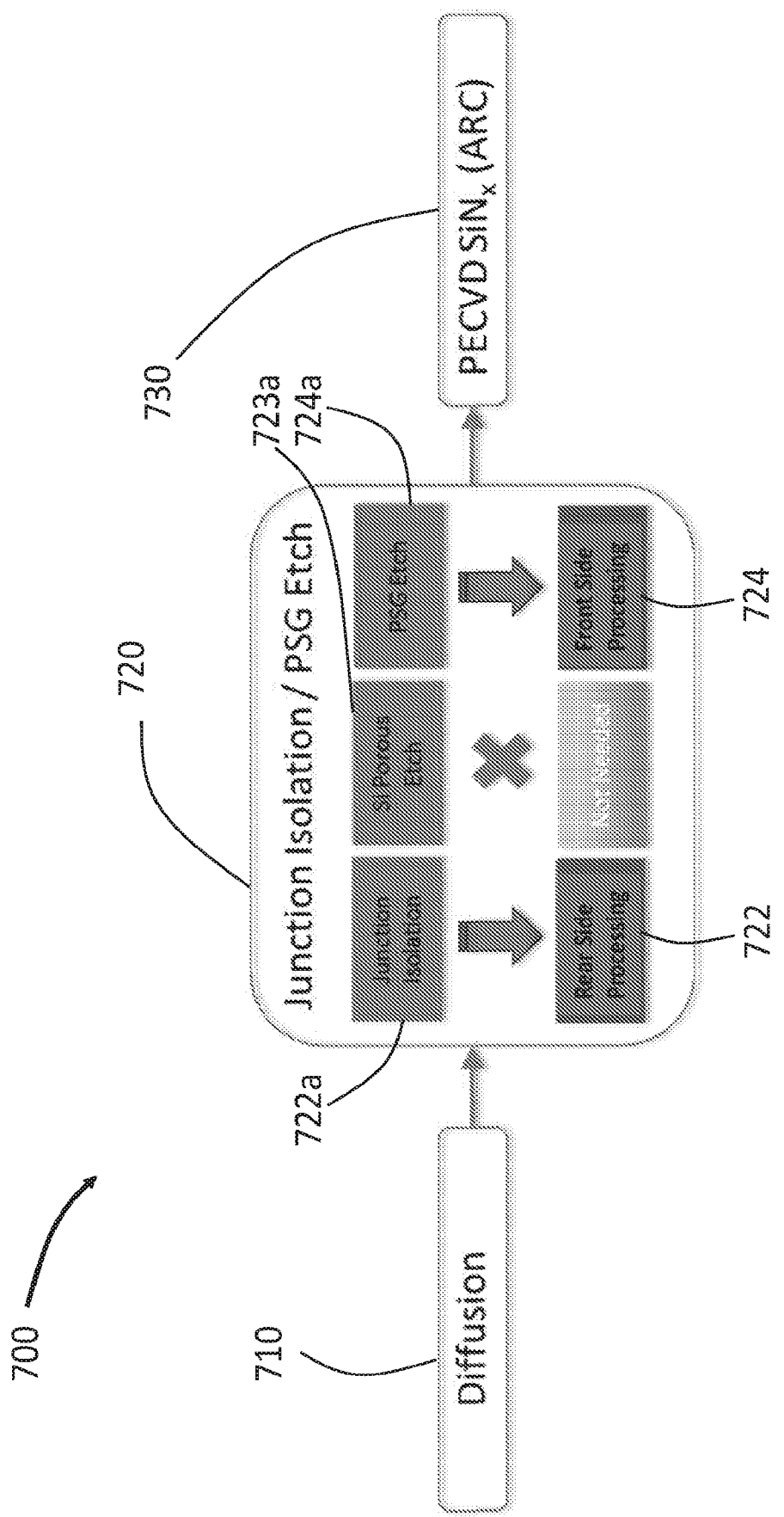
FIG. 7 is a flow chart of an exemplary solar cell manufacturing process using existing tools of junction isolation and PSG/BSG etch.

FIG. 7 shows an input and output system 700 for an advanced passivation platform like the one shown in FIG. 6. On the input end, a semiconductor substrate can be thermally diffused in step 710 with doping materials before being sent to the advanced passivation platform for back side and front side processing as in step 720. Alternatively or in addition, the doping materials (i.e., dopants) may be introduced into the substrate via ion implantation, laser-assisted doping, or other means known in the art. On the output end, the passivation substrate can be delivered for additional coatings. In one example, a layer of silicon nitride (SiNx) can be deposited over the front side porous silicon layer via a plasma enhanced chemical vapor deposition (PECVD) process to further improve the anti-reflection property of the resulting solar cell. In another example, a layer of aluminum oxide ($Al_2O_3$) can be deposited on the front side porous silicon layer via an atomic layer deposition (ALD) technique to further improve the passivation effect.

Low-Cost and Easy-to-Implement Process of Fabricating Highly Efficient Solar Cells Including Porous Silicon Layers One more advantage of the passivation method via stain etching processes is its compatibility with conventional screen printing metallization that creates front and back electrical contacts. The stain etching process allows the use of screen printing pastes which offer lower contact resistance and more conductive front grid contacts. As a result, the advanced passivation system that implements the passivation method can be conveniently integrated into conventional solar fabrication systems.

As described above, the advanced passivation system can in a single step: (i) in-situ chemically clean the silicon substrate surfaces, including the metalized surfaces making them interconnect ready, (ii) produce a porous silicon layer that passivates the surfaces and reduce reflection losses, (iii) create textures on the front surface of the resulting solar cell to improve efficiency, and/or (iv) etch back at least a portion of the front side of the solar cell to remove surface dead layers and improve the sheet resistance. Based on this advanced passivation system, a modified fabrication method for passivated emitter and rear cells (PERCs) can comprise steps outlined below.

The first step can be texturing a semiconductor substrate by creating a plurality of inverted pyramids on the front surface of the semiconductor substrate. The inverted pyramids can be either periodic or random and be produced by a KOH/isopropanol solution. Alternatively, a photolithography method can be utilized to create the inverted pyramid pattern. In operation, the inverted pyramid structure can decrease optical losses due to reflection. Moreover, due to the minimized contact area between the metal contacts and the silicon substrate, electrical losses can also be reduced by this inverted pyramid structure.

Following the surface texturing, the semiconductor substrate can be doped, or diffused with, for example, phosphorous on the front side as is readily understood in the art. Alternatively or in addition, both the front side and the back side can be doped so as to construct a bifacial or heterostructure solar cell. Doping materials may also include boron, aluminum or gallium, in addition to phosphorous. A variety of techniques can be employed here. For example, a phosphorus coating can be applied to the surface, and the coated substrate can be put in a belt furnace to diffuse a small amount of phosphorous into the substrate. In another example, doping the semiconductor substrate may be achieved via an ion implantation process, in which ions containing doping materials are accelerated and fired into the substrate.

Doping semiconductor substrates can then be exposed to a first stain etching solution for back side processing, including junction isolation and back side passivation layer formation, followed by front side processing to remove PSG impurities on the front surface, to etch back the front side, and to create a porous silicon layer for passivation and anti-reflection coating. This step can be implemented by an advanced passivation system converted from existing tools for solar cell fabrication, more specifically for function isolation and PSG etch.

Passivated semiconductor substrate can then be coated with a layer of silicon nitride (SiNx) on the front side to create an anti-reflection coating (ARC) via a plasma enhanced chemical vapor deposition (PECVD). In one example, the SiNx layer alone can function as an ARC layer. In another example, the SiNx and the porous silicon layer together form an effective ARC layer.

One or more metal contacts can be screen printed in on semiconductor substrates with ARC layers to conduct electricity generated by the solar cells. As is readily understood in the art, the front side metal contact can comprise silver (Ag), while Aluminum (Al) is commonly used on the back side. Screen printing method and the metal pasted used therein are compatible with stain etching solutions for porous silicon layer formation, thus the screen printing step and the passivation step via stain etching processes may be arranged in arbitrary orders.

One or more via can be created to facilitate the back side screen printing and ensure that the printed metal contact can have electrical contact with the semiconductor substrate beneath the back side passivation layer that includes porous silicon regions.

One method for via creation can use one or more resist dots disposed over the back side of the silicon substrate. The resist dots can be created by manually stamping, or photolithography techniques, in which a resist film is spin coated onto the surface, followed by selective etching using a radiation. Stain etching processes applied on the back side covered by resist dots can then create a patterned porous silicon layer, which is disposed only in areas not covered by the resist dots. Removing the resist dots can therefore expose the base region of the semiconductor on the back side for screen printing. The resulting metal layer from screen printing can accordingly have electrical contact with the semiconductor surface at least in locations where the resist dots are placed. In this exemplary embodiment, the metal contacts are non-fire through, but fire-through contacts may also be used.

Following the screen printing of metal contacts, the semiconductor substrate can be placed in one or more furnaces for drying and firing. More specifically, the metal paste can first be dried at about 150° C. to remove much of the solvents, which may cause excessive out gassing and lead to cracks and voids. The dried substrates are then fired inside a firing furnace that can further decomposed into four steps. The first step is the initial temperature ramp up where the paste solvents are volatilized. The second step is the burn out, which can remove substantially all of the organic binder used in paste formation at 300-400° C. The third step is the sintering, or the firing process, which can be done between the ranges of 700-800° C. in a furnace. During this process, the metal forms a bond with the underlying semiconductor substrate to form metal contact. The final step in the drying and firing process is the cool down phase.

Solar cells after drying and firing step can then be sorted according to, for example, the electrical performance. Simulated sunlight, provided by a pulsed xenon lamp with an optical filter to produce a close match to the air mass 1.5 global solar spectrum, can be used for the testing of electrical performance.

The modified solar fabrication process can be further modified to produce passivated emitter and rear locally (PERL) diffused cells. In this process, only areas that would have electrical contacts with the back side metal contact are doped with boron. The rest of the process can be substantially similar to the above described process.

Porous Silicon Layers Fabricated Via Stain Etching Techniques

Figure 8A:
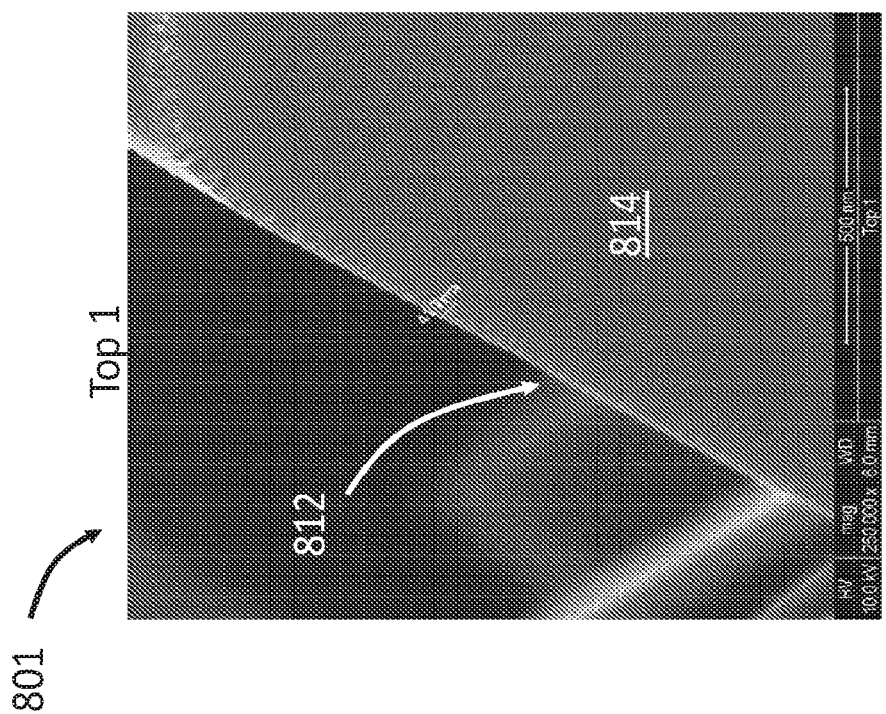
FIGS. 8A-8B are scanning electron microscopy (SEM) images of two silicon substrates with porous silicon on the surface. The two silicon substrates are processed by a first amount of etch-back.
Figure 8B:
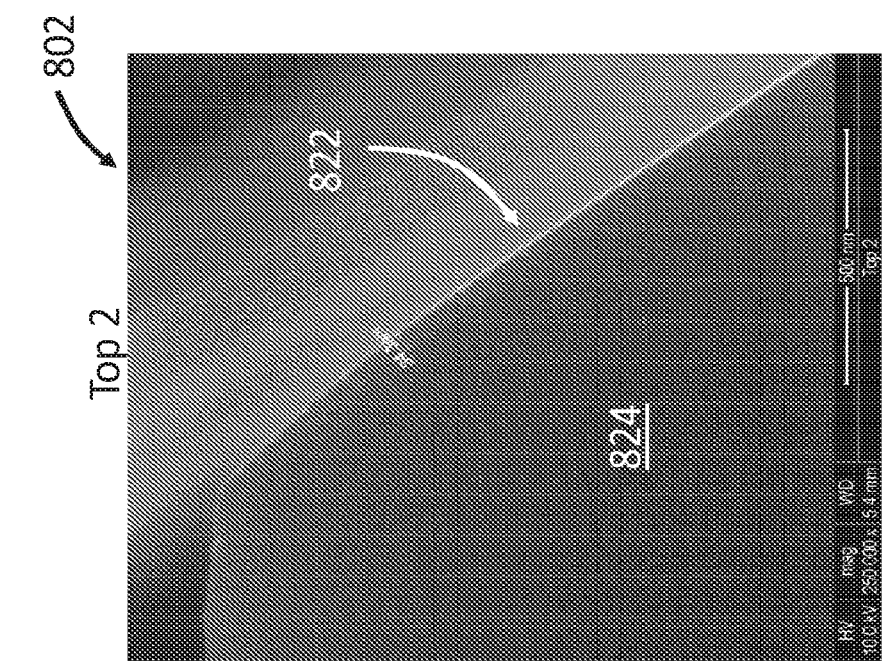

FIGS. 8A-8B show Scanning Electron Microscope (SEM) images of two porous silicon films created from n-type silicon substrates via a stain etching technique. The etching technique starts from a doped n-type silicon substrate, followed by an etch-back to remove some surface dead layers and diffused Phosphosilicate glass (PSG) layers. Then the etched back substrate is disposed in an etch-back solution, which comprises 0.2%-10% Hydrofluoric Acid (HF), 0.004%-0.1% Iodic Acid ($HIO_3$), 1%-2% Hydrochloride Acid (HCl), and balance water. In addition, ethanol can also be added to the solution to improve the wettability of the silicon substrate. A practical range of ethanol in the etch-back solution can be up to 20%.

Table 2 below shows the conditions for creating the porous silicon layers (labelled as "Top 1" and "Top 2") shown in FIGS. 8A and 8B. Substantially similar silicon substrates are used as the base substrate on which porous silicon layers are created. For example, the substrate for Top 1 layer and Top layer has a sheet resistance (Rho) of 61 Ω/sq and 62 Ω/sq, respectively. After the etch-back of 50 nm-100 nm, the sheet resistance increases to 140 Ω/sq and 132 Ω/sq for Top 1 layer and Top 2 layer, respectively. Then both etched back substrates are immersed in the same stain etching solution to fabricate porous silicon layers. After the stain etching, Top 2 layer is treated by a series of thermal processing, including 15 minutes of thermal drying at 100° C., 5 minutes of thermal firing at 400° C. (simulating the thermal effect from a PECVD treatment but without coating any films on the solar cells), 20 seconds of thermal firing at 550° C., followed by 5 seconds of thermal firing at 800° C. and another 5 seconds of thermal firing at 900° C. In contrast, Top 1 layer is not subject to any thermal treatment and is dried at room temperature.

The resulting Top 1 and Top 2 layers are shown in FIGS. 8A and 8B, respectively. The porous silicon 801 shown in FIG. 8A includes a porous silicon layer 812 disposed on a silicon substrate 814. The thickness of the porous silicon layer 812 is about 41.7 mm. The porous silicon 802 shown in FIG. 8B includes a porous silicon layer 822 disposed on a silicon substrate 824. The thickness of the porous silicon layer 822 is about 34.3 mm. The resulting difference in thickness of the two porous silicon layers 812 and 822 may be attributed to the thermal treatment (or the absence of treatment).

TABLE 2

Conditions for creating the porous silicon layers shown in FIGS. 8A and 8B

| Group 2 | Substrate | Sheet Rho (Bare) | Sheet Rho (SiOx) | Thermal (Drying) 15 min @ 100° C. | Thermal (PECVD) 5 min @ 400° C. | Thermal (Firing 1) 20 sec @ 550° C. | Thermal (Firing 2) 5 sec @ 800° C. | Thermal (Firing 3) 5 sec @ 900° C. | SEM Thickness Nm |
|---|---|---|---|---|---|---|---|---|---|
| | | | | Diffused PSG Etched, 50-100 nm | | | | | |
| Top | 1 | 61 | 140 | No Data | No Data | No Data | No Data | No Data | 41.7 |
| | 2 | 62 | 132 | 132 | 133 | 131 | 130 | 130 | 34.3 |

Table 3 below shows the conditions for creating the porous silicon layers (labelled as "Middle 1" and "Middle 2") shown in FIGS. 9A and 9B. The starting silicon substrates have a sheet Rho of 61 Ω/sq and 59 Ω/sq for the Middle 1 layer and Middle 2 layer, respectively. Then an etch-back of only 5 nm-10 nm is carried out to remove diffused PSG layer on the surface, followed by stain etching to create the porous silicon layers. After the stain etching, Middle 2 layer is treated by the same series of thermal processing as for the Top 1 layer in FIG. 8A (i.e., 15 minutes of thermal drying at 100° C., 5 minutes of thermal firing at 400° C., 20 seconds of thermal firing at 550° C., followed by 5 seconds of thermal firing at 800° C. and another 5 seconds of thermal firing at 900° C.). In contrast, Middle 1 layer is not subject to any thermal treatment and is dried at room temperature.

Figures 9A, 9B:
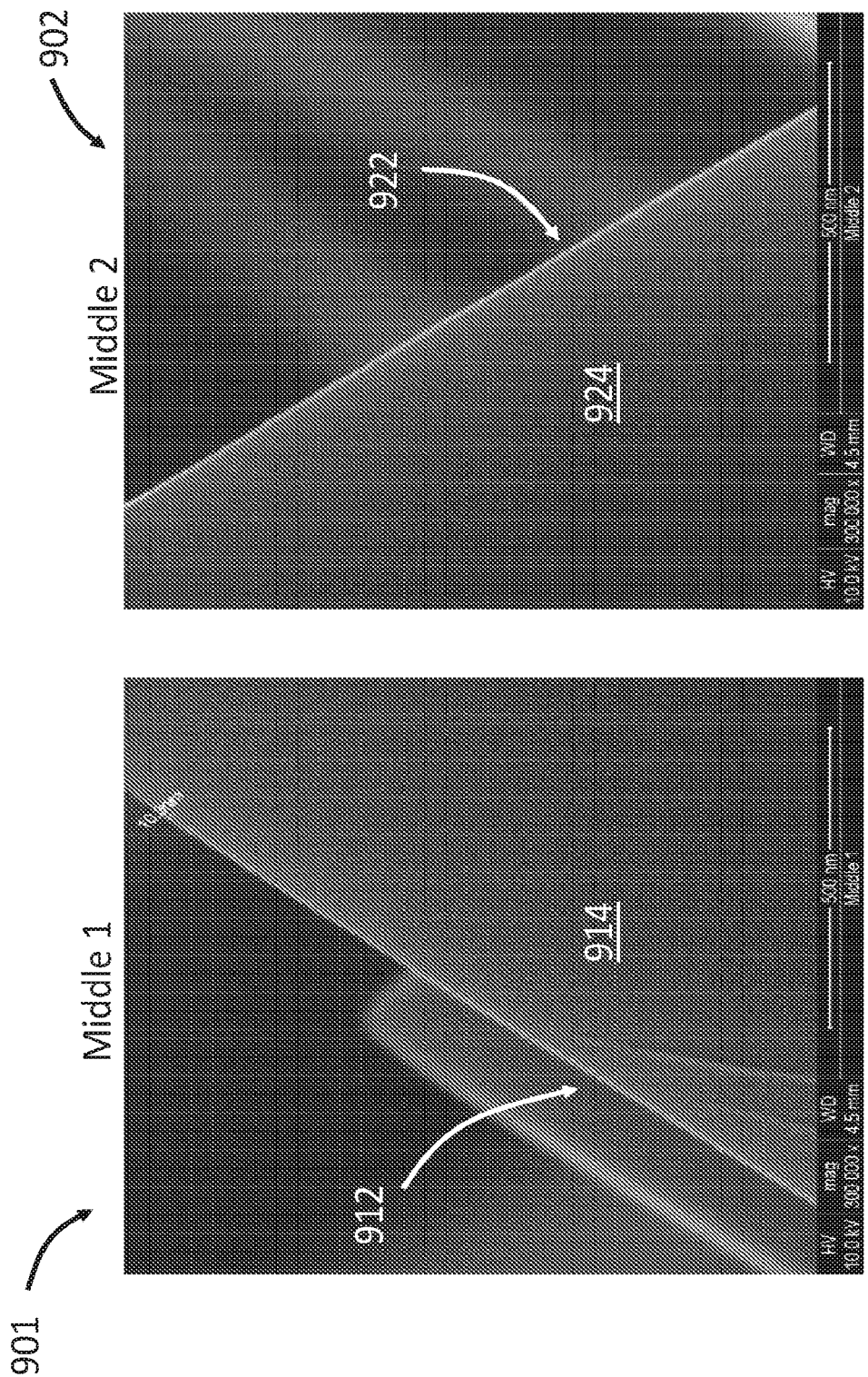
FIGS. 9A-9B are SEM images of another two silicon substrates with porous silicon on the surface. The two silicon substrates are processed by a second amount of etch-back.

The resulting porous silicon 901 shown in FIG. 9A includes a porous silicon layer 912 disposed on a silicon substrate 914. The thickness of the porous silicon layer 912 is about 10.3 nm. The porous silicon 902 shown in FIG. 9B includes a porous silicon layer 922 disposed on a silicon substrate 924. The thickness of the porous silicon layer 922 is about 15.9 nm.

TABLE 3

Conditions for creating the porous silicon layers shown in FIGS. 9A and 9B

| Group 3 | Substrate | Sheet Rho (Bare) | Sheet Rho (SiOx) | Thermal (Drying) 15 min @ 100° C. | Thermal (PECVD) 5 min @ 400° C. | Thermal (Firing 1) 20 sec @ 550° C. | Thermal (Firing 2) 5 sec @ 800° C. | Thermal (Firing 3) 5 sec @ 900° C. | SEM Thickness Nm |
|---|---|---|---|---|---|---|---|---|---|
| | | | | Diffused PSG Etched, 5-10 nm | | | | | |
| Middle | 1 | 61 | 70 | No Data | No Data | No Data | No Data | No Data | 10.3 |
| | 2 | 59 | 69 | 69 | 71 | 70 | 70 | 69 | 15.9 |

Comparing the conditions listed in Table 2 and Table 3, it can be seen that the resulting porous silicon layers can be sensitive to the conditions of the silicon substrate before the stain etching (e.g., removal of PSG layer in these two examples). The silicon substrates used in FIGS. 8A-8B and FIGS. 9A-9B have at least two differences. First, the etch-back is different. Silicon substrates in FIGS. 8A-8B are etched back by 50 nm-100 nm, while silicon substrates in FIGS. 9A-9B are etched back by 5 nm-10 nm. Second, the resulting sheet resistance from the etch-back is also different. Silicon substrates in FIGS. 8A-9B have a sheet Rho of around 132-140 Ω/sq after etch-back, while silicon substrates in FIGS. 9A-9B have a sheet Rho of around 69-70 Ω/sq after etch-back.

The resulting porous silicon layers also have at least two differences. First, porous silicon layers shown in FIG. 9A-9B in general are much thinner than those shown in FIGS. 8A-8B. This may be attributed to the smaller etch-back for the "Middle" group. Without being bound by any particular theory or mode of operation, silicon substrates used for the "Middle" group may still have residue PSG layers so the stain etching may need to overcome the residue PSG layers, or other impurities on the surface, before creating porous silicon. Also, the different sheet resistances may engage different chemistry during the formation of the porous silicon layers.

Second, thermal treatments have opposite effects on the resulting thickness of the porous silicon in FIGS. 8A-8B and FIGS. 9A-9B. In FIGS. 8A-8B, it seems that thermal treatment can decrease the thickness of the resulting porous silicon, while in FIGS. 9A-9B the same thermal treatment may be the reason of the thicker porous silicon layer (Middle 2 layer). Therefore, the possible residue PSG layer, or other impurities on or near the substrate surface, may also play a role during the thermal treatments in influencing the final thickness of the porous silicon layers.

Moreover, the different effect induced by thermal treatment may also be related to the sheet resistance. In FIGS. 8A-8B, the difference of sheet Rho between the substrates for Top 1 layer and Top 2 layer is about 8 Ω/sq, while the difference of sheet Rho between the substrates for Middle 1 layer and Middle 2 layer is only 1 Ω/sq. The change of sheet Rho difference may reverse the effect of thermal treatment on the thickness of the resulting porous silicon.

In practice, the manufacture of porous silicon can take advantage of the dependence of porous silicon properties on the substrate condition before stain etching, or other techniques used in creating porous silicon layers. In particular, the surface conditions (PSG layer, impurities, etc.) and the sheet Rho may be employed to tune the properties of the manufactured porous silicon layers.

Figures 10A, 10B:
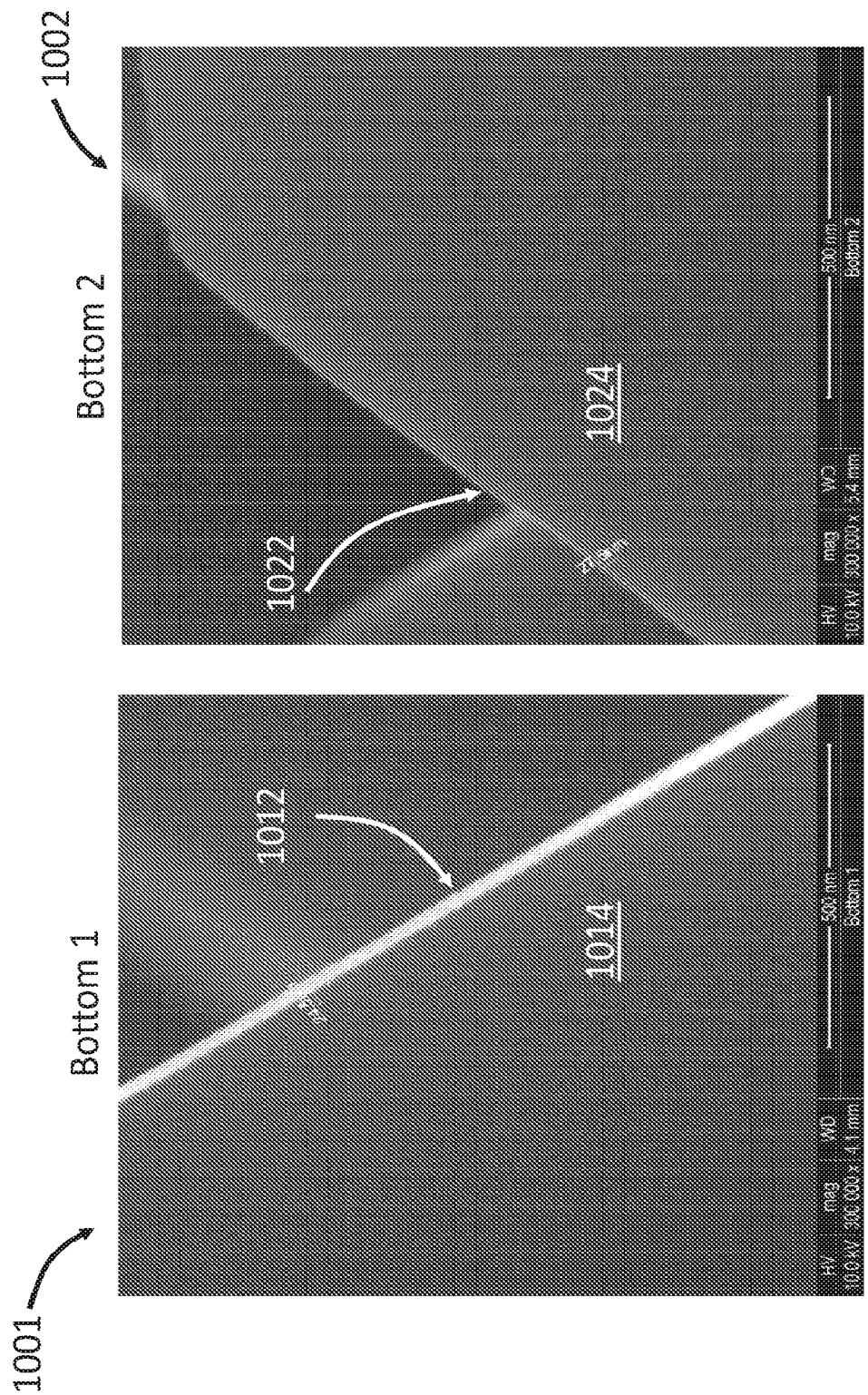
FIGS. 10A-10B are SEM images of another two silicon substrates with porous silicon on the surface. The two silicon substrates are processed by a third amount of etch-back.

Table 4 shows the conditions for creating the porous silicon layers (labelled as "Bottom 1" and "Bottom 2") shown in FIGS. 10A and 10B. The two silicon substrates used in FIG. 10A and FIG. 10B are etched back by 20 nm, between the 50-100 nm etch-back in FIGS. 8A-8B and the 5-10 nm etch-back in FIGS. 9A-9B. The sheet Rho (and the difference of sheet Rho within the group) after the etch back (~81-85 Ω/sq) is also between the sheet Rho listed in Table 2 (~132-140 Ω/sq) and the sheet Rho listed in Table 3 (~69-70 Ω/sq).

TABLE 4

Conditions for creating the porous silicon layers shown in FIGS. 10A and 10B

| Group 4 | Substrate | Sheet Rho (Bare) | Sheet Rho (SiOx) | Thermal (Drying) 15 min @ 100° C. | Thermal (PECVD) 5 min @ 400° C. | Thermal (Firing 1) 20 sec @ 550° C. | Thermal (Firing 2) 5 sec @ 800° C. | Thermal (Firing 3) 5 sec @ 900° C. | SEM Thickness Nm |
|---|---|---|---|---|---|---|---|---|---|
| | | | | Diffused PSG Etched, 20 nm | | | | | |
| Bottom | 1 | 61 | 81 | No Data | No Data | No Data | No Data | No Data | 24.5 |
| | 2 | 62 | 85 | 85 | 85 | 84 | 84 | 82 | 27.5 |

The resulting porous silicon 1001 and 1002 shown in FIGS. 10A and 10B, respectively, also display properties between those shown in FIGS. 8A-8B and FIGS. 9A-9B. More specifically, the thickness of the porous silicon layers 1012 and 1022, in general, is between the thickness shown in FIGS. 8A-8B and FIGS. 9A-9B. In addition, thermal treatment is this example tends to increase the thickness of the resulting porous silicon layer, but the percentage of increase (~12%) is much smaller compared to the percentage of increase in FIGS. 9A-9B (~50%).

Table 5 below shows the conditions for creating the porous silicon layers shown in FIGS. 11A and 11B. In these two samples, the etch-back is greater than any of the previous samples shown in FIGS. 8A-8B, as indicated by the sheet Rho after etch-back (160 Ω/sq). The resulting porous silicon layers 1112 and 1122 are accordingly thicker.

TABLE 5

Figure 11B:
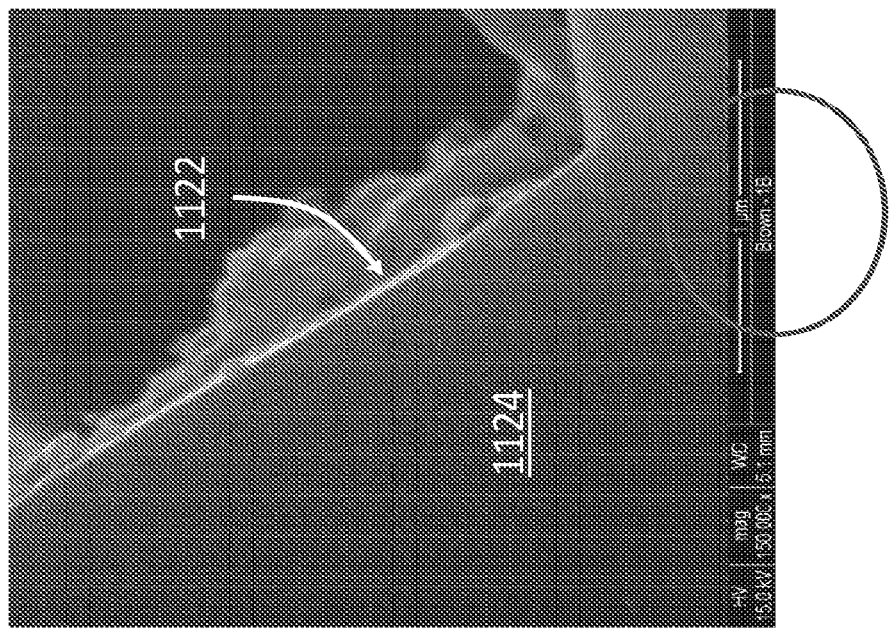
FIGS. 11A-11B are SEM images of another two silicon substrates with porous silicon on the surface. The two silicon substrates are processed by a fourth amount of etch-back.
Figure 11A:
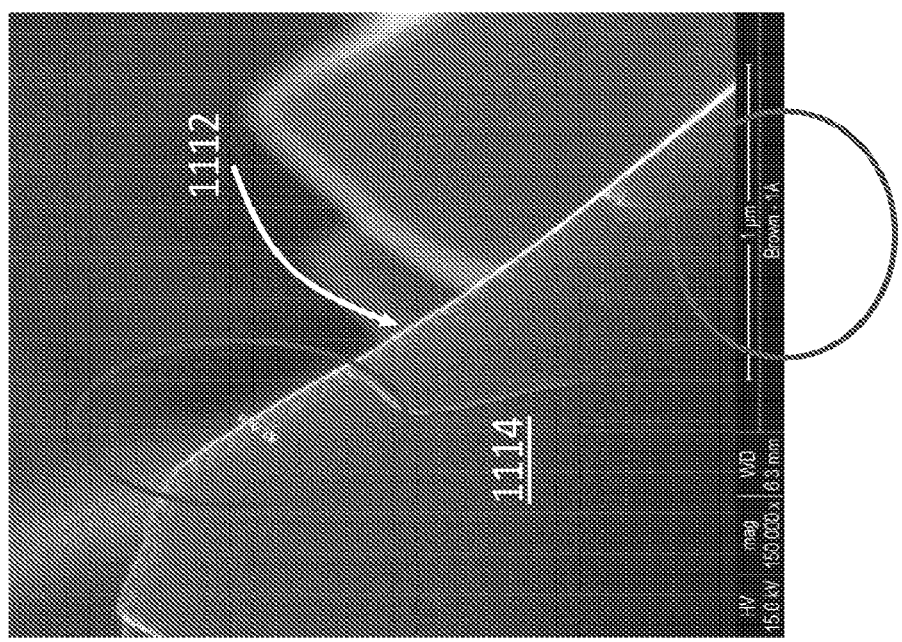

Conditions for creating the porous silicon layers shown in FIGS. 11A and 11B

| | Substrate | Sheet Rho (Bare) | Sheet Rho (SiOx) | Thermal (Drying) 15 min @ 100° C. | Thermal (PECVD) 5 min @ 400° C. | Thermal (Firing 1) 20 sec @ 550° C. | Thermal (Firing 2) 5 sec @ 800° C. | Thermal (Firing 3) 5 sec @ 900° C. | SEM Thickness Nm |
|---|---|---|---|---|---|---|---|---|---|
| Light Brown | 1A | 61 | 160 | No Data | No Data | No Data | No Data | No Data | 53.7 |
| Light Brown | 1B | 61 | 160 | 161 | 185 | 187 | 188 | 189 | |

Table 4 and Table 5, in combination with the resulting porous silicon layers shown in FIGS. 10A-10B and FIGS. 11A-11B, can qualitatively indicate of the influence of etch-back on the thickness of the resulting porous silicon. In general, deeper etch-back (or higher sheet Rho after etch-back) results in thicker porous silicon layers, given that other conditions are the same. Moreover, with higher sheet Rho, thermal treatments tend to decrease the thickness of the resulting porous silicon, while with lower sheet Rho, thermal treatments have the opposite effect, i.e. increasing the resulting thickness. The threshold value of sheet Rho may be around ~18-85 Ω/sq, above which thermal treatments decrease the thickness of the resulting porous silicon layers.

FIGS. 12A-12D show porous silicon layers (films) fabricated by another stain etching technique. In this stain etching technique, the etching solution includes approximately 0.03% HIO$_3$, 2-4% H$_2$SO$_4$, 2-8% HF, 0.1-1.0% of surfactant such as ammonium lauryl sulfate (ALS), and balance H$_2$O. The surfactant, in general, can lower the surface tension between the etching solution and the surface of the silicon substrate, thereby improving the chemical reaction between the etching solution and silicon in the substrate.

Figure 12C:
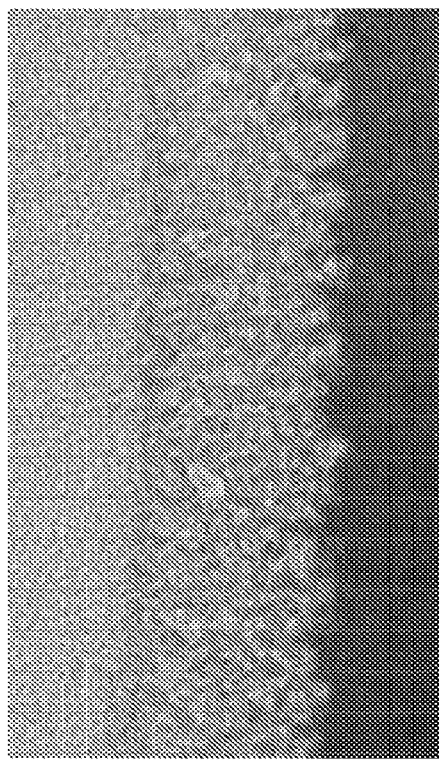
FIGS. 12A-12D are SEM images of two porous silicon samples fabricated by a stain etching solution including a surfactant.
Figure 12D:
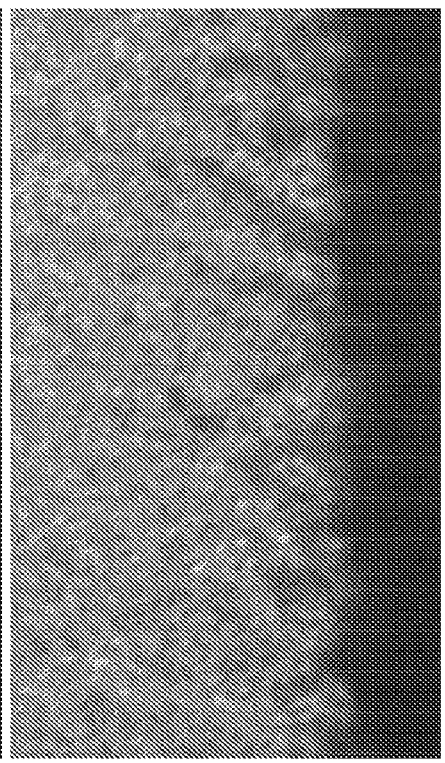
Figure 12A:
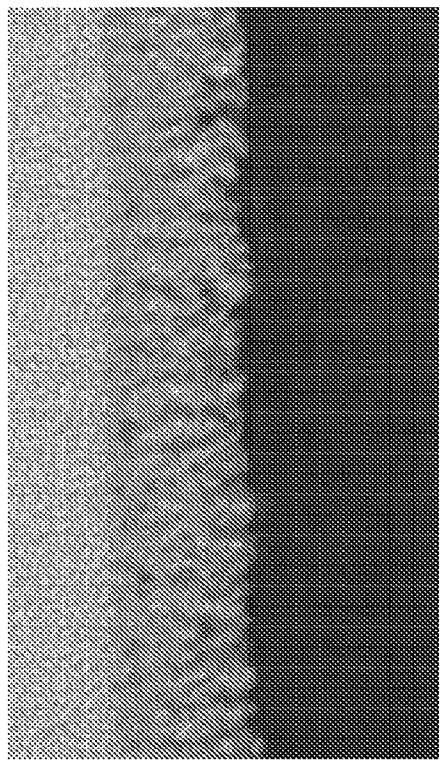
Figure 12B:
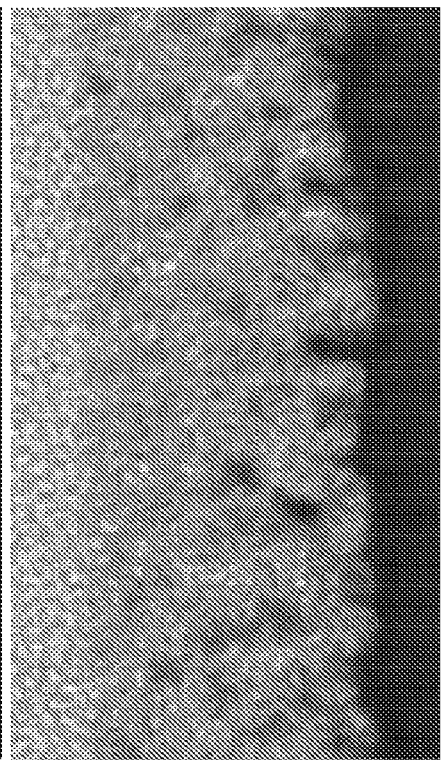

FIG. 12A show an SEM image of a porous silicon layer created from a silicon substrate via an etching solution including 1.6% HF. The silicon substrate has a 100 Ω/sq etch-back before being exposed to the etching solution. FIG. 12B shows a zoom-in image of the porous silicon shown in FIG. 12A. In comparison, FIG. 12C shows a porous silicon layer created from a same silicon substrate (with 100 Ω/sq etch-back), but the etching solution used in FIG. 12C contains 10% HF acid. A zoom-in image of the porous silicon in FIG. 12C is shown in FIG. 12D. It can be seen that a higher concentration of HF acid in the etching solution tends to increase the porosity of the resulting porous silicon, given that other conditions are substantially the same.

Solar Cells Including Porous Silicon Layers

FIGS. 13A-13C show photos of solar cells treated by three different techniques. FIG. 13A shows a photo of a solar cell (baseline solar cell), on which no etch-back is performed. The performance of this solar cell functions as a baseline, with respect to which the performance of the other two solar cells is compared. FIG. 13B shows a photo of a solar cell processed by a stain-etching solution, which can remove surface dead layers, clean PSG layers, and create porous silicon films in a single step. Table 6 below shows a detailed list of parameters used in one example. The stain etching solution contains 0.2% HF, 1.1% HCl, 0.008% oxidant, and corresponding percentage of balance water. The process time is 84 seconds, after which the sheet Rho increases from 72 Ω/sq to 89 Ω/sq. FIG. 13C shows a photo of a solar cell processed HF and ozone (O$_3$). In operation, ozone can oxidize the Si surface and the HF then removes the oxidized product (e.g., SiO$_2$). About 20 Ω/sq of etch-back is achieved after the processing using HF/O$_3$. However, no porous silicon is expected to be created by HF/O$_3$ solution.

TABLE 6

Processing parameters for solar cells shown in FIG. 11B

| | |
|---|---|
| HF Concentration | 0.2% |
| HCl Concentration | 1.1% |
| Oxidant Concentration | 0.008% |
| Process Time | 84 s |
| Initial Sheet Rho (average) | 72 Ω/sq |
| Final Sheet Rho (average) | 89 Ω/sq |

Figures 14A, 14B:
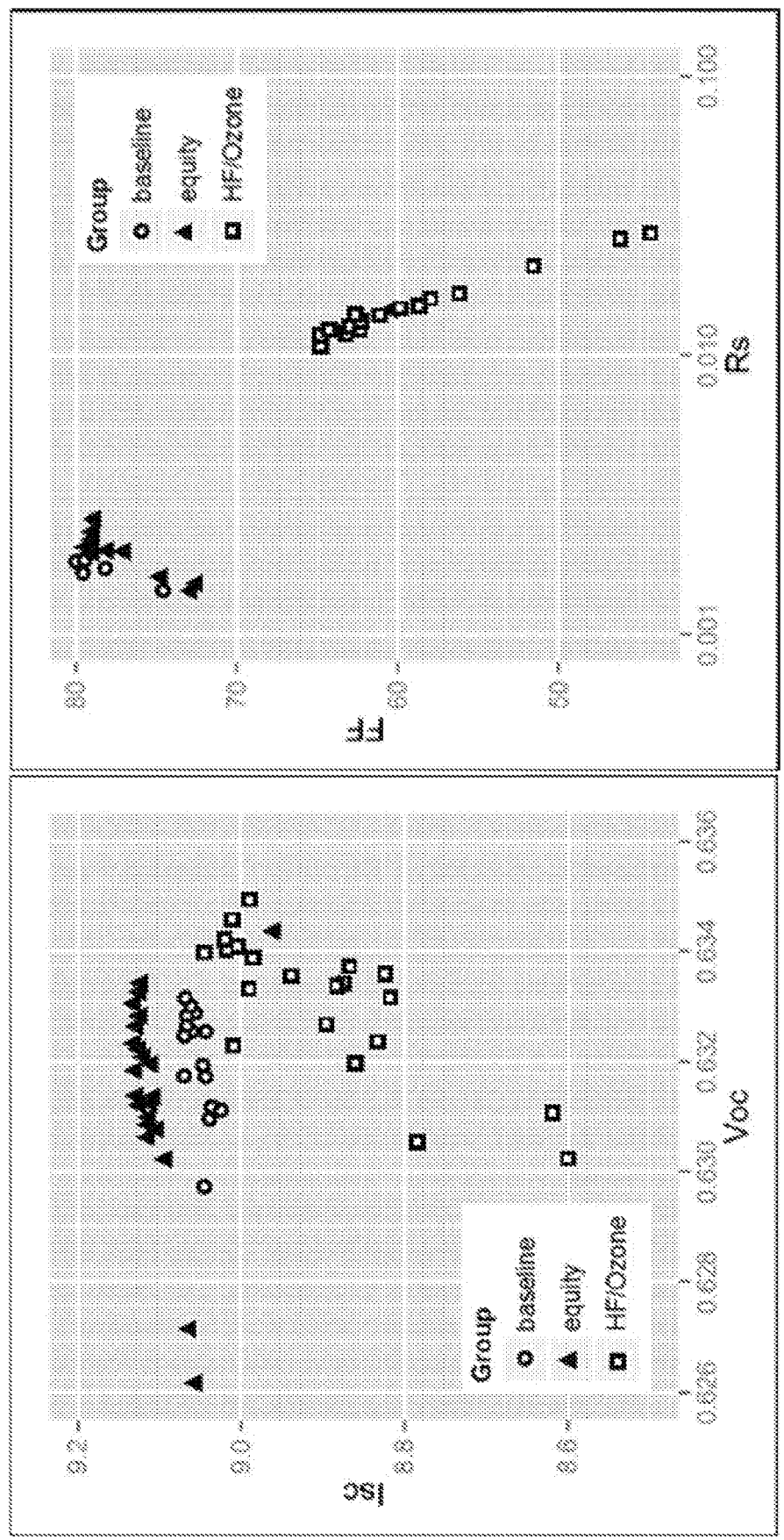
FIGS. 14A and 14B are measured short circuit currents $I_{sc}$ and fill factors (FF), respectively, of the three solar cells shown in FIGS. 13A-13C.

FIG. 14A shows I-V curves of the three solar cells in FIGS. 13A-13C. FIG. 14B shows fill factors (FF) with respect to series resistance ($R_s$) of the three solar cells in FIGS. 13A-13C. In general, the solar cell processed by stain etching solution displays a higher short circuit current $I_{sc}$ with respect to open circuit voltage $V_{oc}$. The fill factor of the solar cell processed by the stain etching solution is slightly lower compared to that of the baseline solar cell, but the difference is negligible and can be well compensated by the increase in $I_{sc}$. In both FIGS. 14A and 14B, the performance of the solar cell processed by the stain etching solution is better than that of the solar cell processed by HF/O$_3$. Considering that the difference between these two solar cells is the presence (or absence) of a porous silicon layer on the front surface, it can be confirmed that the porous silicon layer can noticeably improve the performance of a solar cell.

Figure 15:
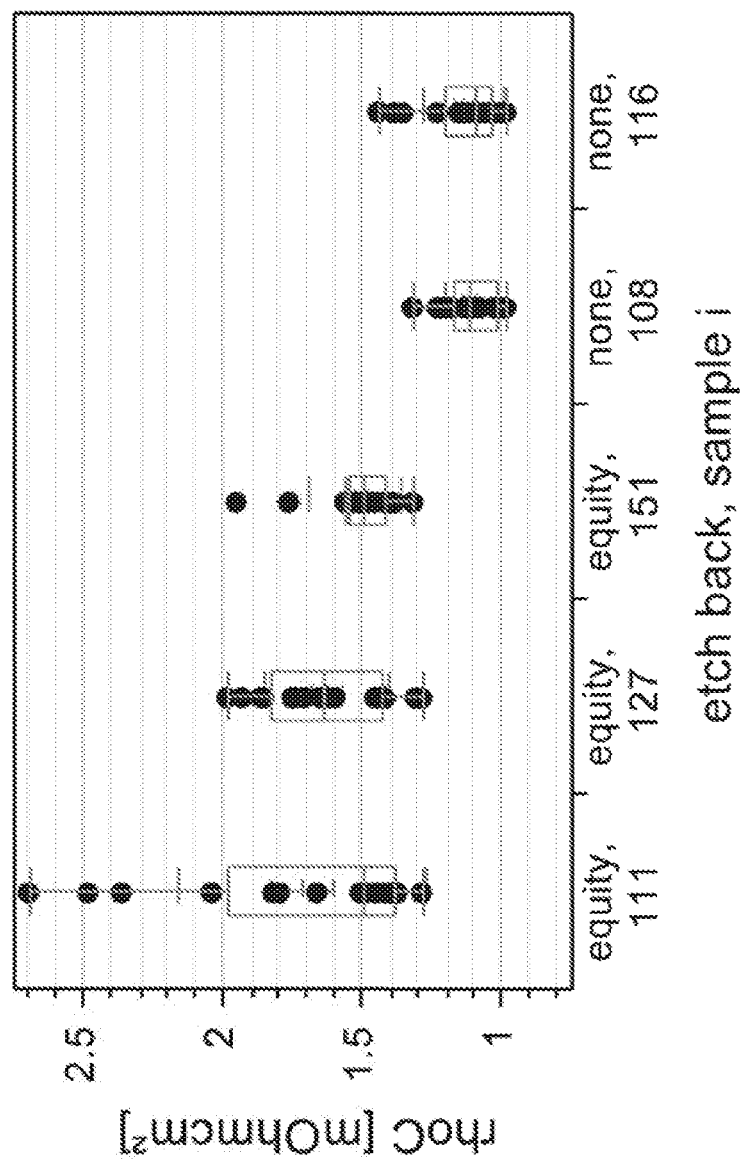
FIG. 15 is a measurement of contact resistance on the front side of the solar cells shown in FIGS. 13A-13C.

FIG. 15 shows measured contact resistivity of solar cells processed by the stain etching solution and the baseline solar cells. Contact resistivity of solar cells processed by HF/O$_3$ is not included here because these cells have a much higher resistivity and lower fill factor (see FIG. 14B). For each sample group, at least two samples are included in the measurement. For each sample in the sample group, multiple measurements are performed at different locations on the sample to calculate an average value for comparison. In general, solar cells processed by the stain etching solution have a higher contact resistivity, but the contact resistivity is still in a region that is practically useful in applications.

Figure 16A:
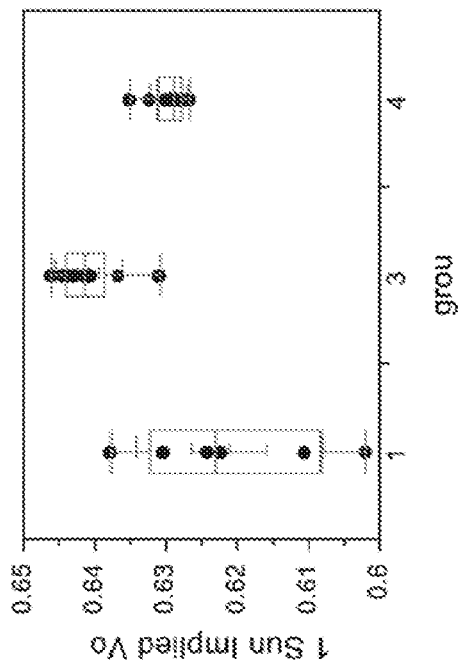
FIG. 16A is a measurement of reverse saturation current density of solar cells shown in FIGS. 13A-13C.
Figure 16B:
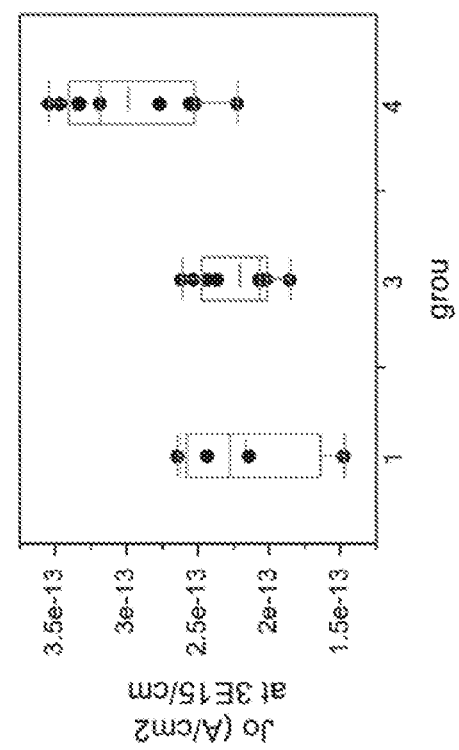
FIG. 16B is a measurement of implied open circuit voltages of solar cells shown in FIGS. 13A-13C.
Figure 16C:
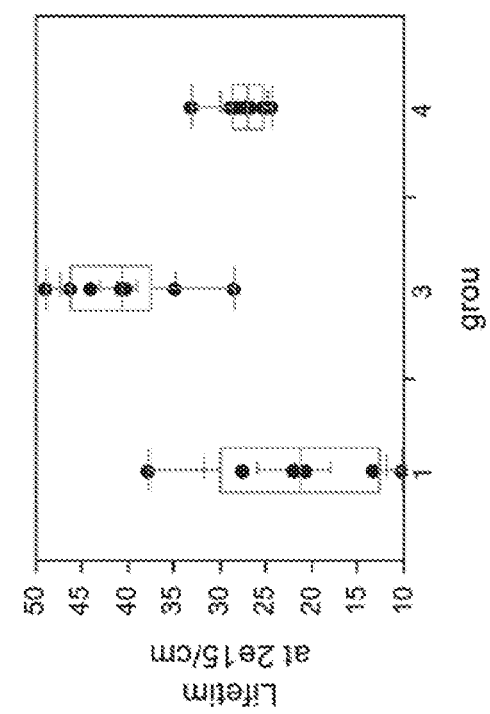
FIG. 16C is a measurement of lifetimes of solar cells shown in FIGS. 13A-13C.

FIGS. 16A-16C show measurements of reverse saturation current density $J_o$, 1 sun implied $V_o$, and lifetime of the three groups of solar cells shown in FIGS. 13A-13B. In FIGS. 16A-16C (on the x-axis), group 1 represents solar cells processed by the stain etching solution, group 3 represents solar cells processed by HF/O$_3$, and group 4 represents baseline solar cells (no etch-back).

FIG. 16A shows measured reverse saturation current density $J_o$ of the three groups of solar cells shown in FIGS. 13A-13C. In general $J_o$ is a measure of the leakage (or recombination) of minority carriers across the p-n junction in reverse bias. This leakage can be a result of carrier recombination in the neutral regions on either side of the junction. Therefore, $J_o$ can control the value of open circuit voltage $V_{oc}$ in solar cells. Since minority carriers are typically generated through thermal effect, $J_o$ can be dependent on temperature changes. In general, a lower $J_o$ can indicate a better performance of the corresponding solar cell. The reverse saturation current density of group 1, on average, is the lowest among the three groups, indicating that etch-back and porous silicon layers may contribute to the decrease of $J_o$.

FIG. 16B shows implied open circuit voltage $V_{oc}$ at one sun of the three groups of solar cells shown in FIGS. 13A-13C. Implied $V_{oc}$ is derived from the carrier concentration, instead of direct measurement. Solar cells processed by the stain etching solution shows a lower (on average) implied $V_{oc}$, and a larger fluctuation among data points.

FIG. 16C shows lifetime of the three groups of solar cells shown in FIGS. 13A-13C. In this measurement, solar cells processed by the stain etching solution are comparable to baseline solar cells, both of which have a shorter lifetime than that of the solar cells processed by $HF/O_3$.

Stain Etching Solutions Used in Porous Silicon Creation

There are at least two types of solution that can be used to create porous silicon from silicon substrates. The first solution (referred to as an HF-Nitric solution) contains HF acid and Nitric Acid ($HNO_3$), and the second solution (referred to as HF-HCl) contains HF, HCl, and Oxidant ($HIO_3$), but does not contain any Nitric acid. FIGS. 17A-17E show comparison of properties of solar cell including porous silicon layers created by these two solutions.

TABLE 7

Conditions for creating porous silicon via HF-Nitric solution

| Samples | DIW (mL) | HF (mL) | HCl (mL) | OX (g) | Nitric Acid (mL) | Agitation (RPM) | Light |
|---|---|---|---|---|---|---|---|
| 1 | 125 | 83 | 0 | 0 | 42 | 155 | LIGHT |
| 2 | 125 | 83 | 0 | 0 | 42 | 155 | LIGHT |
| 3 | 125 | 83 | 0 | 0 | 42 | 155 | LIGHT |
| 4 | 125 | 83 | 0 | 0 | 42 | 155 | LIGHT |
| 5 | 125 | 83 | 0 | 0 | 42 | 155 | LIGHT |
| 6 | 125 | 83 | 0 | 0 | 42 | 155 | LIGHT |
| 7 | 125 | 83 | 0 | 0 | 42 | 155 | LIGHT |
| 8 | 125 | 83 | 0 | 0 | 42 | 155 | LIGHT |

TABLE 8

Conditions for creating porous silicon via HF-HCl solution

| Samples | DIW (mL) | HF (mL) | HCl (mL) | OX (g) | Nitric Acid (mL) | Agitation (RPM) | Light |
|---|---|---|---|---|---|---|---|
| 1 | 210 | 33 | 7 | 0.1 | 0 | 155 | LIGHT |
| 2 | 210 | 33 | 7 | 0.1 | 0 | 155 | LIGHT |
| 3 | 210 | 33 | 7 | 0.1 | 0 | 155 | LIGHT |
| 4 | 210 | 33 | 7 | 0.1 | 0 | 155 | LIGHT |
| 5 | 210 | 33 | 7 | 0.1 | 0 | 155 | LIGHT |
| 6 | 210 | 33 | 7 | 0.1 | 0 | 155 | LIGHT |
| 7 | 210 | 33 | 7 | 0.1 | 0 | 155 | LIGHT |
| 8 | 210 | 33 | 7 | 0.1 | 0 | 155 | LIGHT |
| 9 | 210 | 33 | 7 | 0.1 | 0 | 155 | LIGHT |
| 10 | 210 | 33 | 7 | 0.1 | 0 | 155 | LIGHT |

Table 7 and Table summarize composite of solutions used in preparing the sample solar cells compared in FIGS. 17A-17E. An exemplary HF-Nitric solution includes 125 mL de-ionized water, 83 mL HF acid, and 42 mL Nitric Acid. In comparison, an exemplary HF-HCl solution includes 210 mL de-ionized water, 33 mL HF acid, 7 mL HCl, and 0.1 gram oxidant ($HIO_3$ in solid state). In addition, when fabricating the porous silicon, both solutions are agitated by a shaker at 155 RPM and under ambient room light conditions. Same silicon substrates, which have a bare sheet Rho of 75 Ω/sq, are used in these two solutions.

Table 9 and Table 10 below show responses of the silicon substrates to the HF-Nitric solution and HF-HCl solution, respectively. The responses include the sheet resistance, color, and lifetime of the silicon substrates after being processed in the two solutions for about 13 seconds.

Figure 17A:
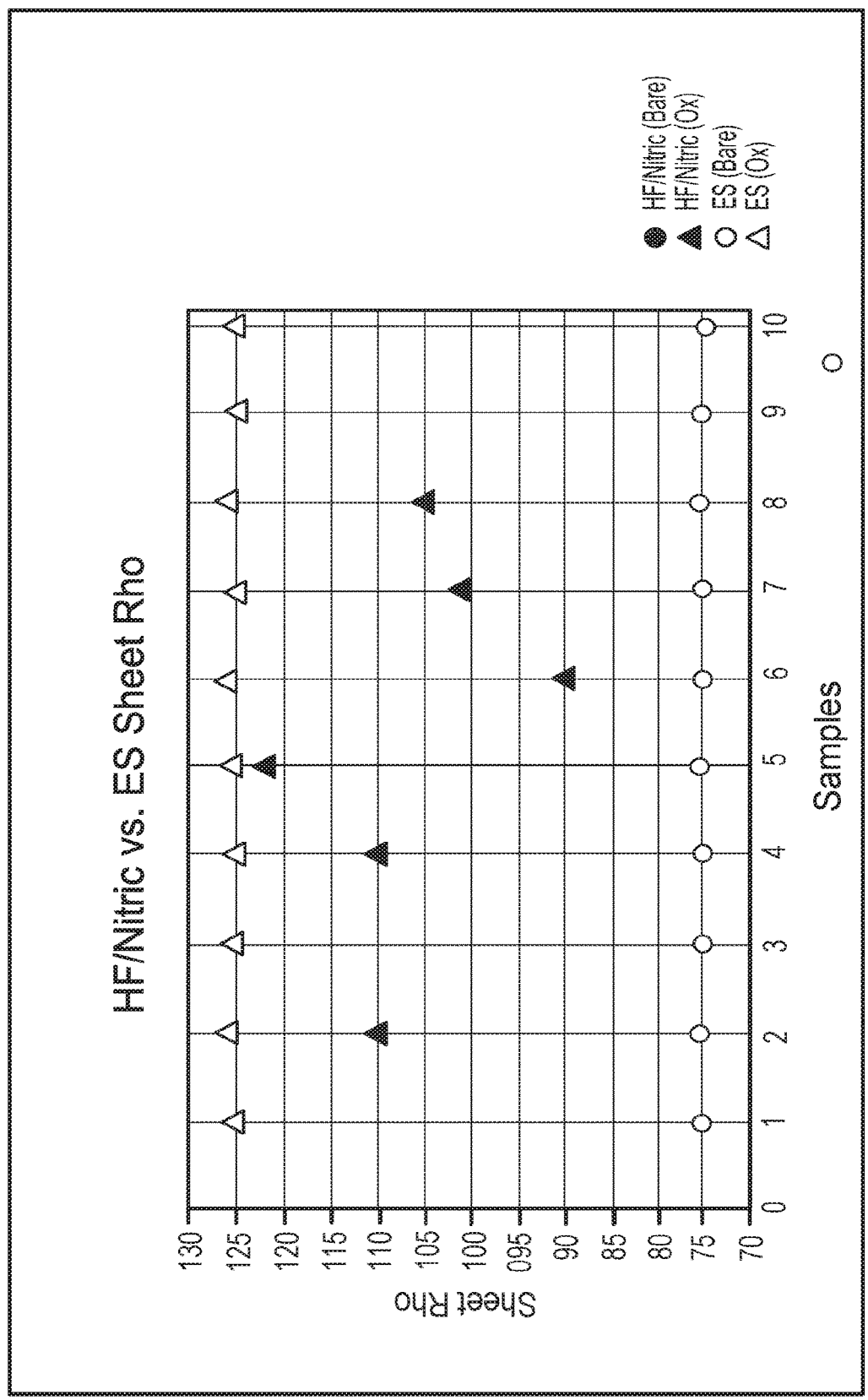
FIGS. 17A-17E show comparison of performances of solar cells including porous silicon layers fabricated by a HF-Nitric solution and by a HF-HCl solution.

FIG. 17A shows the sheet resistance Rho of silicon substrates before and after the processing in HF-Nitric solution and HF-HCl solution. Among the four groups, (two groups of data points of silicon substrates before processing are overlapping), on average, silicon substrates after processing in HF-HCl solution results in the highest sheet Rho. Stain etching in either HF-Nitric solution of HF-HCl solution can increase the sheet resistance Rho by nearly 50%, depending, for example, on the etching time and composition of the etching solution (e.g., percentage of HF or oxidants). However, the sheet resistance increase induced in HF-HCl solution is much more reproducible among different samples in the group. The fluctuation of sheet resistance after processing in HF-HCl solution is less than 3 ohm/sq, or 2%. In contrast, the fluctuation of sheet resistance after processing in HF-Nitric solution can be as large as 20 ohm/sq, or 20%. Therefore, in practice, processing in HF-HCl solution can have a better reproducibility in the resulting products.

TABLE 9

Responses of silicon substrates to HF-Nitric solution

| Samples | Process Time (S) | Bare Sheet Rho | Bare Lifetime | Bare Color | OX Sheet Rho | OX Lifetime | OX Color | 400 C Sheet Rho | 400 C Lifetime | 400 C Color |
|---|---|---|---|---|---|---|---|---|---|---|
| 1 | 13 | 75 | 22.60 | GRAY | 125 | 16.47 | LT TAN/GRAY | 125 | 42.67 | LT TAN/GRAY |
| 2 | 13 | 75 | 23.35 | GRAY | 110 | 15.19 | LT TAN/GRAY | 110 | 34.97 | LT TAN/GRAY |
| 3 | 13 | 75 | 21.52 | GRAY | 125 | 17.00 | LT TAN/GRAY | 125 | 38.43 | LT TAN/GRAY |
| 4 | 13 | 75 | 22.25 | GRAY | 110 | 17.38 | LT TAN/GRAY | 110 | 30.86 | LT TAN/GRAY |
| 5 | 13 | 75 | 22.00 | GRAY | 122 | 16.66 | LT TAN/GRAY | 122 | 33.05 | LT TAN/GRAY |
| 6 | 13 | 75 | 21.43 | GRAY | 90 | 18.99 | LT TAN/GRAY | 90 | 31.97 | LT TAN/GRAY |
| 7 | 13 | 75 | 21.21 | GRAY | 101 | 19.50 | LT TAN/GRAY | 101 | 32.95 | LT TAN/GRAY |
| 8 | 13 | 75 | 20.48 | GRAY | 105 | 19.35 | LT TAN/GRAY | 105 | 34.49 | LT TAN/GRAY |

TABLE 10

Responses of silicon substrates to HF-HCl solution

| Samples | Process Time (S) | Bare Sheet Rho | Bare Lifetime | Bare Color | OX Sheet Rho | OX Lifetime | OX Color | 400 C Sheet Rho | 400 C Lifetime | 400 C Color |
|---|---|---|---|---|---|---|---|---|---|---|
| 1 | 13 | 75 | 22.42 | GRAY | 125 | 17.13 | LT TAN | 125 | 45.60 | LT TAN |
| 2 | 13 | 75 | 20.65 | GRAY | 126 | 14.80 | LT TAN | 126 | 39.63 | LT TAN |
| 3 | 13 | 75 | 20.55 | GRAY | 125 | 15.23 | LT TAN | 125 | 41.50 | LT TAN |
| 4 | 13 | 75 | 21.18 | GRAY | 125 | 15.71 | LT TAN | 125 | 41.83 | LT TAN |
| 5 | 13 | 75 | 21.41 | GRAY | 126 | 14.84 | LT TAN | 126 | 38.24 | LT TAN |
| 6 | 13 | 75 | 21.65 | GRAY | 126 | 15.60 | LT TAN | 126 | 37.93 | LT TAN |
| 7 | 13 | 75 | 22.03 | GRAY | 125 | 16.08 | LT TAN | 125 | 39.30 | LT TAN |
| 8 | 13 | 75 | 20.52 | GRAY | 126 | 14.97 | LT TAN | 126 | 33.77 | LT TAN |
| 9 | 13 | 75 | 21.36 | GRAY | 125 | 14.62 | LT TAN | 125 | 34.69 | LT TAN |
| 10 | 13 | 75 | 22.32 | GRAY | 125 | 16.63 | LT TAN | 125 | 39.34 | LT TAN |

Figure 17B:
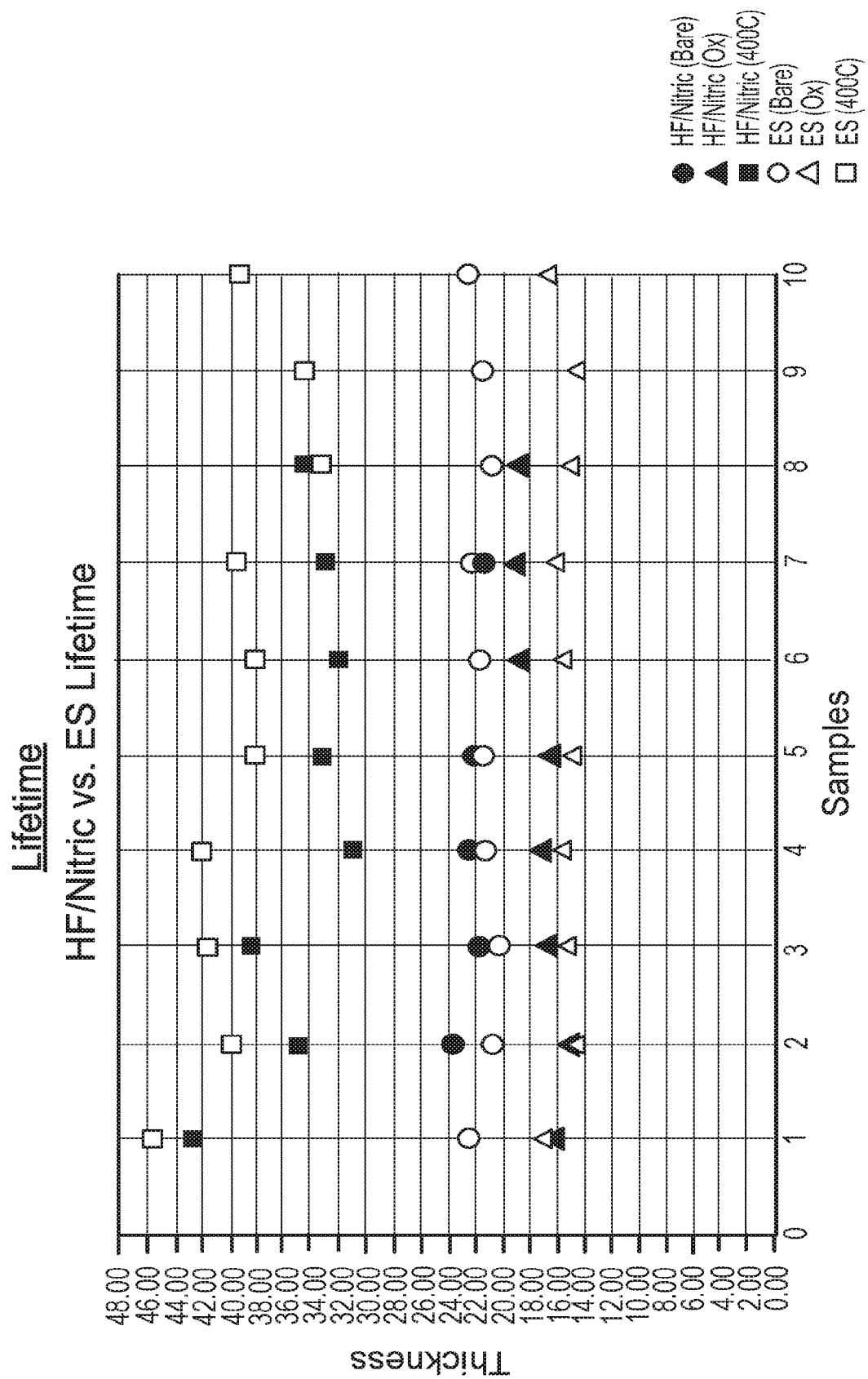

FIG. 17B shows lifetime of silicon substrates before and after processing in HF-Nitric solution and HF-HCl solution. Moreover, silicon substrates after etching in the two solutions are further fired at 400° C.

The starting silicon substrates have substantially the same charge carrier life time before any processing, and the fluctuation among data points are negligible. After processing in the etching solution, silicon substrates processed by the HF-HCl solution, on average, have a slightly shorter lifetime, compared to silicon substrates processed by the HF-Nitric solution. However, fluctuation among data points in the HF-HCl group is very small, while the corresponding fluctuation in the HF-Nitric solution is noticeably larger. Thermal treatment also reverses the relative magnitude of lifetime between the two groups—after thermal treatment, silicon substrates in the HF-HCl group have a longer lifetime. Therefore, in practice, including a firing treatment in solar cell manufacturing can be beneficial.

TABLE 11

Parameters of porous silicon created via HF-Nitric solution

| Samples | Thickness | Porosity | GOF |
|---|---|---|---|
| 1 | 12.6956 | 0.5367 | 0.9885 |
| 2 | 12.5791 | 0.5659 | 0.9847 |
| 3 | 10.9256 | 0.488 | 0.9861 |
| 4 | 9.0219 | 0.5619 | 0.9834 |
| 5 | 10.596 | 0.5897 | 0.9834 |
| 6 | 8.9415 | 0.5517 | 0.9824 |
| 7 | 2.9412 | 0.5859 | 0.9405 |
| 8 | 4.2353 | 0.5951 | 0.9465 |

TABLE 12

Parameters of porous silicon created via HF-HCl solution

| Samples | Thickness | Porosity | GOF |
|---|---|---|---|
| 1 | 40.7599 | 0.8823 | 0.9876 |
| 2 | 37.5755 | 0.8711 | 0.9878 |
| 3 | 37.3266 | 0.8751 | 0.9901 |
| 4 | 20.4018 | 0.6877 | 0.9897 |
| 5 | 27.4982 | 0.7859 | 0.9959 |
| 6 | 27.5781 | 0.7863 | 0.9949 |
| 7 | 23.334 | 0.7471 | 0.9937 |
| 8 | 23.9583 | 0.7381 | 0.9952 |
| 9 | 28.898 | 0.7967 | 0.9947 |
| 10 | 20.7902 | 0.6746 | 0.9962 |

Table 11 and Table 12 summarize parameters of the porous silicon created by the HF-Nitric solution and HF-HCl solution, respectively. Data listed in Table 11 and Table 12 is visually shown in FIG. 17C-17E.

Figure 17C:
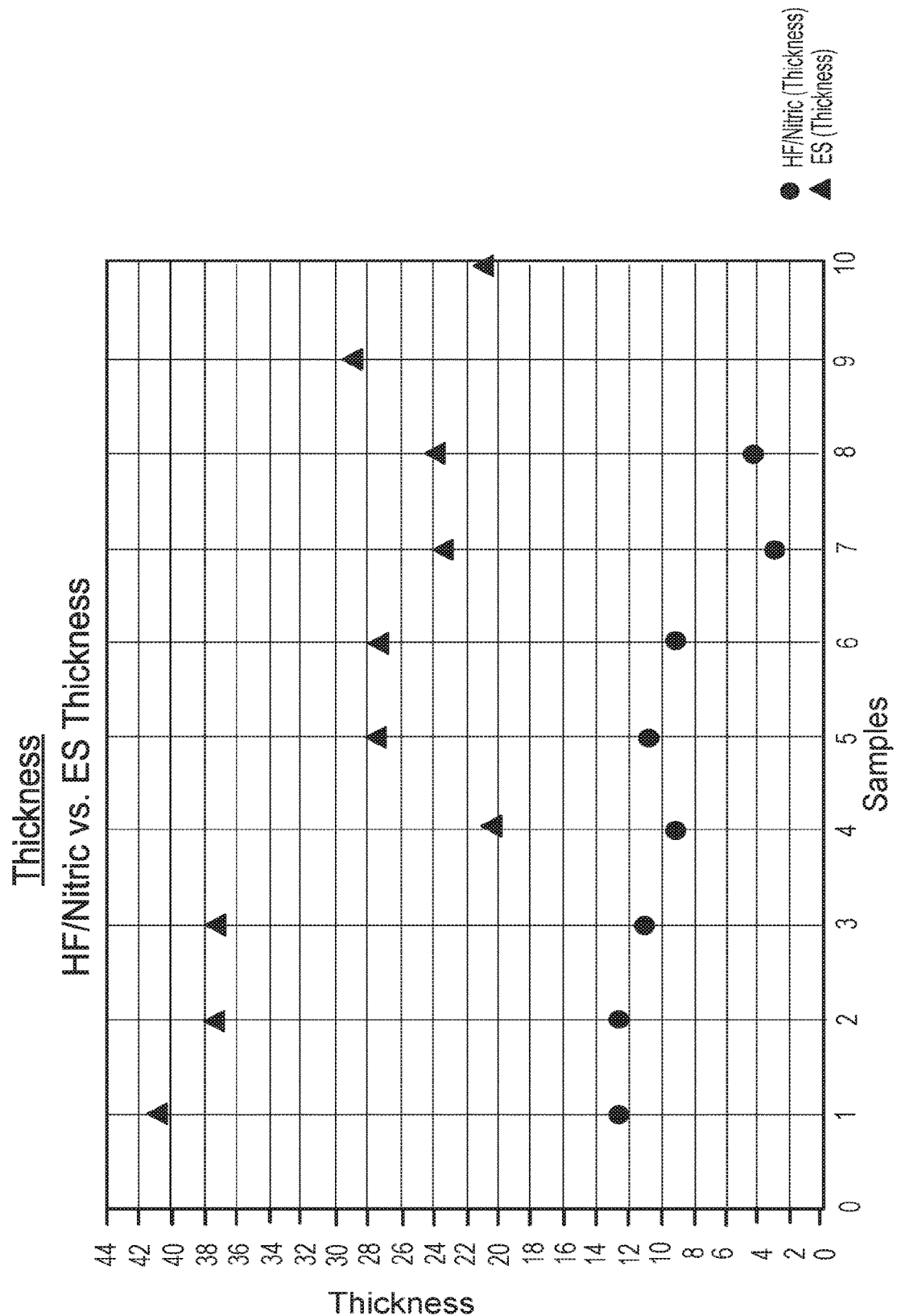

FIG. 17C shows thickness of the porous silicon layer created on silicon substrates via HF-Nitric solution and HF-HCl solution. On average, porous silicon layers created by HF-HCl solution have a larger thickness, compared to porous silicon layers created by HF-Nitric solution. At certain points (e.g., sample point 1, 5, or 6), the difference can be as large as more than three times. This indicates that using HF-HCl solution to create porous silicon layers can go deeper into the silicon substrate within the same time compared to using HF-Nitric solution.

Moreover, the relative fluctuation (percentage change) among data points in the HF-Nitric group is also larger. More specifically, the thickest porous silicon layer created by HF-Nitric solution is about six times thicker than the thinnest porous silicon layer created by the same solution under the same conditions. In contrast, the thickest porous silicon layer created by HF-HCl solution is only about three times thicker than the thinnest porous silicon layer created by the same solution. Therefore, HF-HCl solution may benefit the reproducibility of the resulting porous silicon layers in practice.

Figure 17D:
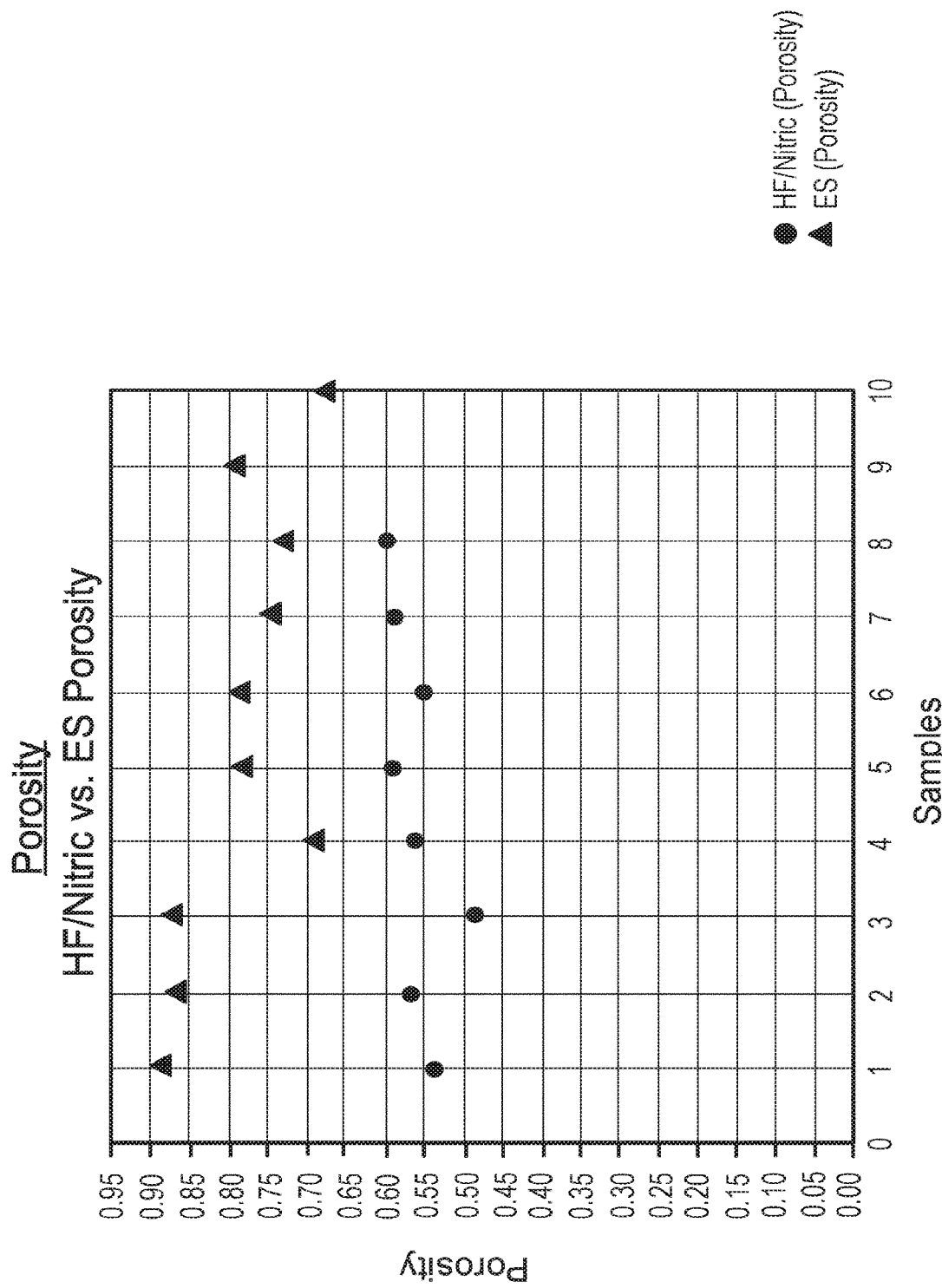

FIG. 17D shows porosity of the porous silicon layer created on silicon substrates via HF-Nitric solution and HF-HCl solution. On average, porosity of the porous silicon layers created by HF-HCl is higher, compared to porosity of porous silicon layers created by HF-Nitric solution. At certain points (e.g., sample point 3), the difference can be as large as two times. Therefore, HF-HCl solution etches the silicon substrate in a more thorough manner, i.e. at the same depth, HF-HCl solution etches away more silicon.

Combining FIG. 17C and FIG. 17D, it can be seen that using HF-HCl solution to create porous silicon can be more efficient in both vertical direction and lateral direction. In vertical direction, HF-HCl solution can etch deeper into the silicon substrate. In lateral direction, the HF-HCl solution can etch the silicon substrate more thoroughly.

Figure 17E:
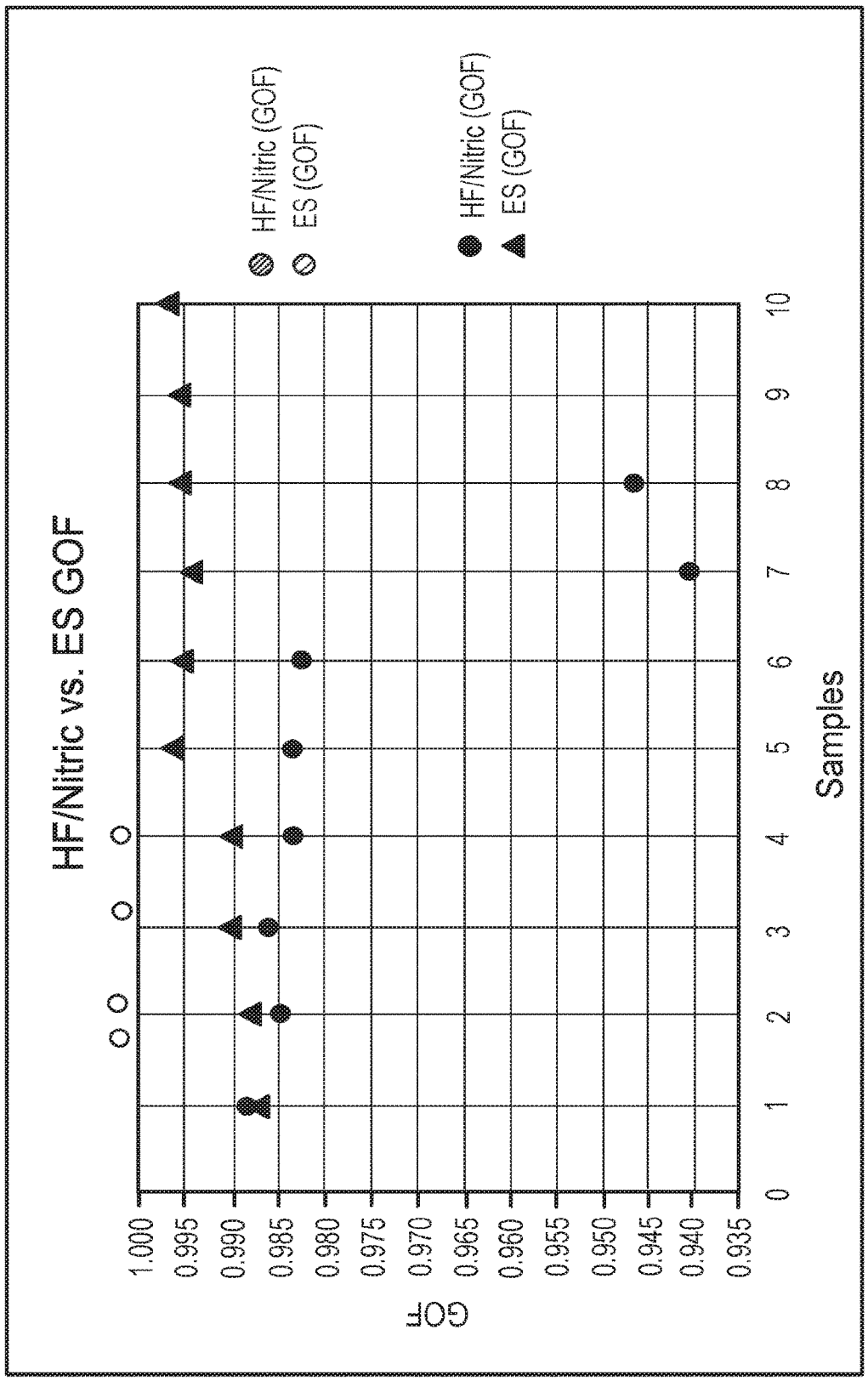

FIG. 17E shows goodness of fit (GOF) of the resulting porous silicon to theoretical model. Measures of goodness of fit typically summarize the discrepancy between observed values and the values expected under the model in question. Therefore, a higher GOF can indicate a more predictable quality of the porous silicon. In FIG. 17E, porous silicon created by HF-HCl solution, on average, has a higher GOF, thereby indicating a higher predictability. Moreover, the fluctuation among data points within the HF-HCl group is also smaller. In contrast, two data points in the HF-Nitric group are significantly far away from the rest of the points within the same group, indicating possibly abnormal properties of the porous silicon. Accordingly, using HF-HCl solution can create more predictable porous silicon from silicon substrates, which can be beneficial in practical manufacturing.

FIGS. 18A-18C are SEM images of three sample silicon substrates processed by HF-Nitric solutions. Parameters used in fabricating these substrates including porous silicon layers are the same. However, the resulting silicon substrates are noticeably different. First of all, the thickness can be fluctuating, from about 10 nm to as large as 35 nm. In addition, a visual inspection of the three sample silicon substrates also indicates that the porosity among the three samples may also be different. The silicon substrate shown in FIG. 18A seems to have a larger porosity than that shown in FIG. 18C. Therefore, in practice, if reproducibility is of primary interest in manufacturing solar cells, or other semiconductor apparatus including porous silicon layers, it can be beneficial to use solution containing HF and HCl, instead of $NHO_3$.

Thermal Treatments in Porous Silicon Creation

Figure 19A:
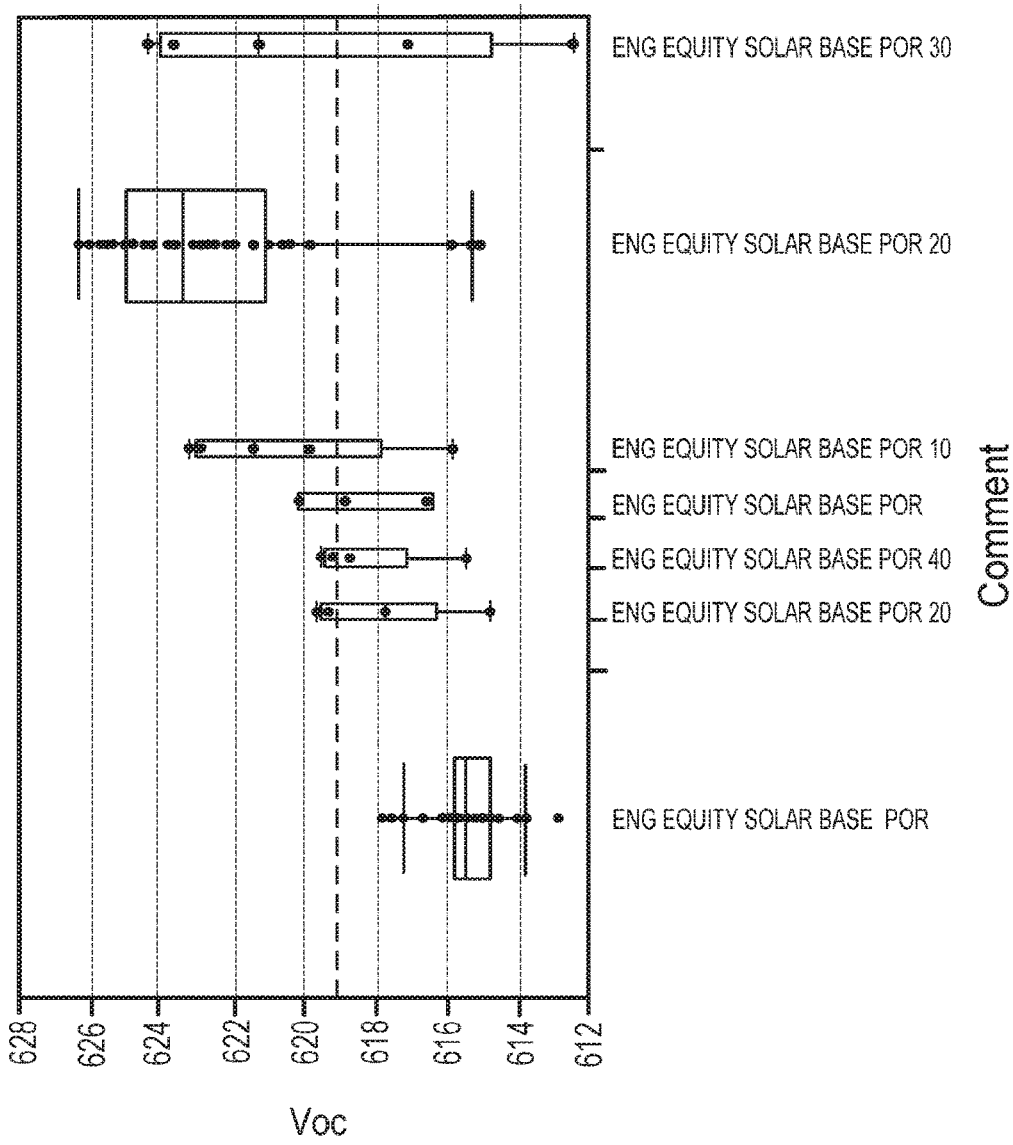
FIGS. 19A-19B show open circuit voltages of solar cells that include porous silicon regions and are processed at different firing conditions.
Figure 19B:
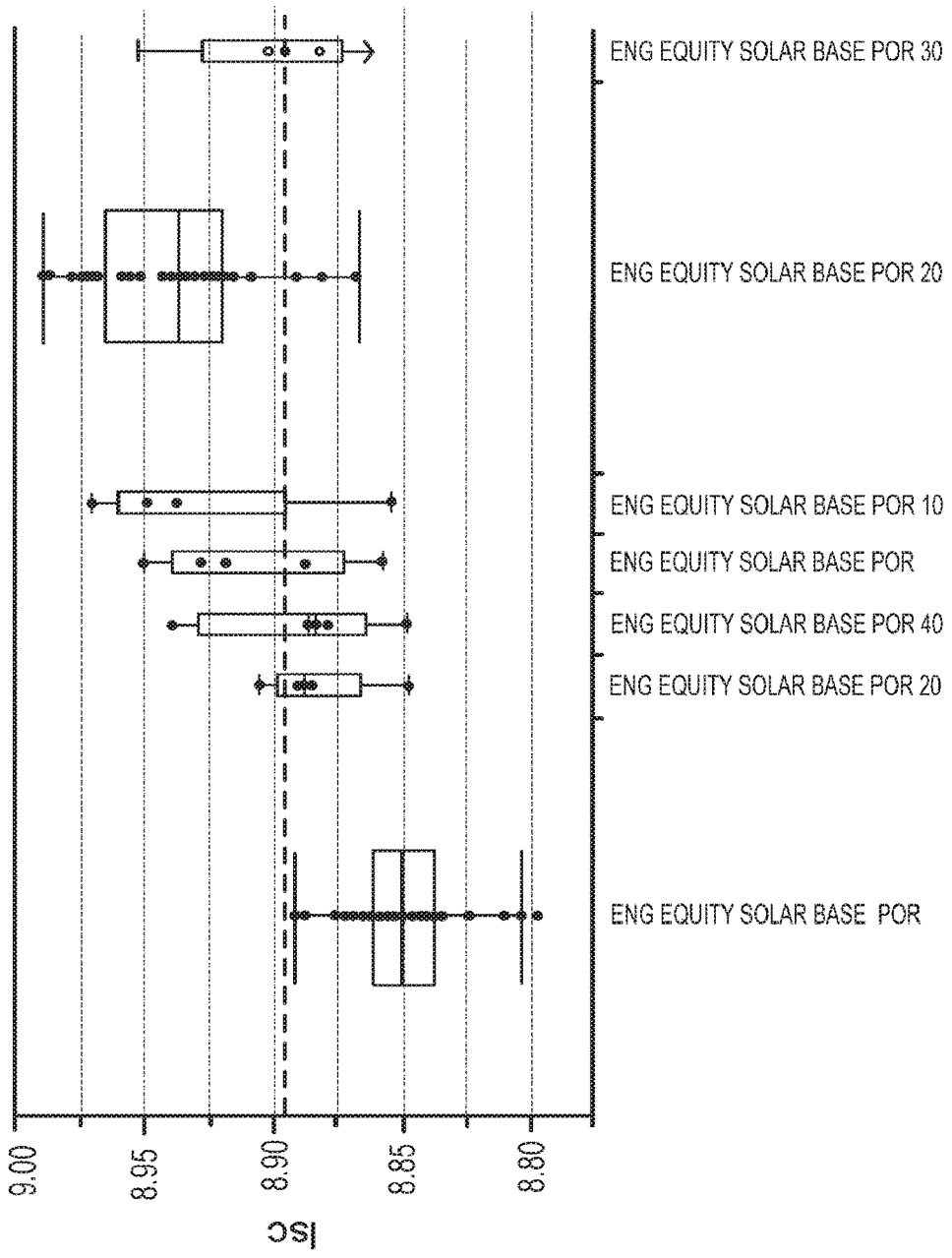

FIGS. 19A-19B show performance of sample solar cells in terms of $V_{oc}$ and $I_{sc}$, respectively. In each figure, the left most sample is a baseline sample, and the rest of the samples are prepared under different firing conditions. FIG. 19A shows that firing the solar cell at a temperature 20 degrees lower than the baseline firing temperature can result in a high open circuit voltage $V_{oc}$. FIG. 19B shows that the same firing condition (20 degrees lower than the baseline temperature) can also result in a high short circuit current $I_{sc}$. Under this firing condition, the $V_{oc}$ improves from about 0.616 V at baseline to about 0.624 V, and the $I_{sc}$ improves from about 8.85 A to baselines to about 8.93 A.

Figure 20D:
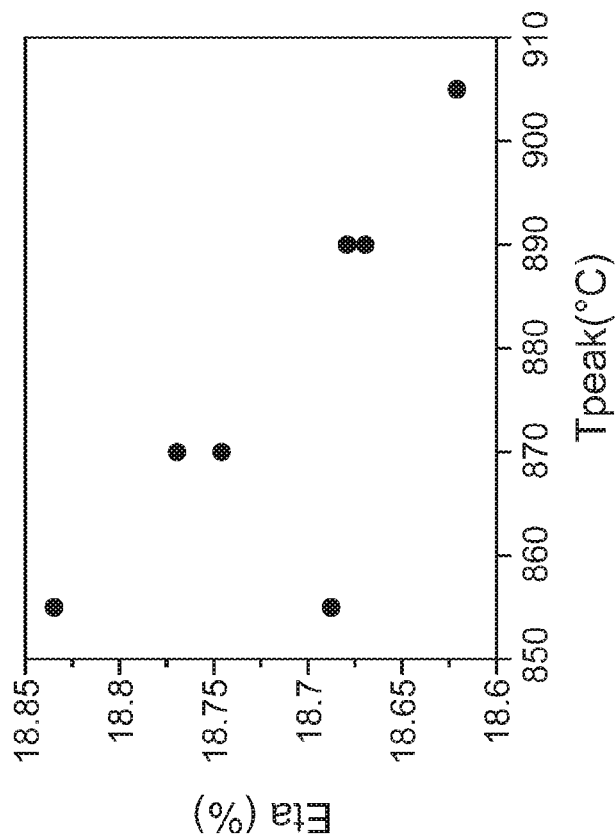

FIGS. 20A-20D show performances of sample solar cells fabricated under different firing temperatures. At each temperature, two solar cell samples are fabricated and tested. Same silicon substrates are used in all samples shown in FIGS. 20A-20D. FIG. 20A shows the short circuit current density $J_{sc}$ as a function of peak firing temperature. In general, within the tested temperature window (i.e. 850° C.-910° C.), lower firing temperature is beneficial in achieving a higher $J_{sc}$. More specifically, at 855° C., the measured $J_{sc}$ is around 37.65 mA/cm² on average of the two data points. In contrast, at 905° C., the measured Jsc is around 37.4 mA/cm².

FIG. 20B shows the open circuit voltage $V_{oc}$ with respect to the firing temperature. Increasing firing temperature generally decreases the $V_{oc}$, for example, from about 0.6313 V at 855° C. to 0.629 V at 905° C.

Figure 20C:
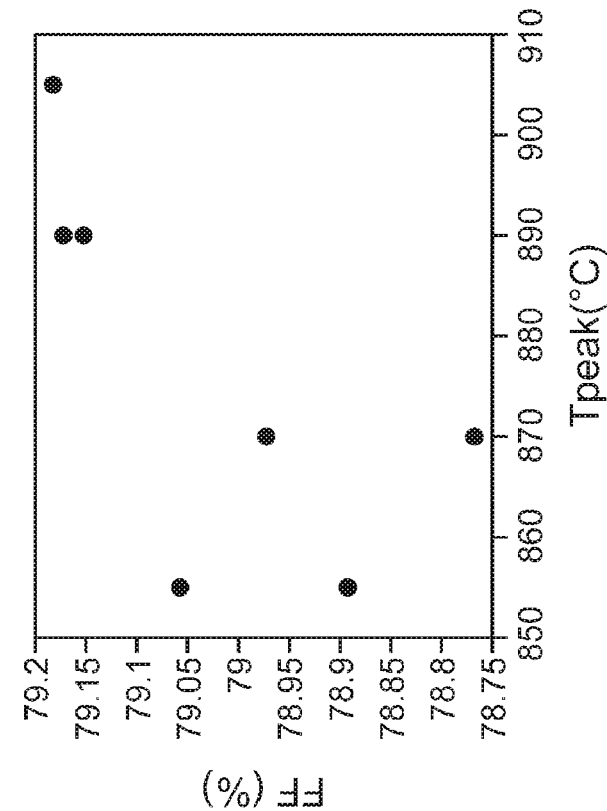

FIG. 20C shows the fill factor (FF) of solar cells as a function of the firing temperature used in fabricating the solar cells. The general trend is opposite to the trend in previous two figures. As the temperature increases from 855° C. to 905° C., the fill factor also increases, from about 78.97% to about 79.2%.

FIG. 20D shows the energy conversion efficiency (from optical energy to electrical energy) of solar cells as a function of the firing temperature used in fabricating the solar cells. In FIG. 20D, the energy conversion efficiency decreases as the firing temperature increases. At 850° C., the conversion efficiency is close to 18.77%. At 905° C., the conversion efficiency drops to less than 18.625%.

FIGS. 20A-20D also show a consistent observation that solar cells processed under a lower firing temperature can have more fluctuating performances, i.e. the stability of performance is poorer. For example, the $V_{oc}$ of the two sample solar cell fired at 855° C. fluctuates between less than 0.6305 V and more than 0.632 V, inducing a difference of more than 0.015 V between the two samples. In contrast, at 905° C., the $V_{oc}$ difference between the two samples is negligible. Therefore, in practice, the firing temperatures may be set depending on application need, such as reproducibility of the products, highest possible $J_{sc}$, $V_{oc}$, FF, or energy conversion efficiency, among others. The optimal condition may be a tradeoff between different constraints.

FIG. 21 summarizes performances of solar cells with respect to three parameters: metal pastes (electrodes to transport electrical energy out of the solar cell), firing temperature, and antireflection/passivation coating. Metal pastes used in the samples include commercially available silver pastes SOL9411, SOL9600A and SOL9600B from Heraeus Precious Metals GmbH & Co. KG. Firing temperatures used here range from 870° C. to 920° C. The firing temperature, in operation, can affect the contact between the metal electrodes and the silicon substrate, thereby influencing the ability of charge carrier transport across the metal-semiconductor interface and the resulting solar cell performance. The antireflection/passivation layer includes either SiNx coating or $SiO_2$ coating. The overall best result is achieved in solar cells fired at 920° C. with SOL9600B paste and a $SiO_2$ passivation layer. However, in terms of $V_{oc}$ and $I_{sc}$, the best result is achieved in solar cells fired at 870° C. with SOL 9411 paste and $SiO_2$ passivation layer. FIG. 18 indicates that a global optimization (optimization of more than one parameter) may be needed in order to achieve desired performances of solar cells.

Figure 22B:
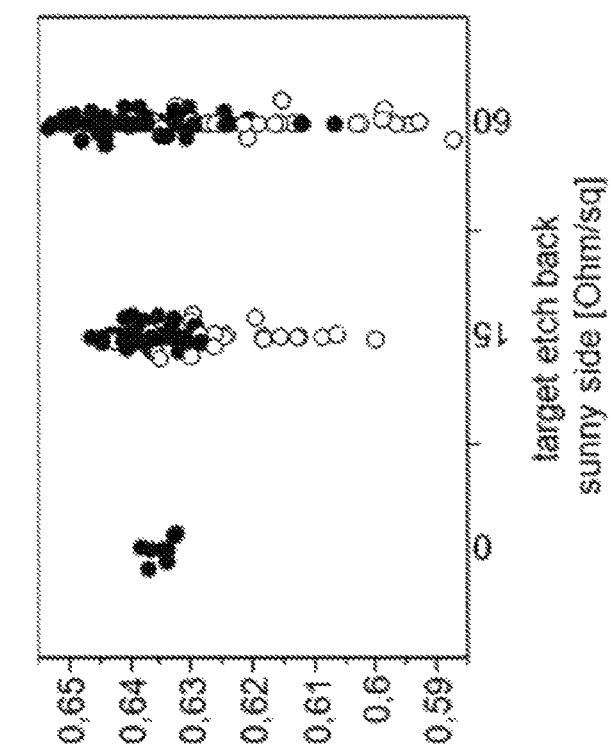
FIGS. 22A-22C show implied open circuit voltages of solar cells including porous silicon regions before and after thermal firing treatments.
Figure 22A:
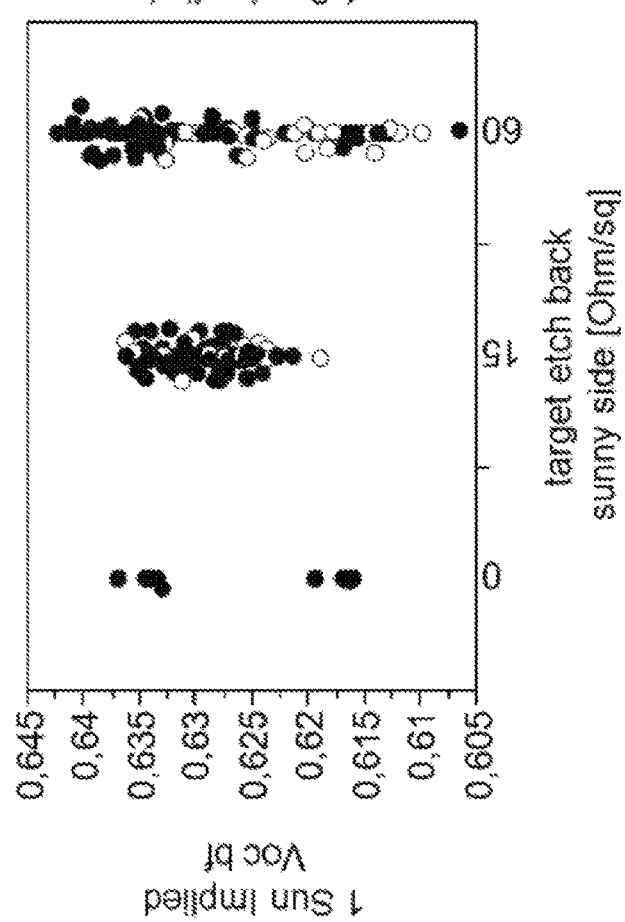
Figure 22C:
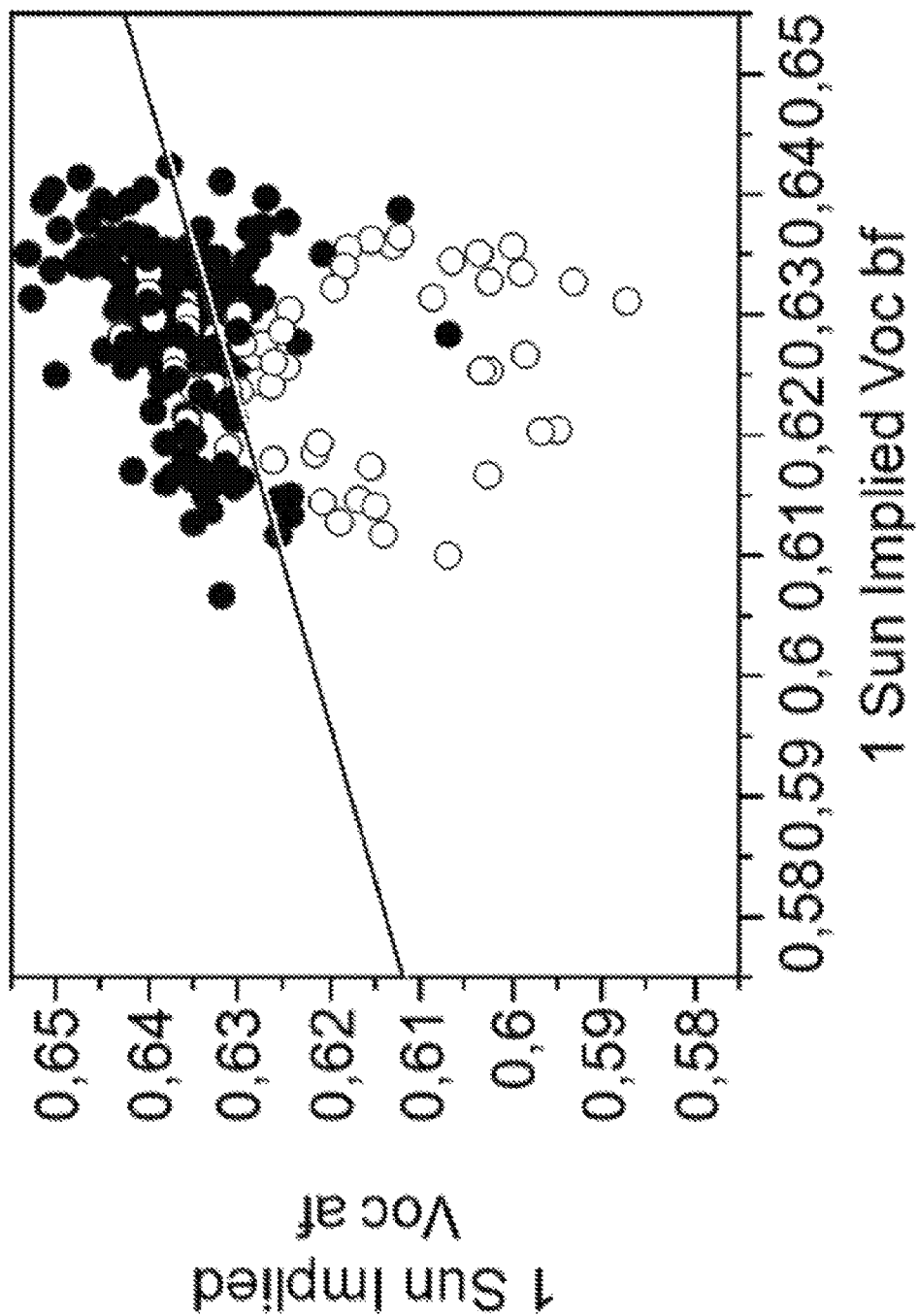

FIGS. 22A-22C show performances of solar cells before firing and after firing. In each condition (before/after firing), the implied $V_{oc}$ of solar cells with respect to the amount of etch-back is also shown. FIG. 22A shows the implied $V_{oc}$ of solar cells before firing. In general, as the silicon substrates are etched back by a larger amount (e.g., from no etch-back to 60 Ω/sq), the spread of implied $V_{oc}$ increases, indicating a more fluctuating behavior among different solar cells. Similar trend can be also seen in FIG. 22B, which shows the implied $V_{oc}$ of solar cells after firing. Comparing FIGS. 19A and 19B, it can be seen that the firing treatment, in general, increases the implied $V_{oc}$. This effect can be also seen in FIG. 22C, in which the implied $V_{oc}$ after firing is plotted against the implied $V_{oc}$ before firing. For each $V_{oc}$ before firing in FIG. 22C, the corresponding $V_{oc}$ after firing is normally larger.

Figure 23:
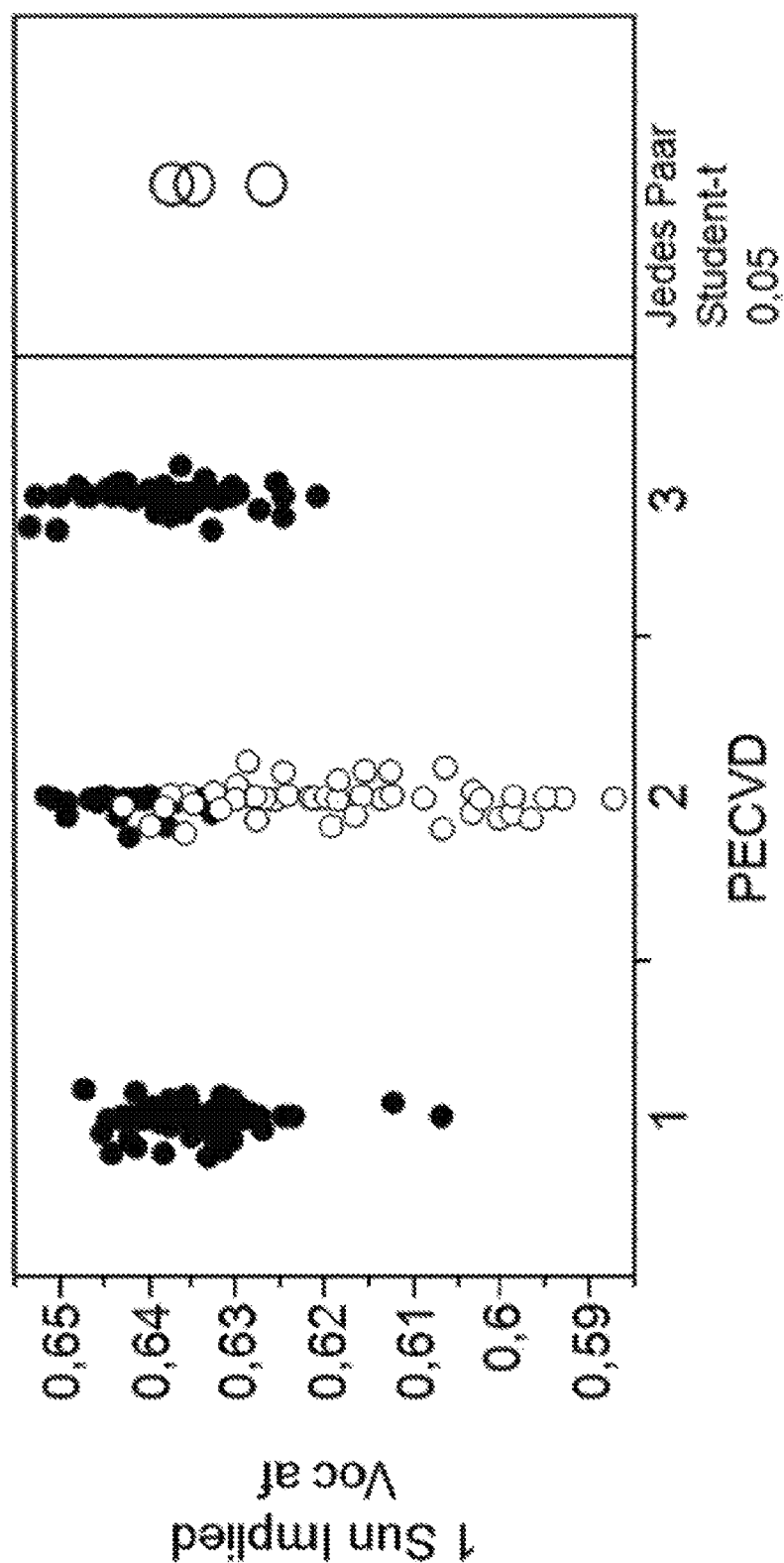
FIG. 23 shows implied open circuit voltages of solar cells with and without a silicon nitride layer deposited by plasma enhanced chemical vapor deposition (PECVD) techniques.

FIG. 23 shows the effect of plasma enhanced chemical vapor deposition (PECVD) on the implied $V_{oc}$ of the resulting solar cells. The three groups of solar cells are treated by PECVD at different conditions, under which the PECVD deposits a SiNx layer on the solar cells for antireflection and passivation purposes. Within the 95% confidence level, as shown by the circles on the right of FIG. 23, the PECVD seems to have negligible effect on the implied $V_{oc}$ of the resulting solar cells. This may be attributed to the fact that the porous silicon layers in these solar cells already have sufficient antireflection effect. Alternatively, or in addition, porous silicon layers in the combination of SiNx and porous silicon antireflection coatings play a dominant role, such that the variation of SiNx properties introduces negligible effect.

Surfactant in Porous Silicon Creation

Figure 24A:
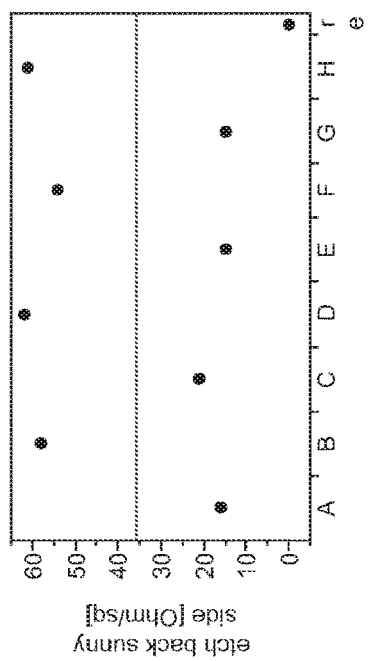
FIGS. 24A-24B show implied open circuit voltages of solar cells including porous silicon layers fabricated by etching solutions including different percentages of HF and surfactant.
Figure 24B:
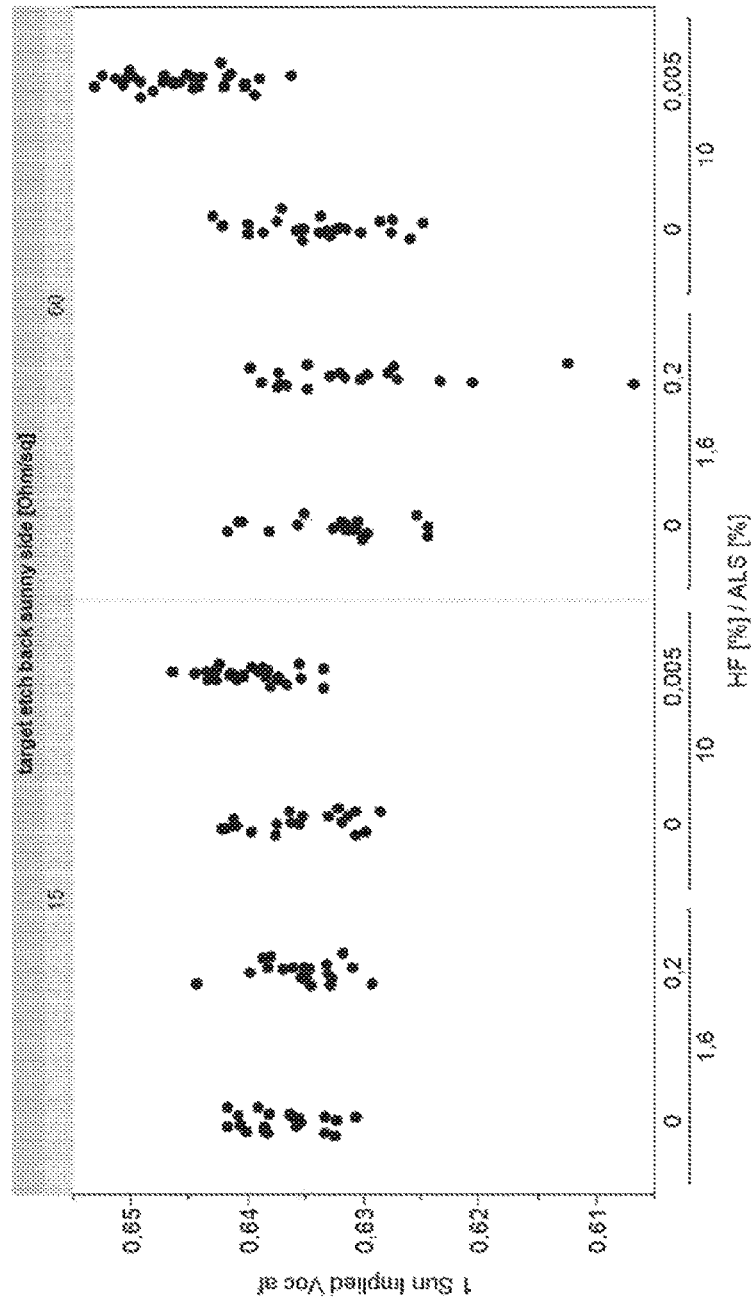

FIGS. 24A-24B show the effect of surfactant level in the solution on the implied $V_{oc}$ of the resulting solar cells. The solution used in FIGS. 24A-24B contains HF, $HIO_3$, $H_2SO_4$, and surfactant (ALS). FIG. 21 shows the etch-back conditions of each group (from group A to group H). Generally, the eight groups can be divided into two categories, one category with about 15 Ω/sq of etch-back, and the other category with 60 Ω/sq of etch-back. FIG. 24B shows the implied $V_{oc}$ of solar cells created with stain etching solution including different percentage of HF and ALS surfactant. The best result is achieved when 10% HF and 0.005% ALS surfactant is included in the stain etching solution and the etch-back is 60 Ω/sq. This data point is noticeably better than the rest of the data points, indicating that certain threshold may be overcome. For example, the porosity may be over certain threshold such that the enlarged band gap has better passivation effect.

Figure 25:
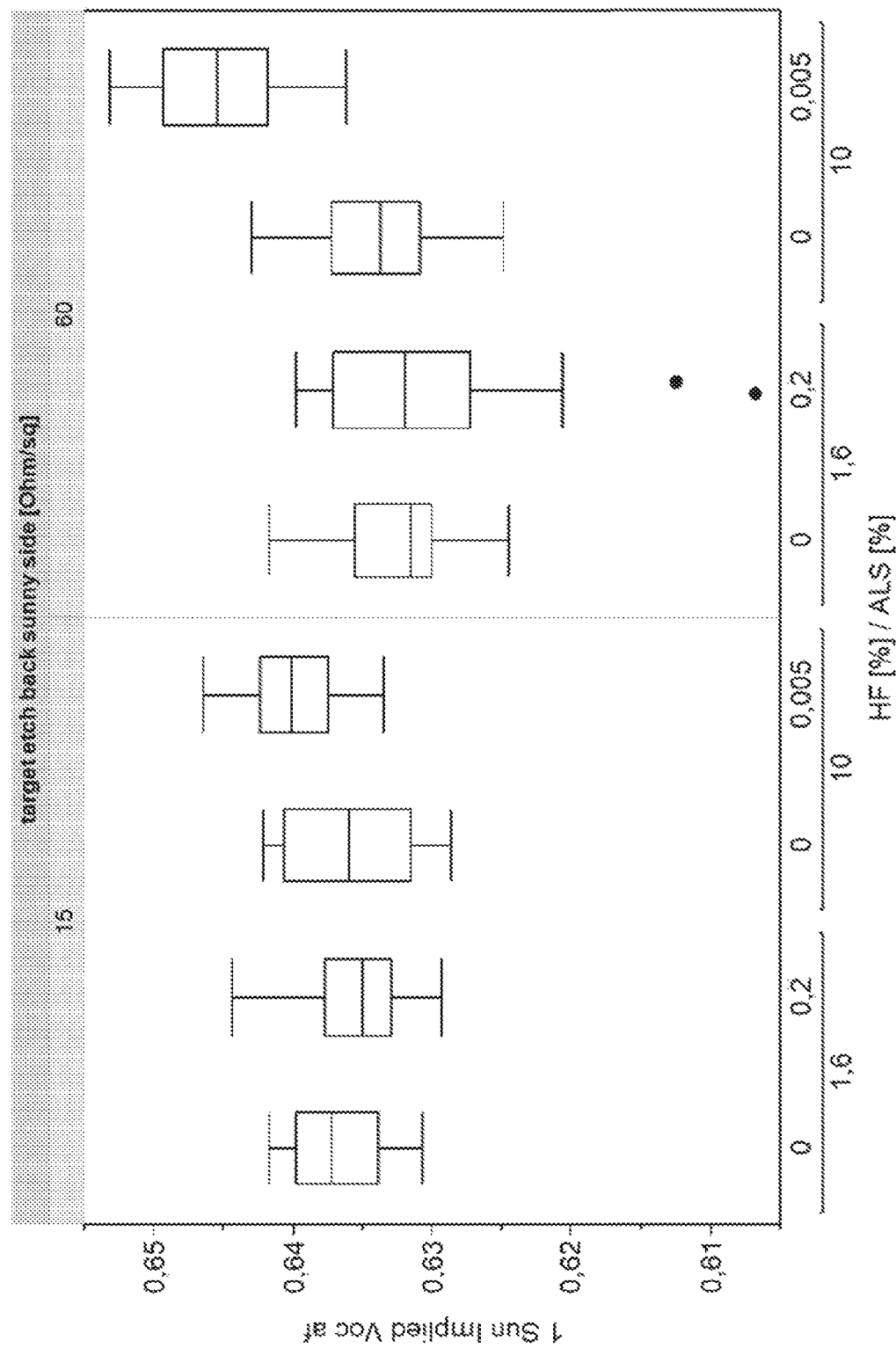
FIG. 25 shows averaged implied voltages of solar cells including porous silicon layers fabricated by etching solutions including different percentages of HF and surfactant.

FIG. 25 shows the averaged implied $V_{oc}$ of solar cells shown in FIG. 24B. At lower HF concentrations (1.6%), adding surfactant to the solution tends to decrease the implied Voc. In contrast, at higher HF concentrations (10%), the trend is opposite: adding surfactant tends to increase the implied $V_{oc}$. However, these two different trends may also be attributed to the different amount of surfactant in the stain etching solution: 0.2% surfactant tends to decrease the implied $V_{oc}$ while 0.005% surfactant tends to increase the $V_{oc}$.

Conclusion

While various inventive embodiments have been described and illustrated herein, those or ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The above-described embodiments can be implemented in any of numerous ways. For example, embodiments of designing and making the coupling structures and diffractive optical elements disclosed herein may be implemented using hardware, software or a combination thereof. When implemented in software, the software code can be executed on any suitable processor or collection of processors, whether provided in a single computer or distributed among multiple computers.

Further, it should be appreciated that a computer may be embodied in any of a number of forms, such as a rack-mounted computer, a desk-top computer, a laptop computer, or a tablet computer. Additionally, a computer may be embedded in a device not generally regarded as a computer but with suitable processing capabilities, including a Personal Digital Assistant (PDA), a smart phone or any other suitable portable or fixed electronic device.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition on in other audible format.

Such computers may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks, wired networks or fiber optical networks.

The various methods or processes (e.g., of designing and making the coupling structures and diffractive optical elements disclosed above) outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, various inventive concepts may be embodied as a computer readable storage medium (or multiple computer readable storage media) (e.g., a computer memory, one or more floppy discs, compact discs, optical discs, magnetic tapes, flash memories, circuit configurations in Field Programmable Gate Arrays or other semiconductor devices, or other non-transitory medium or tangible computer storage medium) encoded with one or more programs that, when executed on one or more computers or other processors, perform methods that implement the various embodiments of the invention discussed above. The computer readable medium or media can be transportable, such that the program or programs stored thereon can be loaded onto one or more different computers or other processors to implement various aspects of the present invention as discussed above.

The terms "program" or "software" are used herein in a generic sense to refer to any type of computer code or set of computer-executable instructions that can be employed to program a computer or other processor to implement various aspects of embodiments as discussed above. Additionally, it should be appreciated that according to one aspect, one or more computer programs that when executed perform methods of the present invention need not reside on a single computer or processor, but may be distributed in a modular fashion amongst a number of different computers or processors to implement various aspects of the present invention.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even through shown in sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one of the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. A method of facilitating fabrication of a solar cell via a stain etching process using a junction isolation/phosphosilicate glass (PSG) etch processing tool, the method comprising:
   (A) placing a first stain etching solution in a first reservoir coupled to a PSG etch tank in the junction isolation/PSG etch processing tool through a first chemical dosing unit of the PSG etch processing tool;
   (B) placing at least a portion of a silicon substrate for the solar cell in the PSG etch tank and allowing contact, in the PSG etch tank, between the silicon substrate and the first stain etching solution in the first reservoir;
   (C) removing possible PSG on a front side of the silicon substrate during a first time period via the contact between the silicon substrate and the first stain etching solution;
   (D) etching back at least a portion of the front side of the silicon substrate during a second time period via the contact between the silicon substrate and the first stain etching solution; and
   (E) passivating the front side of the silicon substrate and reducing a reflection loss on the front side of the silicon substrate, at least partially, by creating a front side porous silicon region on the front side of the silicon substrate during a third time period via the contact between the silicon substrate and the first stain etching solution,
   wherein at least a portion of the second time period and the third time period is concurrent.

2. The method of claim 1, wherein at least a portion of the first time period, the second time period, and the third time period is concurrent.

3. The method of claim 1, further comprising:
   (F) placing a second stain etching solution in a second reservoir coupled to a junction isolation process tank through a second chemical dosing unit of the junction isolation/PSG etch processing tool;
(G) placing at least a portion of the silicon substrate for the solar cell in the junction isolation process tank and allowing contact, in the junction isolation process tank, between the silicon substrate and the second stain etching solution in the second reservoir; and
(H) creating a back side porous silicon region on a back side of the silicon substrate via the contact between the silicon substrate and the second stain etching solution so as to passivate the back side of the silicon substrate.

4. The method of claim 3, further comprising:
(I) doping the back side of the silicon substrate with a first doping material, before creating the back side porous silicon region.

5. The method of claim 4, wherein Step (I) comprises at least one of a thermal diffusion process, an ion implantation process or a laser doping process.

6. The method of claim 4, further comprising:
(J) doping the front side of the silicon substrate with a second doping material, before creating the front side porous silicon region.

7. The method of claim 4, further comprising:
(K) depositing a silicon nitride ($SiN_x$) layer over the front side porous silicon layer via a plasma enhanced chemical vapor deposition (PECVD) process.

\* \* \* \* \*